(12) United States Patent
Muri et al.

(10) Patent No.: US 10,199,255 B2
(45) Date of Patent: *Feb. 5, 2019

(54) METHOD FOR PROVIDING A PLANARIZABLE WORKPIECE SUPPORT, A WORKPIECE PLANARIZATION ARRANGEMENT, AND A CHUCK

(71) Applicant: Infineon Technologies AG, Neubiberg (DE)

(72) Inventors: Ingo Muri, Villach (AT); Alexander Binter, Villach (AT); Bernhard Goller, Villach (AT); Christian Grindling, Klagenfurt (AT)

(73) Assignee: Infineon Technologioes AG, Neubiberg (DE)

( * ) Notice: Subject to any disclaimer, the term of this patent is extended or adjusted under 35 U.S.C. 154(b) by 18 days.

This patent is subject to a terminal disclaimer.

(21) Appl. No.: 15/446,059

(22) Filed: Mar. 1, 2017

(65) Prior Publication Data

US 2017/0263490 A1    Sep. 14, 2017

Related U.S. Application Data

(63) Continuation-in-part of application No. 15/065,914, filed on Mar. 10, 2016.

(51) Int. Cl.
| | |
|---|---|
| H01L 21/687 | (2006.01) |
| H01L 21/683 | (2006.01) |
| B23C 3/13 | (2006.01) |
| B23Q 3/08 | (2006.01) |
| H01L 21/67 | (2006.01) |
| H01L 21/304 | (2006.01) |

(52) U.S. Cl.
CPC ............ *H01L 21/6838* (2013.01); *B23C 3/13* (2013.01); *B23Q 3/088* (2013.01); *H01L 21/67092* (2013.01); *H01L 21/6875* (2013.01); *H01L 21/68757* (2013.01); *H01L 21/304* (2013.01); *Y10T 279/11* (2015.01); *Y10T 409/30868* (2015.01); *Y10T 409/303808* (2015.01)

(58) Field of Classification Search
CPC ... Y10T 409/30868; Y10T 409/303752; Y10T 409/303808; Y10T 409/3042; Y10T 279/11; B23C 3/13; H01L 21/304; H01L 21/6838
USPC .......................................... 269/21
See application file for complete search history.

(56) References Cited

U.S. PATENT DOCUMENTS

| | | |
|---|---|---|
| 2,454,992 A | 11/1948 | Coleman |
| 3,463,476 A | 8/1969 | De Maria et al. |
| 5,141,212 A | 8/1992 | Beeding |
| 5,364,083 A | 11/1994 | Ross et al. |
| 5,374,021 A | 12/1994 | Kleinman |
| 5,375,951 A | 12/1994 | Veale |
| 5,743,685 A | 4/1998 | Piggott |
| 5,987,729 A | 11/1999 | Moran |

(Continued)

*Primary Examiner* — Daniel Howell
*Assistant Examiner* — Yasir Diab
(74) *Attorney, Agent, or Firm* — Viering, Jentschura & Partner MBB

(57) ABSTRACT

According to various embodiments, a workpiece planarization arrangement may include: a chuck including at least one portion configured to support one or more workpieces; and a planarization tool configured to planarize the at least one portion of the chuck and to planarize one or more workpieces on the at least one portion of the chuck; wherein the at least one portion of the chuck includes at least one of particles, pores and/or a polymer.

20 Claims, 23 Drawing Sheets

(56) References Cited

U.S. PATENT DOCUMENTS

| | | |
|---|---|---|
| 6,830,416 B2 | 12/2004 | Susnjara et al. |
| 7,901,166 B2 | 3/2011 | Halford |
| 2006/0231995 A1 | 10/2006 | Wang et al. |
| 2009/0020936 A1 | 1/2009 | Halford |
| 2012/0063862 A1 | 3/2012 | Epplin et al. |

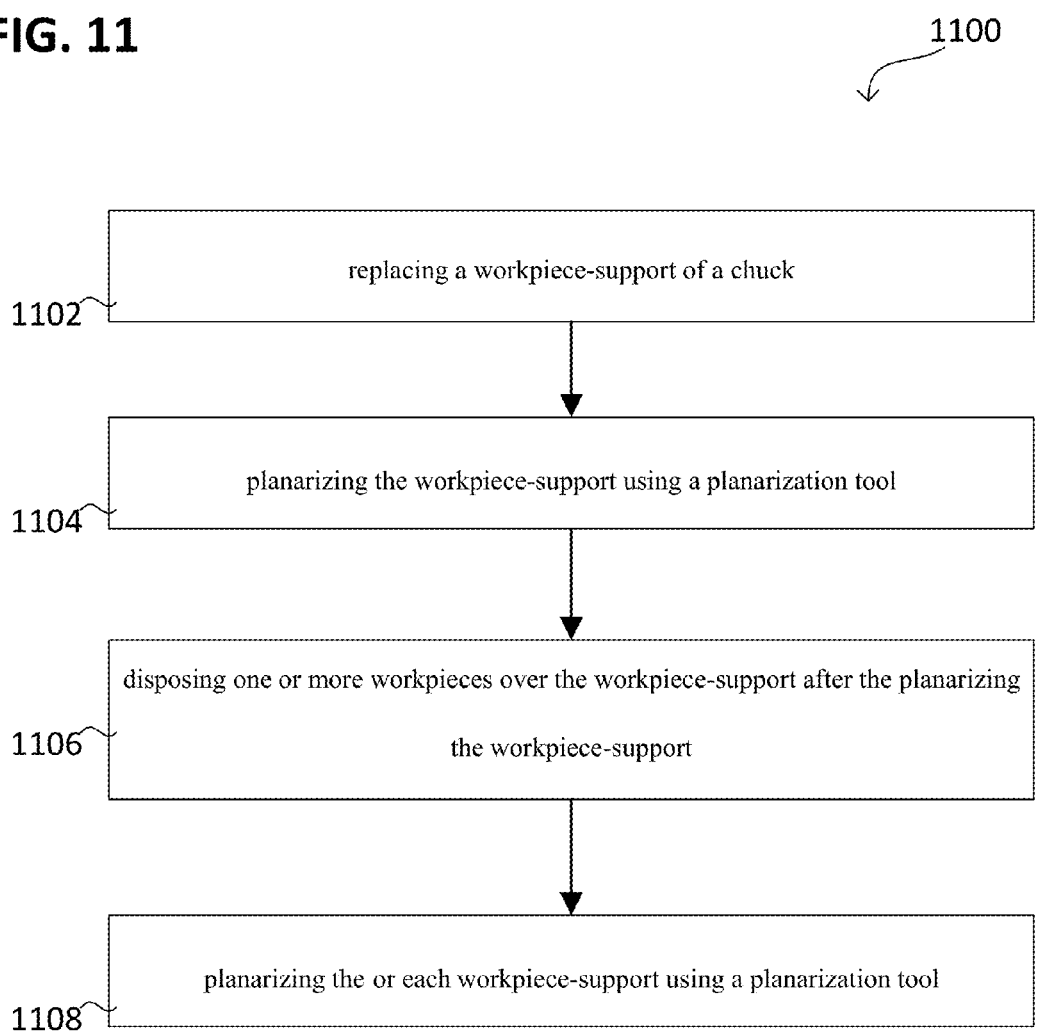

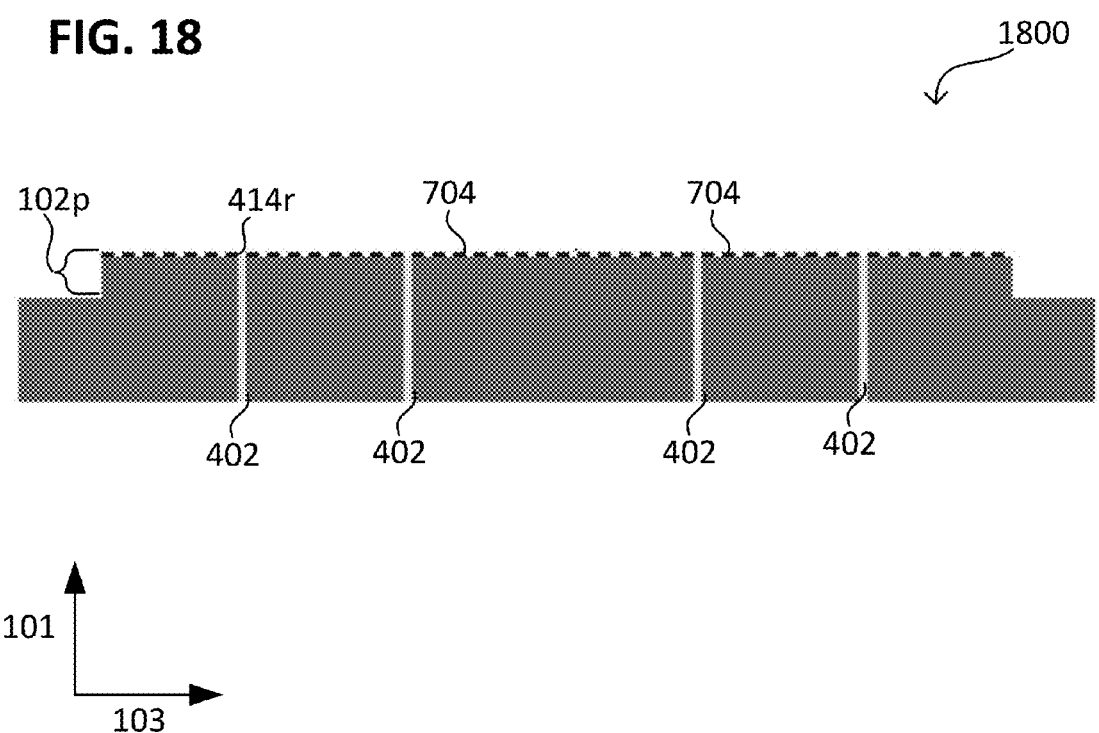

2100

602b

414r

414r

414r

US 10,199,255 B2

METHOD FOR PROVIDING A PLANARIZABLE WORKPIECE SUPPORT, A WORKPIECE PLANARIZATION ARRANGEMENT, AND A CHUCK

CROSS-REFERENCE TO RELATED APPLICATION

This application is a continuation-in-part of U.S. application Ser. No. 15/065,914, filed on Mar. 10, 2016, the entire contents of which are hereby incorporated herein by reference.

TECHNICAL FIELD

Various embodiments relate generally to a method for providing a planarizable workpiece support, a workpiece planarization arrangement, and a chuck.

BACKGROUND

In general, semiconductor materials may be processed in semiconductor technology on or in a substrate (also referred to as a wafer or a carrier), e.g. to fabricate integrated circuits (also referred to as chips). During processing the semiconductor material, certain process steps may be applied, such as thinning the wafer, doping a semiconductor material, or forming one or more layers over the wafer.

Conventionally, the wafer is thinned to remove excess material from the backside of the integrated circuits until the integrated circuits have a predefined thickness, which influences their electronic efficiency. For a precise thinning of all integrated circuits to the same thickness, the integrated circuits may need to be aligned parallel to a thinning plane. To align the integrated circuits, the wafer may be incorporated into a planarization package, which is planarized to provide two almost plane-parallel surfaces, which enable a precise thinning of all integrated circuits of the wafer.

For minimizing a deviation of the two almost plane-parallel surfaces, the chuck on which the planarization package is disposed during planarization may be adjusted to the plane in which the planarization package is planarized. During this process, the chuck may be aligned plane-parallel to the planarization plane by a self-planarization process.

Conventionally, the self-planarization process is limited in its preciseness due to inherent technological variations of the process itself. Therefore, the almost plane-parallel surfaces of the planarization package may deviate from each other up to the maximum preciseness of the self-planarization process. Minimizing variations in the resulting thickness of the integrated circuits (also referred to as total thickness variation) may thus be limited, e.g. to more than about 2 µm in case of a 300 mm wafer diameter. The total thickness variation may not be accessible for subsequent corrections, and may be transferred into further process steps. By way of example, a stability of the total thickness variation for the readily fabricated chips may be limited to about ±3 µm, e.g., measured across a plurality of processed wafers or a plurality of processed chips in a wafer.

SUMMARY

According to various embodiments, a workpiece planarization arrangement may include: a chuck including at least one portion configured to support one or more workpieces; and a planarization tool configured to planarize the at least one portion of the chuck and to planarize one or more workpieces on the at least one portion of the chuck; wherein the at least one portion of the chuck includes at least one of particles, pores and/or a polymer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 11 and FIG. 12 respectively show a method in a schematic flow diagram according to various embodiments;

FIG. 18 shows a chuck in a schematically cross sectional view or side view according to various embodiments;

DESCRIPTION

Figure 1:
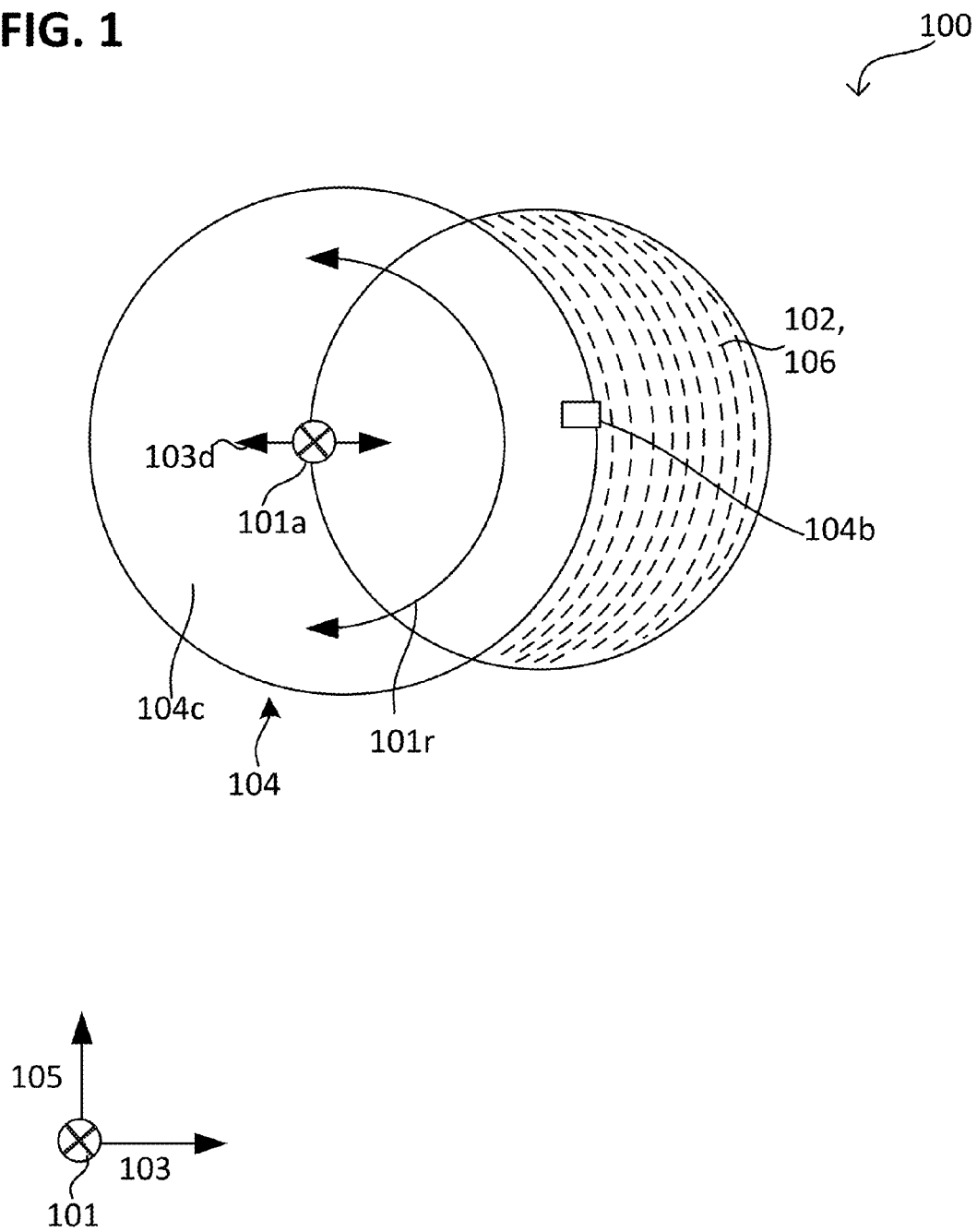
FIG. 1 shows a workpiece planarization arrangement in a schematic top view according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a support carrier) or "laterally" next to, may be used herein to mean an extension or a positional relationship along a surface of a substrate, a wafer, or a support carrier. That means that a surface of a substrate (e.g. a surface of a support carrier, or a surface of a wafer) may serve as reference, commonly referred to as the main processing surface of the substrate (or the main processing surface of the support carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, at least one of a substrate (also referred to as wafer) and a semiconductor region may include or be formed from a semiconductor material of various types, including a group IV semiconductor (e.g. silicon or germanium), a compound semiconductor, e.g. a group III-V compound semiconductor (e.g. gallium arsenide or gallium nitride) or other types, including group III semiconductors, group V semiconductors, group IV-IV semiconductors (e.g. silicon carbide) or polymers, for example. In an embodiment, at least one of the substrate and the semiconductor region is made of silicon (doped or undoped), in an alternative embodiment, at least one of the substrate and the semiconductor region is a silicon on insulator (SOI) wafer. As an alternative, any other suitable semiconductor material can be used for at least one of the substrate and the semiconductor region, for example a semiconductor compound material such as gallium phosphide (GaP), indium phosphide (InP), but also any suitable ternary semiconductor compound material or quaternary semiconductor compound material such as indium gallium arsenide (InGaAs).

According to various embodiments, at least one of the wafer and the semiconductor region may be processed to form one or more semiconductor chips at least one of in or over the semiconductor region or the respective wafer. A semiconductor chip may include an active chip area. The active chip area may be disposed in a semiconductor region of the wafer and may include one or more semiconductor circuit elements like a transistor, a resistor, a capacitor, a diode or the like. The one or more semiconductor circuit elements may be configured to perform computing or storage operations. Alternatively or additionally, the one or more semiconductor circuit elements may be configured to perform switching or rectifying operations, e.g. in power electronics (e.g., using one or more power semiconductor circuit elements).

Various semiconductor circuit elements, like at least one of a transistor and a diode, may be configured for high voltage applications (also referred to as high voltage diode or high voltage transistor, respectively). Alternatively or additionally, various semiconductor circuit elements, like at least one of a transistor and a diode, may be configured to be emitter controlled (also referred to as EMCON). Various semiconductor circuit elements may be a power semiconductor circuit element.

According to various embodiments, a transistor may be one of various types of transistors, such as among others a bipolar transistor (BJT), a heterojunction BJT, a Schottky BJT, an insulated-gate BJT (also referred to as IGBT), a field-effect transistor (FET), a junction field-effect transistor, a metal-oxide-semiconductor field-effect transistor (MOSFET), a dual-gate MOSFET, a fast-reverse or fast-recovery epitaxial diode FET, a heterostructure insulated gate FET, a modulation-doped FET, a tunnel FET.

According to various embodiments, a semiconductor chip may be singulated from the wafer by removing material from a kerf region of the wafer (also called dicing or cutting the wafer). For example, removing material from the kerf region may be processed by scribing and breaking, cleavage, blade dicing, plasma dicing, laser sawing or mechanical sawing (e.g. using a dicing saw). After singulating the semiconductor chip, it may be electrically contacted and encapsulated, e.g. by mold materials, into a chip carrier (also called a chip housing) which may then be suitable for use in electronic devices. For example, the semiconductor chip may be bonded to a chip carrier by wires, and the chip carrier may be soldered onto a printed circuit board and/or onto a lead frame (e.g., an IGBT or a power MOSFET).

According to various embodiments, a method for planarizing one or more workpieces, a workpiece planarization arrangement, a chuck and a replaceable workpiece-support (e.g. for a chuck) are provided. The one or more workpieces (in other words, the workpiece or each workpiece) may be a planarization package including the wafer and sacrificial material (e.g. in form of a sacrificial foil). It might be understood herein that also other workpieces may be processed.

According to various embodiments, it was realized that a self-planarization process of a chuck is limited in its preciseness due to the material chosen conventionally for the chuck. A conventional chuck is made from steel and coated by a nickel phosphor alloy. For the self-planarization process, a portion of the nickel phosphor coating is removed (e.g. about 3 µm to 10 µm per self-planarization). The nickel phosphor coating is substantially harder than the planarization package, which makes it necessary for the conventional self-planarization process, to modify the configuration of the whole device (e.g. changing the machining bit, machining slower, rotating slower), resulting in that at least one of thermal and mechanical conditions are different from planarizing one or more workpieces (e.g. the planarization package). This difference substantially influences the planarization planes in both configurations, such that they differ from each other. Further, the conventional self-planarization requires a long tool downtime (e.g. more than 4 to 5 hours). Frequent vacuum errors may occur during the conventional self-planarization.

Further, when the nickel phosphor coating is depleted, the chuck has to be replaced, which is very cost intensive. Due to the modification of the device and the limited thickness of the nickel phosphor coating, the number of self-planarization processes in total and/or per time is limited. Therefore, the plane-parallel alignment is vulnerable to particle contamination of the chuck, in particular if the particles are not removable by a destruction free cleaning.

Various embodiments provide a new chuck-design for tape-planarization. Various embodiments provide an inlay (e.g., made of a synthetic material such as, e.g., PET) for a chuck (e.g. a wafer chuck). The inlay may be an inexpensive part, which may be changed after several self-cuts. Various embodiments provide an inlay disc, e.g. including grooves.

According to various embodiments, the chuck is configured such that it can be self-planarized in at least one of the same physical configuration and using the same machining bit as the one or more workpieces (e.g., in almost the same machining bit configuration). Therefore, no difference may occur in the planarization planes for both, planarizing the one or more workpieces and the chuck, such that they include identical planarization planes. Illustratively, the chuck may include a material similar to the workpiece or each workpiece (e.g. the sacrificial material), such that the chuck is processible under at least one of the same physical configuration and using the same machining bit as the workpiece or each workpiece. By way of example, the chuck may include or be formed from a polymer (e.g. polyethylene terephthalate) having an elasticity module, which is configured such that the chuck and the one or more workpieces can be planarized under the same conditions.

Compared to conventional chucks (e.g. having a nickel phosphor coating) the following may be provided:
- the process parameter for planarizing one or more workpieces and the chuck (also referred to as self-cut) may be similar, e.g. equal. Thermal influences (e.g. stress) during planarizing the one or more workpieces and the chuck may be similar, e.g. equal;
- a total thickness variation may be reduced to less than about 2 μm, e.g., less than about 1 μm, e.g. less than about 0.5 μm, e.g. less than about 0.2 μm; alternatively or additionally, the total thickness variation may be maintained stable (e.g., reproducible) across processing more than one wafer, e.g., more than 10 wafers, e.g., more than 100 wafers;
- the workpiece planarization arrangement may be used in at least one of the same physical configuration and same machining bit (e.g., in the same configuration, also referred to as machining bit configuration). In other words, it is not necessary to modify the workpiece planarization arrangement while changing between planarizing the one or more workpieces and planarizing the chuck;
- reducing (e.g. avoiding) wear of the diamond bit and reducing (e.g. avoiding) damages to the diamond bit (during self-planarization);
- reducing (e.g. avoiding) maintenance intervention (illustratively, the self-planarization may be performed in a standard configuration);
- reduce the tool downtime (e.g. to less than several minutes);
- reduce cost due to inlay-replacement;
- The chuck may be self-planarized (also referred to as self-cut) more frequently, e.g. more than monthly, e.g., more than weekly, e.g., more than daily, e.g. more than hourly, e.g. in accordance to a predetermined frequency;
- increased stability of at least one of the integrated circuit fabrication and the integrated circuit fabrication system;
- reducing the effort for maintenance and service;
- reducing the attrition of the machining bit;
- if contamination with particles is recognized, a self-planarization can be performed (e.g. an automatic control may be provided);
- a risk for contaminations on at least one of the chuck and the integrated circuits may be reduced; and
- a stability of the vacuum during processing the one or more workpieces (e.g. including the wafer) may be enhanced.

According to various embodiments, a total thickness variation of a wafer and/or integrated circuits may be improved. Illustratively, a workpiece planarization arrangement is provided which enables to reduce the thickness variations to less than 1 μm, for example, e.g. in case of a 300 mm wafer diameter. This may increase the reproducibility of the thinning process, reduce the number of defective integrated circuits, and increase the quality of the integrated circuits.

FIG. 1 illustrates a workpiece planarization arrangement 100 in a schematic top view according to various embodiments.

The workpiece planarization arrangement 100 may include a chuck 102 and optionally one or more workpieces 106 disposed thereon. Further, the workpiece planarization arrangement 100 may include a planarization tool 104.

The planarization tool 104 may include a bit carrier 104c rotatable 101r about a rotation axis 101a. Further, the planarization tool 104 may include a machining bit 104b mounted on the bit carrier 104c. The machining bit 104b may include or be formed from a tip. Alternatively or additionally, the machining bit 104b may include or be formed from a blade.

The rotatable 101r bit carrier 104c and the chuck 102 may be configured for an at least two-axis displacement to each other. A first axis 101 of the two-axis displacement may be parallel to the rotation axis 101a. A second axis 103 of the two-axis displacement may be perpendicular to the rotation axis 101a. The rotatable bit carrier 104c and the chuck 102 may be configured for at least one of a first displacement 101d along the first axis 101 (see also FIG. 2) and a second displacement 103d the second axis 103. Optionally, the rotatable bit carrier 104c and the chuck 102 may be configured for a displacement along a third axis 105 perpendicular to both, the first axis 101 and the second axis 103.

A speed of rotating the bit carrier 104c and/or revolving the machining bit 104b may be in the range from about 500 rounds per minute to about 5000 rounds per minute, e.g. in the range from about 1000 rounds per minute to about 3000 rounds per minute, e.g. about 2000 rounds per minute.

A speed of the second displacement 103d may be in the range from about 0.1 mm per second to about 20 mm per second (mm/s), e.g., in the range from about 0.1 mm per second to about 5 mm per second, e.g. in the range from about 0.5 mm per second to about 2 mm per second, e.g. about 1 mm per second.

The workpiece planarization arrangement 100 may include or be formed from a fly-cutter (e.g. Disco DFS8960). The workpiece planarization arrangement 100 may include a rotating spindle 104c having a diamond tip 104b. The rotating diamond tip 104b may be configured to remove material from the one or more workpieces 106, e.g. from a sacrificial foil disposed on a wafer. The workpiece 106 or each workpiece 106 may be planarized to provide one or more workpieces 106 having two surfaces plane-parallel to each other (also referred to as planarized workpiece or planarized workpieces). According to various embodiments, variations during the planarizing may be reduced.

Figure 2:
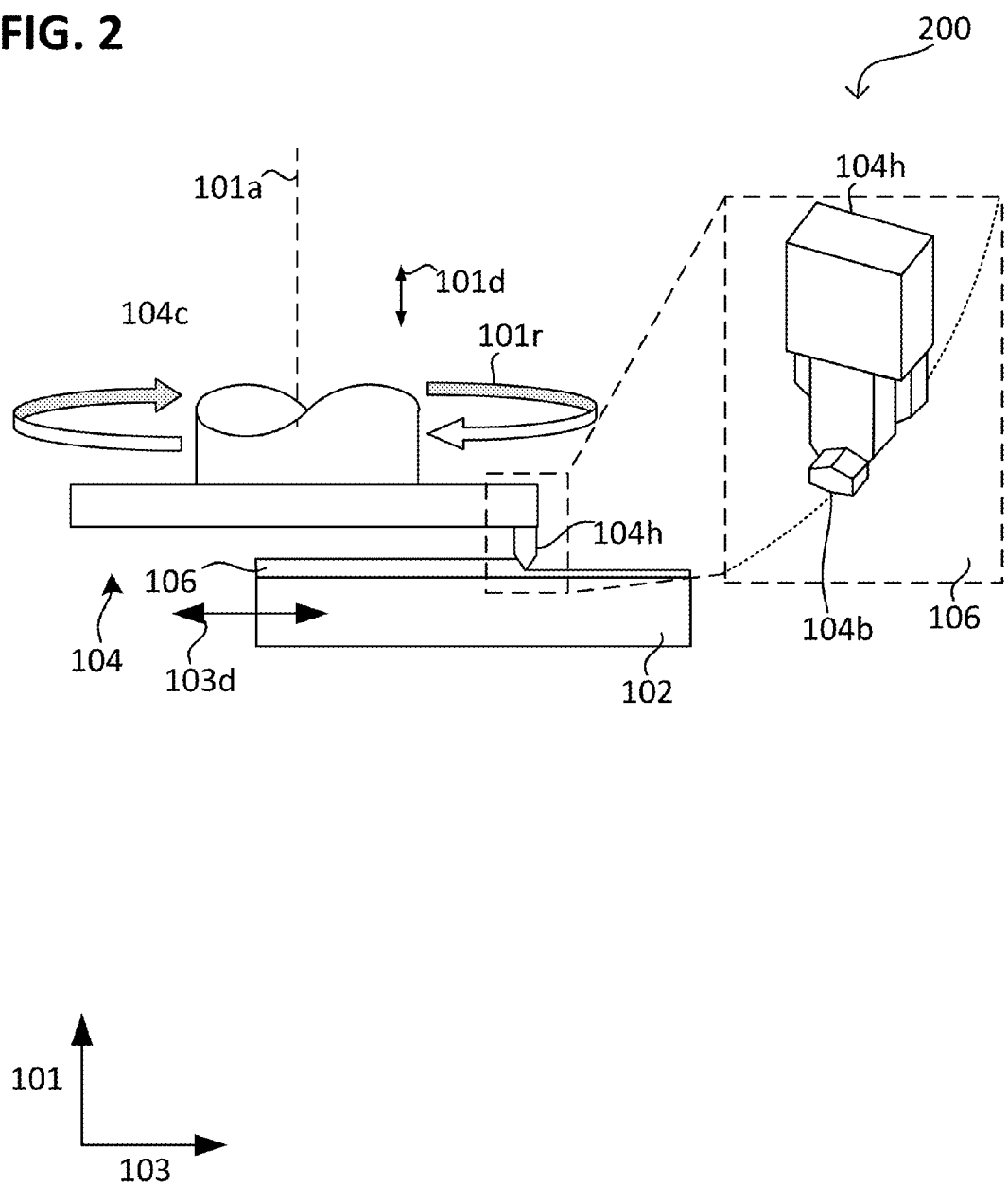
FIGS. 2 to 4 respectively show workpiece planarization arrangement in a schematic cross sectional view or side view according to various embodiments.

FIG. 2 illustrates a workpiece planarization arrangement 200 in a schematic cross sectional view or side view according to various embodiments (e.g. viewing along direction 105), e.g. the workpiece planarization arrangement described before.

The bit carrier 104c may include a bit socket 104h (illustratively, a shank) for receiving the machining bit 104b. The machining bit 104b may be replaceably mounted via the bit socket 104h.

According to various embodiments, replaceably mounted may be understood as configured for non-destructive assembly and disassembly, e.g. without destroying or damaging the two parts replaceably mounted with each other.

The rotatable bit carrier 104c and the chuck 102 may be configured for physically contacting the machining bit 104b with at least one of the chuck 102 and the (or each) workpiece 106, e.g. by reducing a distance between the machining bit 104b from at least one of the chuck 102 and the workpiece 106 or each workpiece 106 (e.g. the first displacement 101d along the first axis 101) by the first displacement 101d. For the first displacement 101d, at least one of the chuck 102 and the planarization tool 104 may be configured to move parallel to direction 101 (e.g. parallel to axis 101a). For the second displacement 103d, at least one of the chuck 102 and the planarization tool 104 may be configured to move parallel to direction 103 (e.g. perpendicular to axis 101a).

Figure 3:
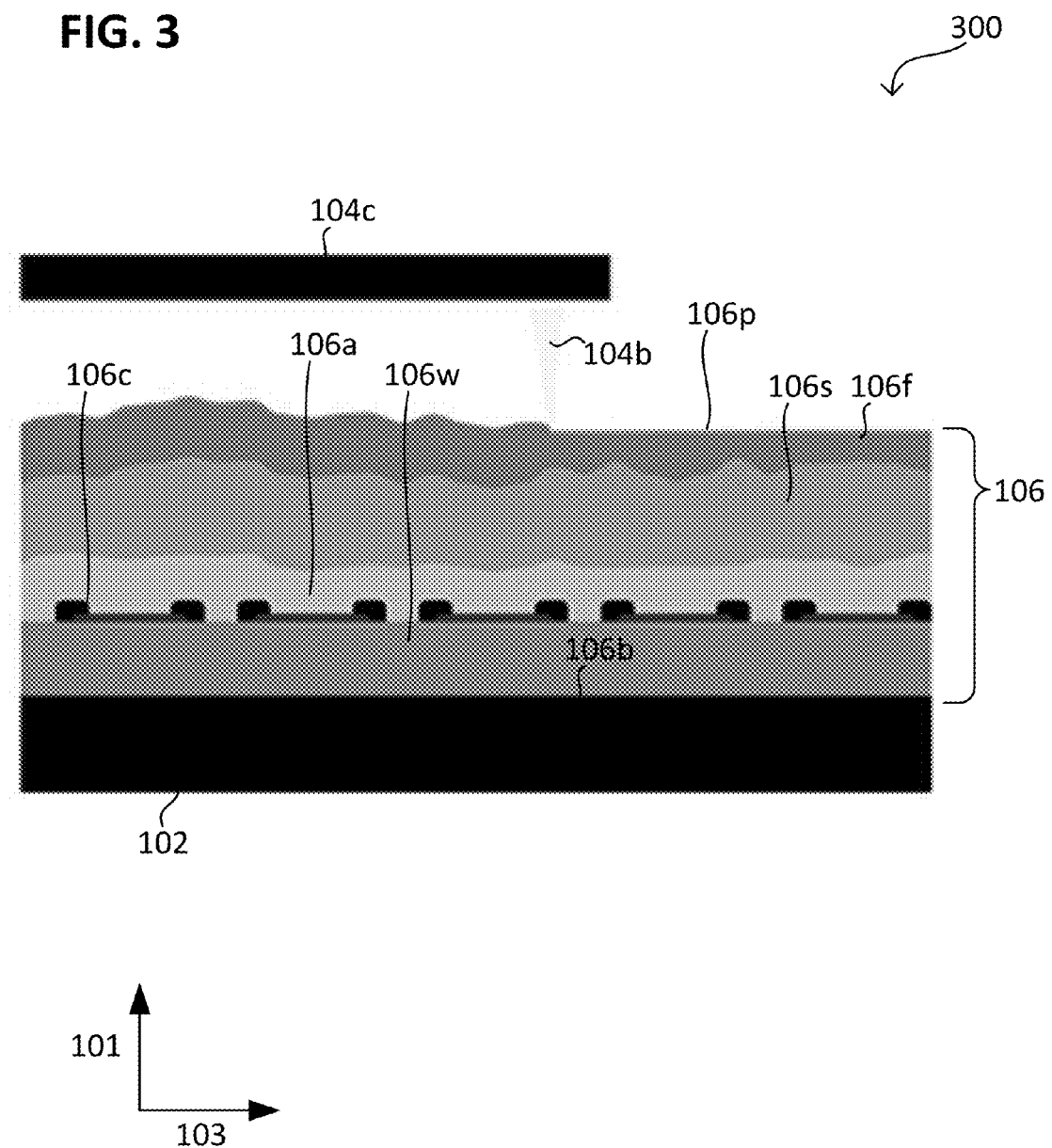

FIG. 3 illustrates a workpiece planarization arrangement 300 in a schematic cross sectional view according to various embodiments (e.g. viewing along direction 105).

The planarization tool 104 may be configured to planarize the workpiece 106 or each workpiece 106 on the chuck 102. While the machining bit 104b is in physical contact with at least one of the chuck 102 and the workpiece 106 or each workpiece 106, the machining bit 104b may revolve around the rotation axis 101a. During physical contact, the workpiece 106 or each workpiece 106 may be planarized by subtractive manufacturing (including at least one of cutting and machining).

The workpiece 106 or each workpiece 106 may include or be formed from one or more layers, e.g. a plurality of layers (also referred to as layer stack). The workpiece 106 or each workpiece 106 may include or be formed from at least one of the following layers: a first layer 106f, a second layer 106s, a third layer 106a and a fourth layer 106w. The first layer 106f (also referred to as sacrificial layer 106f or portion to be planarized) may include or be formed from a polymer, e.g. one or more polymer foils (also referred to as polymer film) and/or one or more polymer tapes. A tape may be also referred to as a self-adhesive foil.

The optional third layer 106a (also referred to as adhesive layer 106a) may include or be formed from an adhesive polymer (e.g. imide). The fourth layer 106w (also referred to as semiconductor layer 106w or wafer 106w) may include or be formed from semiconductor material. The optional second layer 106s (also referred to as stabilization layer 106s) may include or be formed from a material, which is more stable (e.g., at least one of harder and thicker) than at least one of the first layer 106f and the fourth layer 106w. For example, the fourth layer 106w may include or be formed from at least one of a ceramic, a metal and/or a glass. The optional second layer 106s may be disposed between the first layer 106f and the fourth layer 106w. The first layer 106f may be adhered to the second layer 106s (if present).

According to various embodiments, at least the first layer 106 of the workpiece 106 or each workpiece 106 may be subtractively manufactured by the machining bit 104b. By subtractive manufacturing, a planarized surface 106p of the workpiece 106 or each workpiece 106 may be formed. The planarized surface 106p of the workpiece 106 or each workpiece 106 may be plane-parallel to a surface 106b of the wafer 106w which is in contact to the chuck 102 (opposite the first layer 106f).

The wafer 106 may include one or more integrated circuits 106c, e.g. each including or formed from a chip, a transistor, a diode, e.g. in form of power integrated circuits 106c. The one or more integrated circuits 106c may each include a plurality of doped semiconductor regions. The one or more integrated circuits 106c may be covered by the first layer 106f, optionally the second layer 106s, and optionally the third layer 106a.

The first layer 106f may be planarized (smoothed and aligned) by rotating 101r the bit carrier 104c having the machining bit 104b. According to various embodiments, a mechanical hardness of the machining bit 104b may be more than (e.g. about 200%, or about 500% of) a mechanical hardness of the workpiece 106 or each workpiece 106, for example, a mechanical hardness of at least one of the first layer 106f, the second layer 106s, the third layer 106a, and the fourth layer 106w.

According to various embodiments, the machining bit 104b may include or be formed from carbon, e.g. in at least one of a diamond configuration and a diamond-like carbon configuration. Alternatively or additionally, the machining bit 104b may include or be formed from at least one of a carbide and a nitride (e.g. metal carbide like tungsten carbide and/or a metal nitride).

For example, the machining bit 104b may include or be formed from a ceramic. A ceramic may be understood as an inorganic, nonmetallic solid material, e.g., including metal, nonmetal and/or metalloid atoms primarily held in ionic and covalent bonds. For example, the ceramic may include or be formed from a carbide (for example, a metal carbide), a nitride (for example, a metal nitride) and an oxide (for example, a metal oxide like aluminum oxide, e.g., Corundum).

A mechanical hardness of the machining bit 104 may be a Mohs Hardness of more than about 4 (corresponding to a Vickers Hardness of more than about 189 and a Rockwell B Hardness of more than about 92 and a Rockwell C Hardness of more than about 13), e.g. of more than or equal to about 5, e.g. of more than or equal to about 6, e.g. of more than or equal to about 7, e.g. of more than or equal to about 8, e.g. of more than or equal to about 9, e.g. of more than or equal to about 9.5.

Illustratively, after planarization, the front-surface 106p and the rear-surface 106b are plane-parallel.

In various embodiments, the first layer 106f may include or be formed from a polymer foil. In various embodiments, the second layer 106s may include or be formed from a glass plate. In various embodiments, the third layer 106a may include or be formed from a polymer adhesive. In various embodiments, the fourth layer 106w may include or be formed from a semiconductor substrate.

In an optional embodiment, the first layer 106f may be attached to the fourth layer 106w (e.g., in direct physical contact or having an adhesive therebetween). For example, the polymer foil may be directly contacted to the semiconductor substrate (e.g., if using a self-adhesive foil).

Figure 4:
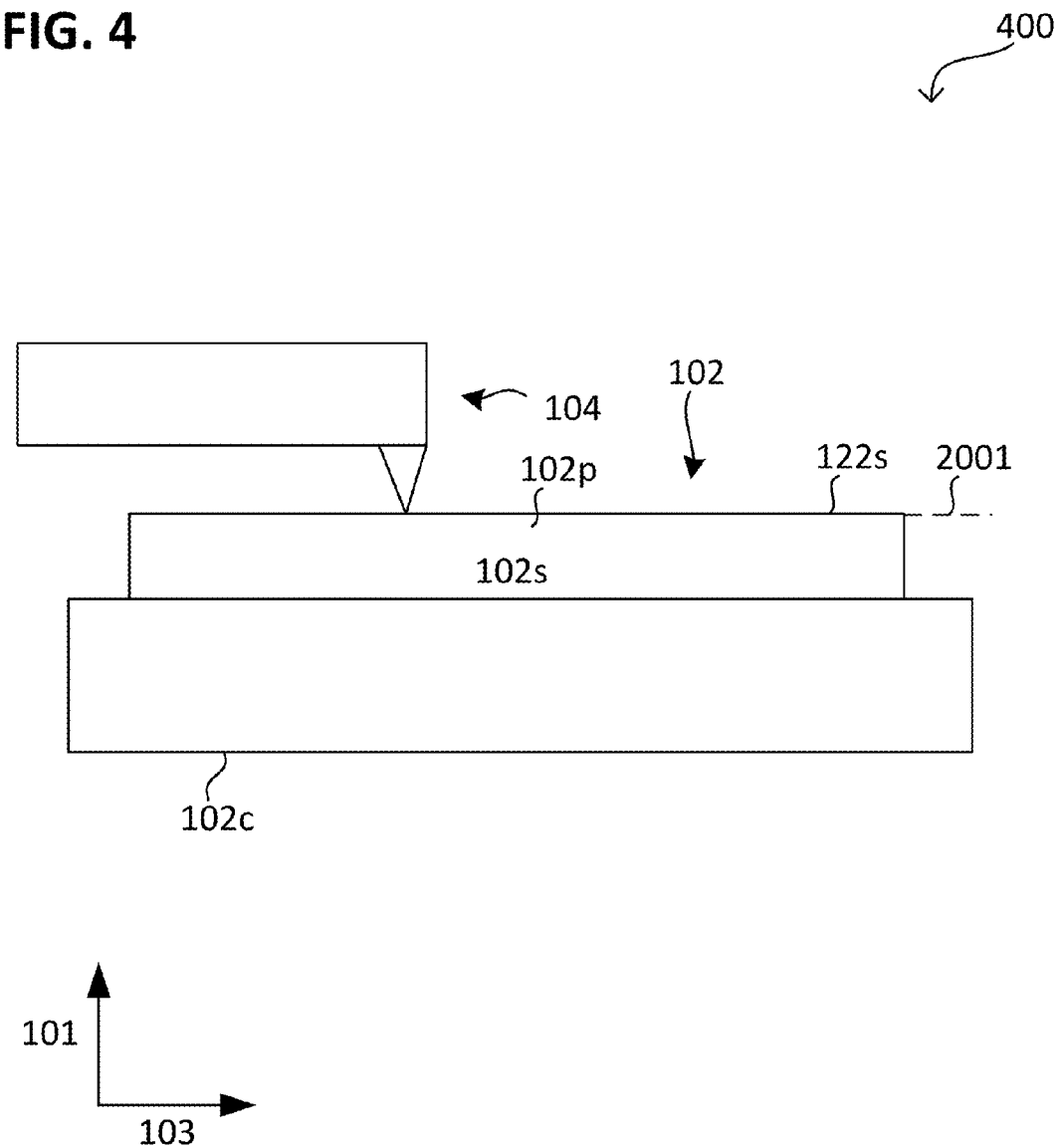

FIG. 4 illustrates a workpiece planarization arrangement 400 in a schematic cross sectional view according to various embodiments (e.g. viewing along direction 105).

The workpiece planarization arrangement 400 may include the chuck 102. The chuck 102 may include or be formed from a support carrier 102c and a workpiece-support 102s. The workpiece-support 102s may be configured to receive the one or more workpieces 106. For example, the workpiece 106 or each workpiece 106 may be disposed at least one of in and on the workpiece-support 102s. By way of example, the workpiece 106 or each workpiece 106 may be replaceably mounted to the workpiece-support 102s (also referred to as inlay), e.g. attached by at least one of adhesion, fastening (e.g. by pins, screws, or the like) and form fit. Alternatively or additionally, at least one of an electrostatic adhesion and a pneumatic adhesion may be used to mount the workpiece-support 102s. The pneumatic adhesion may be provided by at least one of forming and maintaining a vacuum between the workpiece 106 or each workpiece 106 and the workpiece-support 102s.

A thickness of the workpiece-support 102s (extension parallel to the rotation axis 101a) may be more than about 10 micrometer (µm), e.g. more than about 100 µm, e.g. more than about 250 µm, e.g. more than about 500 µm, e.g. more than about 1 millimeter (mm), e.g. more than about 10 mm.

According to various embodiments, the support carrier 102c may include or be formed from a metallic material, e.g. stainless steel. According to various embodiments, a metallic material may include or be formed from at least one chemical element of the following group of chemical elements (also referred to as metals): tungsten (W), aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), indium (In), cadmium (Cd), bismuth (Bi), vanadium (V), titanium (Ti), palladium (Pd), or zirconium (Zr) or a metal alloy including at least one chemical element of the group of chemical elements. By way of example, a metal alloy may include or be formed from at least two metals (e.g. two or more than two metals, e.g. in the case of an intermetallic compound) or at least one metal (e.g. one or more than one metal) and at least one other chemical element (e.g. a non-metal or a half metal). By way of example, a metal alloy may include or may be formed from at least one metal and at least one non-metal (e.g. carbon (C) or nitrogen (N)), e.g. in the case of steel (e.g. stainless steel). By way of example, a metal alloy may include or may be formed from more than one metal (e.g. two or more metals), e.g. various compositions of gold with aluminum, various compositions of copper with aluminum, various compositions of copper and zinc (e.g. "brass") or various compositions of copper and tin (e.g. "bronze"), e.g. including various intermetallic compounds. According to various embodiments, a metallic material may be electrically conductive.

The workpiece-support 102s may be replaceably mounted on the support carrier 102c, e.g. by at least one of: adhesion, fastening (e.g. by pins, screws, or the like) and form fit. Alternatively or additionally, at least one of an electrostatic adhesion and a pneumatic adhesion may be used. The pneumatic adhesion may be provided by at least one of forming and maintaining a vacuum between the workpiece-support 102s and the support carrier 102c. According to various embodiments, replaceably mounted may be understood as configured for non-destructive assembly and disassembly, e.g. without destroying or damaging the workpiece-support 102s and the support carrier 102c.

Further, the workpiece planarization arrangement 400 may include the planarization tool 104. The planarization tool 104 may be configured to planarize the workpiece-support 102s (illustratively, for adjusting the chuck by self-planarization) and to planarize one or more workpieces when disposed on the chuck 102.

The planarization tool 104 and the chuck 102 may be configured for physically contacting the planarization tool 104 (e.g. its machining bit 104b) with the workpiece-support 102s, e.g. by reducing a distance between the machining bit 104b from the workpiece-support 102s (by the displacement along the first axis 101) by the first displacement 101d. For the first displacement 101d at least one of the chuck 102 and the planarization tool 104 may be configured to move along direction 101 (e.g. parallel to axis 101a).

The planarization tool 104 may be configured to planarize the workpiece-support 102s (also referred to as self-planarization). While the machining bit 104b is in physical contact with the workpiece-support 102s, the machining bit 104b may revolve around the rotation axis 101a. Due to the physical contact, at least one portion 102p of the workpiece-support 102s may be subtractively manufactured (including at least one of cutting and machining) by the planarization tool 104, thereby forming a planarized surface 122p of the workpiece-support 102s. The at least one portion 102p of the workpiece-support 102s (planarized or to be planarized) may be also referred to as sacrificial support region 102p. The planarized surface 102s of the workpiece-support 102s may be plane-parallel to a planarizing plane defined by the planarization tool 104.

A mechanical hardness of the sacrificial support region 102p (also referred to as sacrificial portion 102p of the workpiece-support 102s) may be less than (e.g. about 75%, about 50%, about 25%, about 10%, about 5% or about 2% of) a mechanical hardness of at least one of the support carrier 102c and the machining bit 104b. Alternatively or additionally, the mechanical hardness of the support carrier 102c may be less than (e.g. about 75%, about 50%, about 25%, about 10%, about 5% or about 2% of) the mechanical hardness of the machining bit 104b. In other words, the mechanical hardness of the machining bit 104b may be greater (more) than the mechanical hardness of at least one of the support carrier 102c and the sacrificial support region 102p.

During planarizing the one or more workpieces 106, at least one portion 106f of the workpiece 106 may be subtractively manufactured by the planarization tool 104. The at least one portion 106f of the workpiece 106 or each workpiece 106 (planarized or to be planarized) may be also referred to as sacrificial workpiece region 106f.

According to various embodiments, the mechanical hardness of the sacrificial support region 102p may be within a range of about 20% to about 500% of the mechanical hardness of the sacrificial workpiece region 106f (e.g. the first layer 106f), e.g. within a range of about 50% to about 200% of the mechanical hardness of the sacrificial workpiece region 106f. Alternatively or additionally, the mechanical hardness of the sacrificial support region 102p may be less than (e.g. about 75%, about 50%, about 25%, about 10%, about 5% or about 2% of) a mechanical hardness of at least one of a nickel-based alloy (e.g. fabricated by electroless nickel plating), e.g. a nickel-phosphorus alloy, and an iron-based alloy, e.g. steel. The mechanical hardness of the nickel-based alloy (e.g. a Rockwell C Hardness of more than about 50, corresponding to a Brinell Hardness of more than about 469) may be more than the mechanical hardness of the iron-based alloy (e.g. a Rockwell C Hardness of more than about 25, corresponding to a Brinell Hardness of more than about 250). A metal-based alloy may refer to an alloy including more than about 50 atomic percent of the metal, e.g. more than about 70 atomic percent of the metal, e.g. more than about 80 atomic percent of the metal, e.g. more than about 90 atomic percent of the metal.

The mechanical hardness of at least one of the sacrificial support region $102p$, the one or more workpieces 106, the chuck 102, the support carrier $102c$ and the workpiece-support $102s$ may be less than (e.g. about 75%, about 50%, about 25%, about 10%, about 5% or about 2% of) a mechanical hardness of the machining bit 104.

According to various embodiments, the workpiece-support $102s$ may completely made from the sacrificial support region $102p$. Alternatively, the sacrificial support region $102p$ may be distant from the support carrier $102c$. By way of example, the sacrificial support region $102p$ may include or be formed from at least one layer (see for example, FIG. 8), e.g. at least one of a foil and a plate.

According to various embodiments, the mechanical hardness (simplified also referred to as hardness) may be understood as a measure of how resistant a solid material or body is to various kinds of permanent shape change when a compressive force is applied.

The mechanical hardness of a body or material may be dependent on at least one of ductility of the body or material, elastic stiffness of the body or material, plasticity of the body or material, strain of the body or material, strength of the body or material, toughness of the body or material, viscoelasticity of the body or material, and viscosity of the body or material. A hard body or material may include or be formed from ceramics, certain metals, and metal compounds. A soft body or material may include or be formed a polymer, such as plastic. The hard body or material may have a greater mechanical hardness than the soft body or material.

According to various embodiments, the relations in mechanical hardness may be understood to refer to the same measurement method, e.g. to at least one of an indentation hardness measurement and a scratch hardness measurement. An indentation hardness measurement may reveal the hardness of a material or body to deformation due to a constant compression load from a standardized object, e.g. a sharp object. A scratch hardness measurement may reveal the resistance of a material or body to fracture or permanent plastic deformation due to friction from a standardized object, e.g. a sharp object.

The mechanical hardness may refer to an indentation hardness, e.g. in accordance to at least one of the following measurement methods: Rockwell Hardness (DIN EN ISO 6508-1), Martens-Hardness (DIN EN ISO 14577), Brinell Hardness (EN ISO 6506-1 to EN ISO 6506-4), Vickers Hardness (DIN EN ISO 6507-1) and Shore Hardness (DIN EN ISO 868 and DIN ISO 7619-1). Alternatively or additionally, the mechanical hardness may refer to a scratch hardness, e.g. in accordance to the Mohs Scale (Mohs Hardness), or to a grinding hardness, e.g. in accordance to the Rosiwal Scale (Rosiwal Hardness). Rockwell Hardness may differ between Rockwell B Hardness and Rockwell C Hardness.

The mechanical hardness of the sacrificial support region $102p$ may be a Vickers Hardness of less than or equal to 200, e.g. of less than or equal to about 150, e.g. of less than or equal to about 100, e.g. of less than or equal to about 75, e.g. of less than or equal to about 50, e.g. of less than or equal to about 25, e.g. of less than or equal to about 20, e.g. of less than or equal to about 10, e.g. of less than or equal to or equal to about 5, e.g. of less than or equal to about 2.5.

The mechanical hardness of the sacrificial support region $102p$ may be a Mohs Hardness of less than or equal to about 4 (corresponding to a Vickers Hardness of less than or equal to about 189 and a Rockwell B Hardness of less than or equal to about 92 and a Rockwell C Hardness of less than or equal to about 13), e.g. of less than or equal to about 3 (corresponding to a Vickers Hardness of less than or equal to about 109 and a Rockwell B Hardness of less than or equal to about 61), e.g. of less than or equal to about 2.5, e.g. of less than or equal to about 2 (corresponding to a Vickers Hardness of less than or equal to about 36), e.g. of less than or equal to about 1.5, e.g. of less than or equal to about 1 (corresponding to a Vickers Hardness of less than or equal to about 2.4).

According to various embodiments, a mechanical hardness of a material may refer to a standardized mechanical hardness of a body made from the material, e.g. a block and/or a pore free body made from the material. The mechanical hardness of a material may be understood as being independently from the shape of the body.

According to various embodiments, the mechanical hardness may be a spatially averaged mechanical hardness, e.g. spatially averaged over at least one of a region, a body and a material.

According to various embodiments, a mechanical hardness according to a first measurement method may be converted into a respective mechanical hardness according to a second measurement method (e.g. using a hardness conversion table), illustratively, expressing the same physical property. By way of example, a mechanical hardness value according to the Brinell Hardness may substantially correspond to the value according to the Vickers Hardness (having a deviation less than 10% from each other).

A relation (greater or smaller) described herein, may be maintained during the conversion from the first measurement method to second measurement method. For example, a relation "a first mechanical hardness greater than a second mechanical hardness" may maintain independently weather expressed in accordance with the first measurement method or the second measurement method. A body or material having the first mechanical hardness may at least one of scratch or deform a body or material having the second mechanical hardness when applying a load physically contacting them (contact pressure).

A thickness of the at least one portion $102p$ (extension parallel to the rotation axis $101a$) may be more than about 10 micrometer (µm), e.g. more than about 100 µm, e.g. more than about 250 µm, e.g. more than about 500 µm, e.g. more than about 1 millimeter (mm), e.g. more than about 10 mm.

Figure 5:
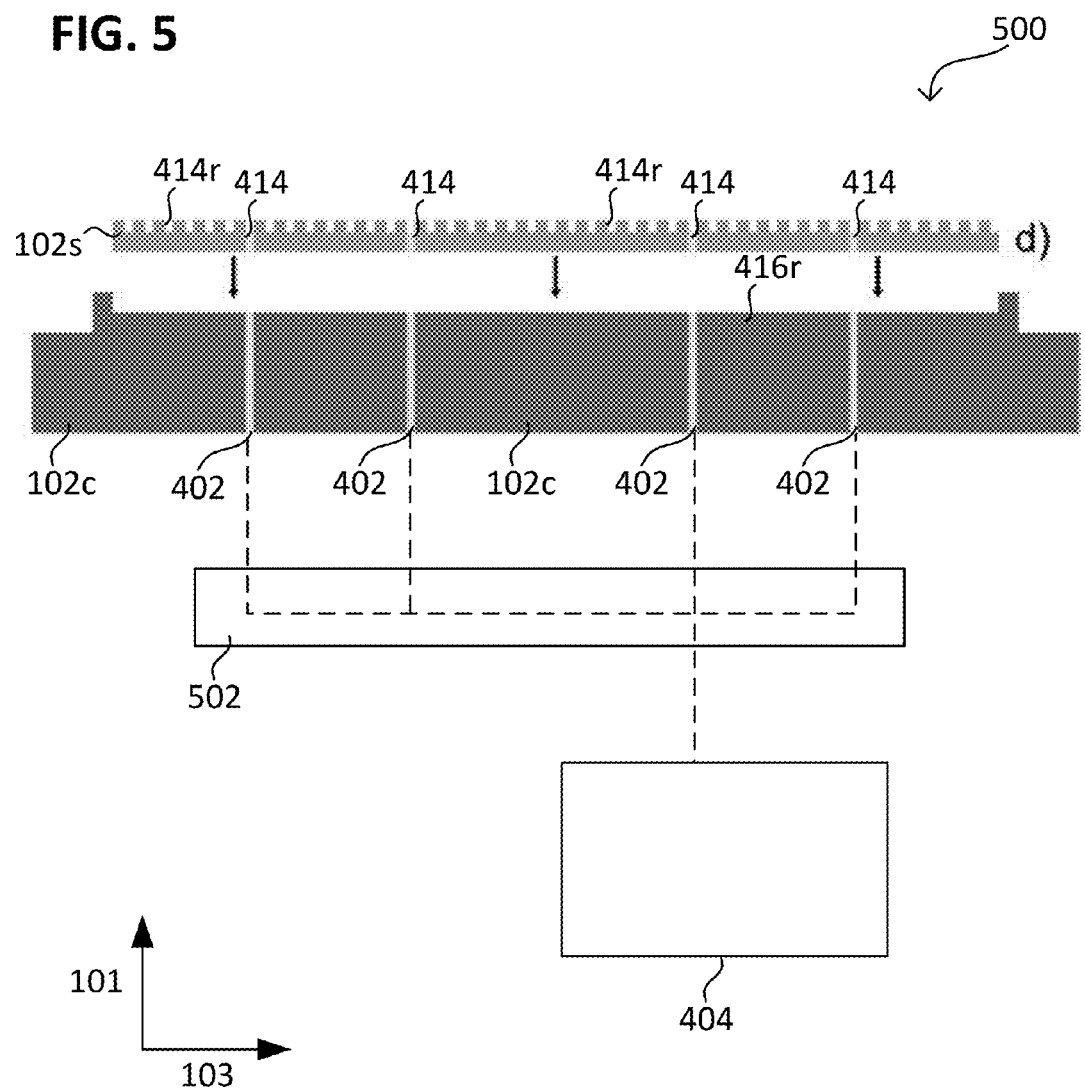
FIG. 5 shows a chuck in a schematic cross sectional view according to various embodiments.

FIG. 5 illustrates a chuck 500 in a schematic cross sectional view according to various embodiments (e.g. viewing along direction 105).

According to various embodiments, the support carrier $102c$ may include at least one vacuum line 402 (e.g. a plurality of vacuum lines 402) for connecting to a vacuum creating system 404. The vacuum creating system 404 may include or be formed from at least one pump, e.g. a vacuum pump. The vacuum creating system 404 may be connected to the at least one vacuum line 402 of the support carrier 102c, e.g. by a vacuum tube. The vacuum creating system 404 may be configured to create a vacuum in the at least one vacuum line 402 of the support carrier 102c via the connection. The vacuum line(s) 402 may also be referred to as vacuum channel(s) or vacuum pipe(s).

According to various embodiments, the workpiece-support 102s may include at least one through hole 414 (e.g. a plurality of through holes 414) connected to the at least one vacuum line 402 of the support carrier 102c (illustratively, such that one or more workpieces on the workpiece-support 102s may be adhered by suction when a vacuum is created via the at least one vacuum line 402 of the support carrier 102c). In other words, the at least one through hole 414 may be disposed such that it couples the at least one vacuum line 402 when the workpiece-support 102s is disposed at least one of in and on support carrier 102c.

According to various embodiments, the workpiece-support 102s may include a recess 414r connected to the at least one through hole 414. The recess 414r may define an adhesion region of the workpiece-support 102s over which one or more workpieces 106 may be adhered by suction when a vacuum is created via the at least one vacuum line 402 of the support carrier 102c. For example, a vacuum may be created in the recess 414r via the at least one through hole 414 during planarizing one or more workpieces 106.

A depth of recess 414r (extension parallel to the rotation axis 101a) may be less than a thickness of at least one of the workpiece-support 102s and the sacrificial support region 102p, e.g. in the range from about 50% to about 95% of the thickness of at least one of the workpiece-support 102s and the sacrificial support region 102p, e.g. more than about 100 µm, e.g. more than about 250 µm, e.g. more than about 500 µm, e.g. more than about 1 millimeter (mm), e.g. more than about 10 mm.

The chuck 500 (e.g., its support carrier 102c) may include a supply terminal 502 for workpiece adhesion supply. The supply terminal 502 may include or be formed from one or more supply connections. The one or more supply connections may be configured for being connected to a supply device (e.g., a vacuum creating system 404 or a voltage source 404), e.g., via a supply connection.

For example, if the chuck 500 is configured for adhering the workpiece 106 by suction (also referred to as pneumatic adhesion), the supply terminal 502 may include or be formed from one or more vacuum connectors. The supply terminal 502 may be configured to be coupled or may be coupled to the vacuum creating system 404. The supply terminal 502 may couple all vacuum lines 402 to each other. The pneumatic adhesion may be provided by at least one of forming and maintaining a vacuum at least one of in and via the vacuum lines 402.

For example, if the chuck 500 is configured for adhering the workpiece 106 by electrostatic force (also referred to as electrostatic adhesion), the supply terminal 502 may include or be formed from one or more electrical connectors. The supply terminal 502 may be configured to be coupled or may be coupled to a corresponding electrical voltage source 404 (e.g., a power supply). The electrostatic adhesion may be achieved by providing an electrostatic potential (also referred to as electrical voltage) to the chuck 500 (e.g., its workpiece-support 102s).

Optionally, the supply terminal 502 may be configured for adhesion of the workpiece-support 102c, if necessary, e.g., by at least one of electrostatic adhesion and a pneumatic adhesion.

In a related embodiment, the support carrier 102c may include a plurality of vacuum lines 402. The workpiece-support 102s may include a plurality of through holes 414. Each through hole of the plurality of through holes 414 may be connected to at least one vacuum line of the plurality of vacuum lines 402.

According to various embodiments, the support carrier 102c may include a recess 416r for receiving the workpiece-support 102s. The recess 416r of the support carrier 102c may be configured such that the workpiece-support 102s protrudes from the support carrier 102c when received in the recess 416r of the support carrier 102c. The recess 416r may facilitate to position the workpiece-support 102s relative to the support carrier 102c for connecting each through hole to at least one vacuum line.

The workpiece-support 102s may protrude from the support carrier 102c with more than about 10 micrometer (µm), e.g. more than about 100 µm, e.g. more than about 250 µm, e.g. more than about 500 µm, e.g. more than about 1 millimeter (mm), e.g. more than about 10 mm.

Figure 6A:
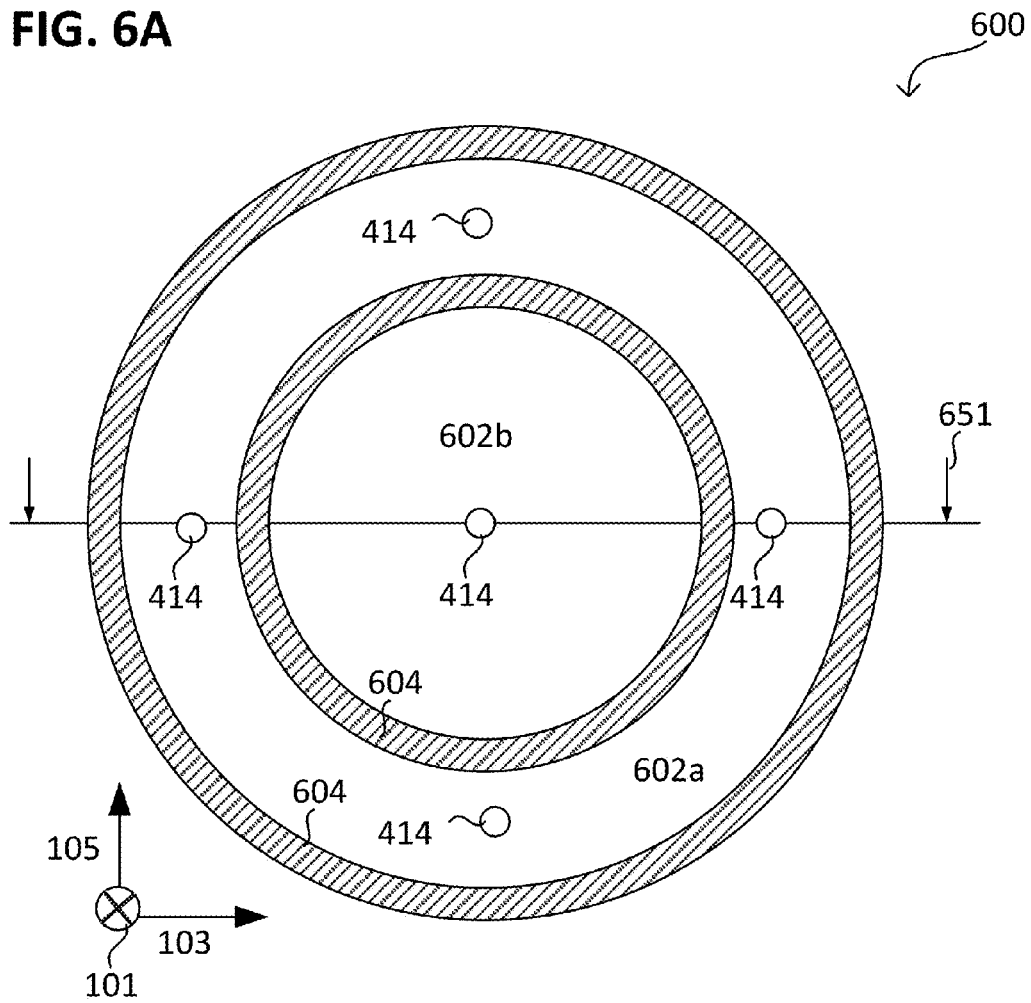
FIG. 6A and FIG. 6B respectively show a chuck or a workpiece-support in a schematic view according to various embodiments.
Figure 6B:
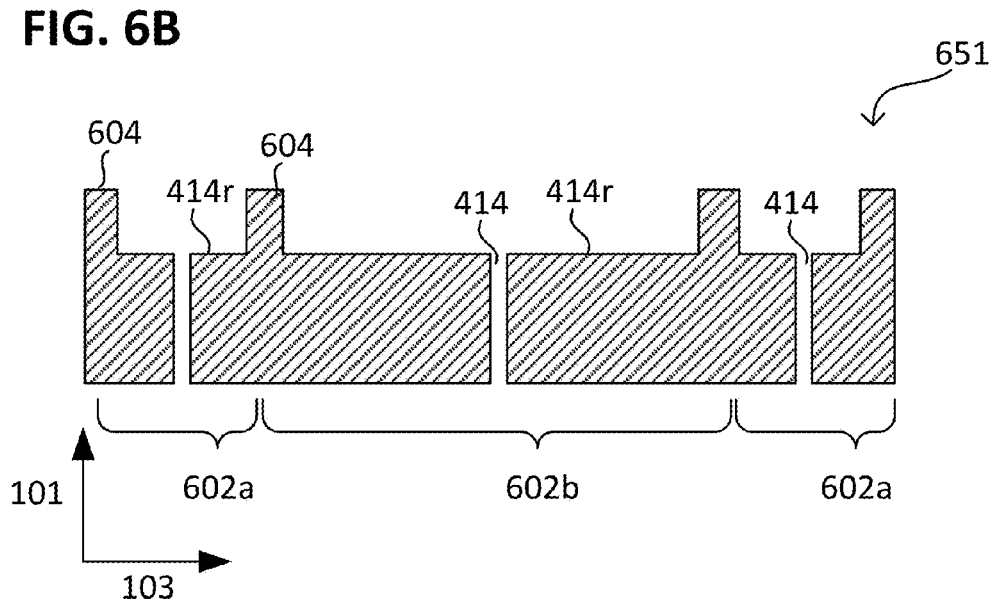

FIG. 6A illustrates a sacrificial support region 600 (e.g. of a chuck 102 or of its workpiece-support 102s) according to various embodiments in a schematic cross sectional view or top view (e.g. viewing along direction 101) and FIG. 6B illustrates the sacrificial support region 600 in a schematic cross sectional view 651 (e.g. viewing along direction 105). The sacrificial support region 600 may be planarized or to be planarized. The sacrificial support region 600 may be understood as being used for processing a plurality of workpieces 106 (e.g., before being replaced). In one or more embodiments, the sacrificial support region 600 may be consumed during planarizing the chuck 102. After the sacrificial support region 600 is consumed, it may be replaced (e.g., by replacing the complete chuck 102 or at least the workpiece-support 102s). In other words, the sacrificial support region 600 may be a wearing support region 600.

According to various embodiments, the sacrificial support region 600 may include two or more than two (a plurality of) adhesion regions 602a, 602b separated from each other, e.g. gas separated from each other. By way of example, the adhesion regions 602a, 602b may be separated from each other by one or more protruding separation walls 604.

Each adhesion region of the plurality of adhesion regions 602a, 602b may include at least one through hole of the plurality of through holes 414. For example, a first adhesion region 602a may include one or more through holes 414 and a second adhesion region 602b may include one or more through holes 414. The one or more through holes of the first adhesion region 602a may be distant from the one or more through holes second adhesion region 602b, e.g. separated by the separation wall 604.

By way of example, the first adhesion region 602a may at least partially surround the second adhesion region 602b. Optionally, the one or more further adhesion regions may at least partially surround the first adhesion region 602a and the second adhesion region 602b.

According to various embodiments, at least one adhesion region of the plurality of adhesion regions 602a, 602b may include a recess 414r connected to the at least one through hole 414 of the adhesion region of the plurality of adhesion regions 602a, 602b. By way of example, the first adhesion region 602a may include a recess 414r connected to the at least one through hole 414 of the first adhesion region 602a.

Alternatively or additionally, the second adhesion region 602b may include a recess 414r connected to the at least one through hole 414 of the second adhesion region 602b.

According to various embodiments, the separation wall 604 of each adhesion region of the plurality of adhesion regions 602a, 602b may be part of the sacrificial support region 102p, e.g. monolithically. The separation wall 604 of each adhesion region of the plurality of adhesion regions 602a, 602b may be sidewalls of the recess 414r of the respective adhesion region. The recesses 414r of the plurality of adhesion regions 602a, 602b may be formed in the sacrificial support region 600.

By way of example, the separation walls 604 of each adhesion region of the plurality of adhesion regions 602a, 602b may be monolithically connected each other, e.g. as monolithically part of the sacrificial support region 600.

Figure 7A:
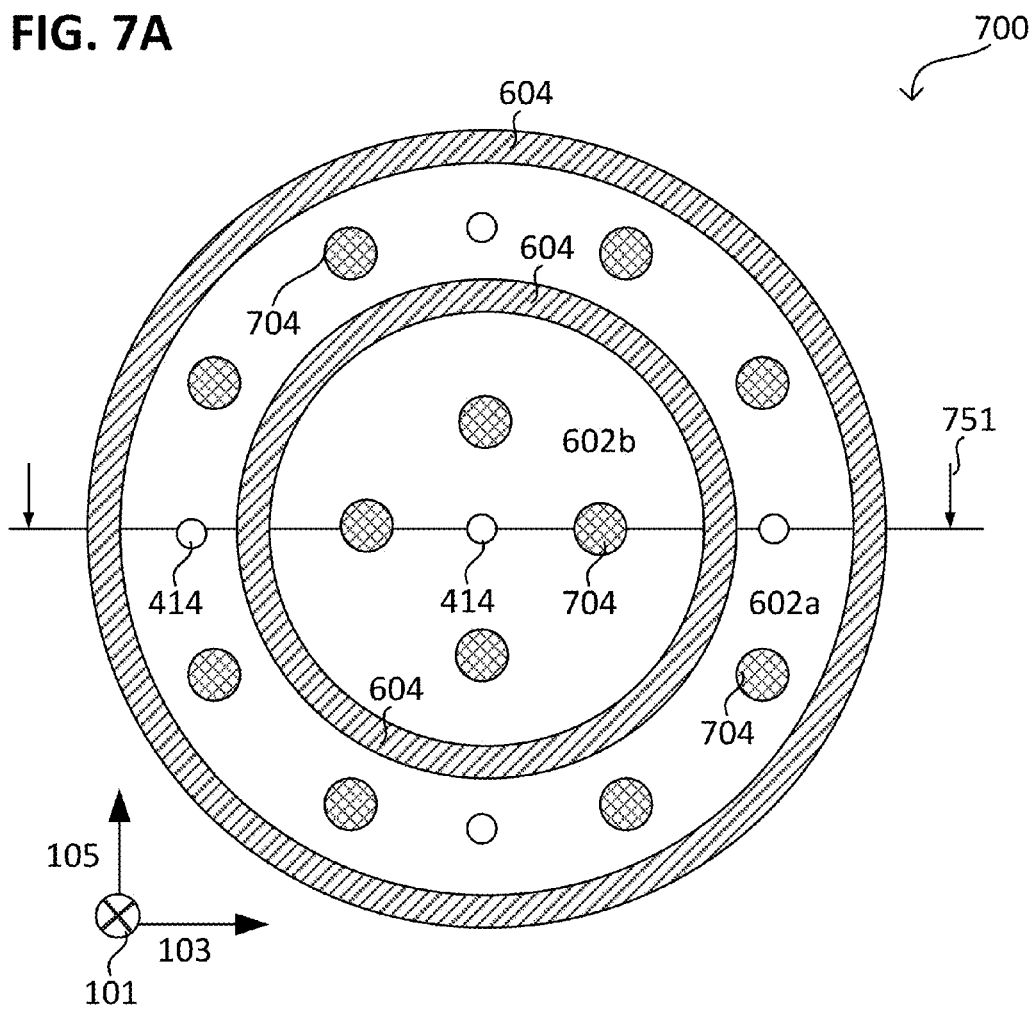
FIG. 7A and FIG. 7B respectively show a chuck or a workpiece-support in a schematic view according to various embodiments.
Figure 7B:
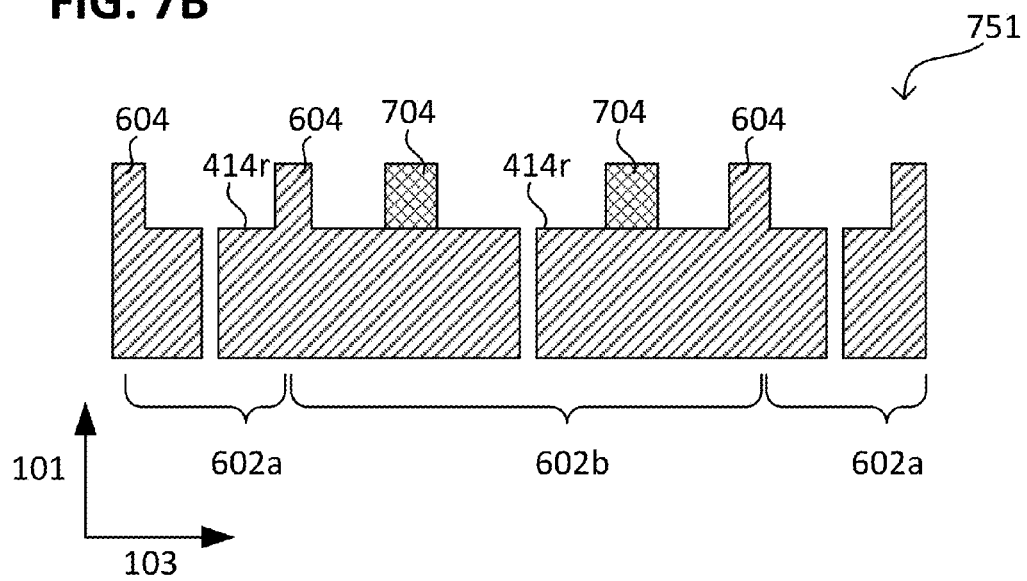

FIG. 7A illustrates a sacrificial support region 700 (e.g. of a chuck 102 or of its workpiece-support 102s) according to various embodiments in a schematic cross sectional view or top view (e.g. viewing along direction 101) and FIG. 7B illustrates the sacrificial support region 700 in a schematic cross sectional view 751 (e.g. viewing along direction 105). The sacrificial support region 700 may be planarized or to be planarized.

According to various embodiments, at least one adhesion region of the plurality of adhesion regions 602a, 602b may include one or more support protrusions 704 disposed in the recess 414r of the adhesion region of the plurality of adhesion regions 602a, 602b. By way of example, the first adhesion region 602a may include one or more support protrusions 704 disposed in the recess 414r of the first adhesion region 602a. Alternatively or additionally, the second adhesion region 602b may include one or more support protrusions 704 disposed in the recess 414r of the second adhesion region 602b.

According to various embodiments, the support protrusions 704 may be part of the at least one portion of the workpiece-support 700. Alternatively or additionally, the support protrusions 704 may be monolithically connected to at least one of: each other and the separation wall 604, e.g. as monolithically part of the sacrificial support region 700.

Figure 8A:
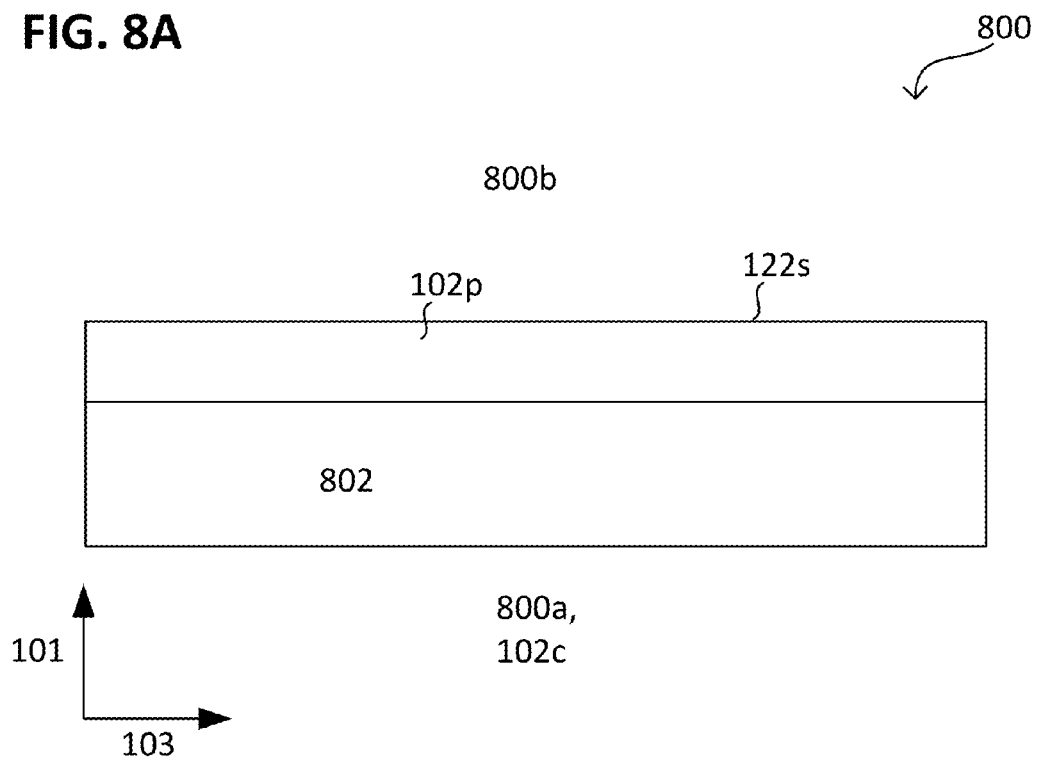
FIG. 8A shows a workpiece-support in a schematic cross sectional view according to various embodiments.

FIG. 8A illustrates a workpiece-support 800 of a chuck according to various embodiments in a schematic cross sectional view or top view (e.g. viewing along direction 101).

According to various embodiments, the workpiece-support 800 may include at least one further portion 802 (e.g. proximate to at least one of the support carrier 102c and a first side 800a). Illustratively, the at least one further portion 802 of the workpiece-support 800 may provide a stabilization of the sacrificial support region 102p. The at least one further portion 802 may be also referred to as support stabilization region 802.

According to various embodiments, the workpiece-support 800 and the support carrier 102c may be configured relative to each other such that the at least one portion 102p of the workpiece-support 800 protrudes from the support carrier 102c.

The sacrificial support region 102p may include at least one of a surface to be planarized and the planarized surface 102p (also referred to as support surface) which provides physical contact to one or more workpieces 106 on the workpiece-support 800.

The sacrificial support region 102p may be disposed on a second side 800b of the workpiece-support 800 (also referred to as support side). The support stabilization region 802 may be disposed on a first side 800a of the workpiece-support 800 (also referred to as mounting side). The first side 800a may be opposite the second side 800b. Optionally, one or more additional portions of the workpiece-support 800 may be disposed between the sacrificial support region 102p and the support stabilization region 802.

When the workpiece-support 800 is disposed in the support carrier 102c, the support stabilization region 802 may be disposed between the support carrier 102c and the sacrificial support region 102p.

According to various embodiments, the workpiece-support 800 may be formed plate-like. For example, the workpiece-support 800 may include or be formed from a plate (e.g. a disc).

Figure 8B:
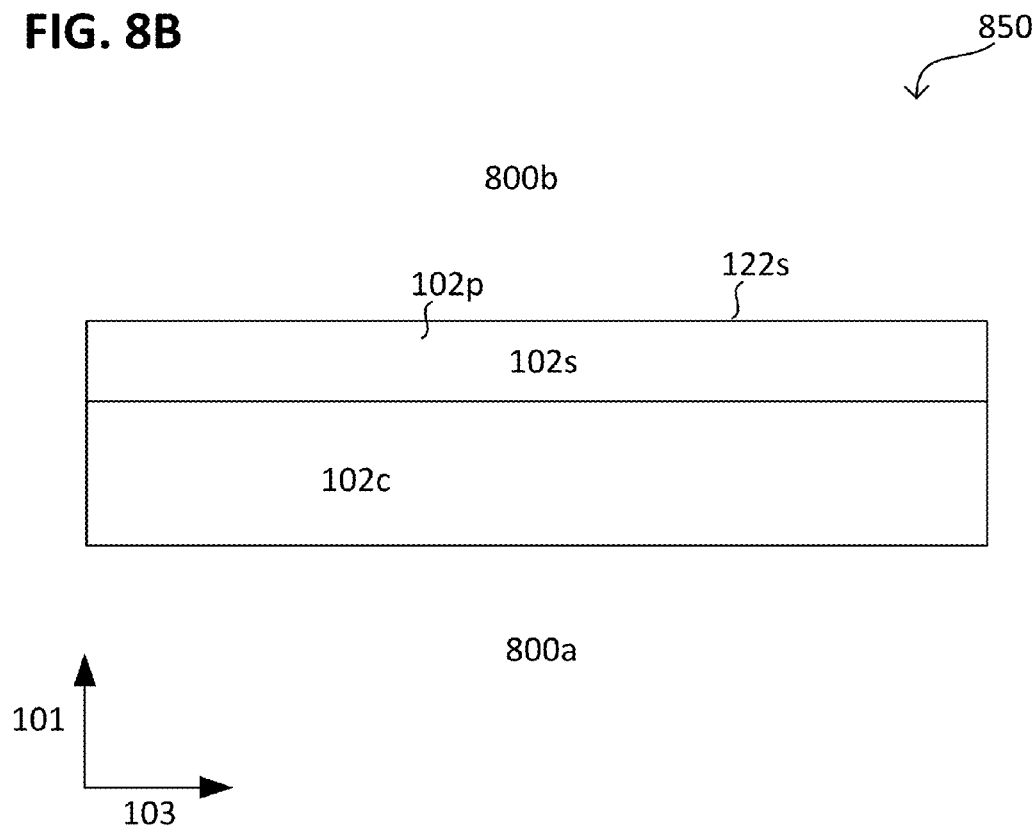
FIG. 8B and FIG. 9 respectively show a chuck in a schematic cross sectional view according to various embodiments.

FIG. 8B illustrates a chuck 850 according to various embodiments in a schematic cross sectional view or top view (e.g. viewing along direction 101) having a non-replaceable workpiece-support 102s. Illustratively, the chuck 850 may not necessarily include the replaceable workpiece-support 102s. The workpiece-support 102s may be attached to the support carrier 102c of the chuck 850.

According to various embodiments, the chuck 850 may include the sacrificial support region 102p and the support carrier 102c (illustratively, analog to the support stabilization region 102c).

The sacrificial support region 102p may include at least one of a surface to be planarized and the planarized surface 122p (also referred to as support surface) which provides physical contact to one or more workpieces 106 on the chuck 850.

The sacrificial support region 102p may be disposed on a second side 800b of the chuck 850 (also referred to as support side). The support carrier 102c may be disposed on a first side 800a of the chuck 850 (also referred to as mounting side). The first side 800a may be opposite the second side 800b. Optionally, one or more additional portions of the chuck 850 may be disposed between the sacrificial support region 102p and the support carrier 102c.

According to various embodiments, the chuck 850 may be formed plate-like. For example, the chuck 850 may include or be formed from a plate (e.g. a disc).

The sacrificial support region 102p of the chuck 850 may be configured similar as the sacrificial support region 102p of the replaceable workpiece-support 800. For the sacrificial support region 102p being a part of the chuck 850 or the replaceable workpiece-support 850 (see FIG. 8A and FIG. 8B), a mechanical hardness of the sacrificial support region 102p may be less than (e.g. about 75%, about 50%, about 25%, about 10%, about 5% or about 2% of) the mechanical hardness of at least one of: the support stabilization region 802 and the support carrier 102c. Alternatively or additionally, the mechanical hardness of the sacrificial support region 102p may be less than (e.g. about 75%, about 50%, about 25%, about 10%, about 5% or about 2% of) a mechanical hardness of at least one of a nickel-based alloy (e.g. fabricated by electroless nickel plating), e.g. a nickel-phosphorus alloy, and an iron-based alloy, e.g. steel.

Optionally, the mechanical hardness of the support stabilization region 802 may be less than (e.g. about 75%, about 50%, about 25%, about 10%, about 5% or about 2% of) the mechanical hardness of at least one of: the support carrier 102c and the machining bit 104b.

According to various embodiments, the sacrificial support region 102p may include or be formed from a coating. The coating may include or be formed from one or more foils, e.g. one or more polymer foils, or one or more layers (e.g. forming a coating), e.g. one or more polymer layers, and optionally an adhesion layer for adhering the sacrificial support region 102p to the support stabilization region 802. For example, the sacrificial support region 102p (e.g. the one or more foils) may be adhered to the support stabilization region 802, e.g. by the adhesion layer. Additionally or alternatively, the sacrificial support region 102p (e.g. the one or more layers) may be disposed, e.g. sprayed or powder deposited, on the support stabilization region 802. The disposing may include exposing to an aerosol (also referred as to aerosol-depositing, e.g. aerosol-coating), wherein the aerosol includes particles (e.g. solid and/or viscous, e.g. liquid, particles). Additionally or alternatively, the sacrificial support region 102p (e.g. the one or more layers) may be laminated, pressed and/or molded.

For example, one or more foils may be laminated on the support stabilization region 802 to form the one or more layers. Additionally or alternatively, a material may be pressed on the support stabilization region 802 to form the one or more layers. Pressing may include deforming the material using pressure. Laminating may, for example, include pressing the foil on the support stabilization region 802 while heating the foil.

For example, a material (also referred as to sacrificial material) disposed on the support stabilization region 802 may be molded and/or sintered to form the one or more layers. For example, the moldable material may include or be formed from particles (e.g. from the aerosol) and/or may include or be formed from a paste (e.g. including a viscous material and/or particles). For example, the viscous material may be solidified (e.g. dried) by heat and/or form a matrix (e.g. a polymer matrix) in which the particles (e.g. metallic particles) are embedded. The matrix and the particles may differ by its material, e.g. by chemical composition. Additionally or alternatively, a hardness of the particles may be greater than a hardness of the matrix.

According to various embodiments, the sacrificial support region 102p (e.g. the particles, the sacrificial material and/or the foil) may include or be formed from a polymer (e.g., organic or inorganic), e.g. at least one of synthetic rubber, phenol formaldehyde resin (or Bakelite), neoprene, nylon, polyvinyl chloride (PVC or vinyl), polystyrene, polyethylene (e.g. polyethylene terephthalate, also referred to as PET), polypropylene, polyacrylonitrile, PVB, silicone, or the like. Alternatively or additionally, the sacrificial support region 102p (e.g. the particles, the sacrificial material and/or the foil) may include or be formed from a metallic material, e.g. having a Mohs Hardness of less than about 4, e.g. of less than about 3, e.g. of less than about 2.5, e.g. of less than about 2, e.g. of less than about 1.5, e.g. of less than about 1. For example, the metallic material of the sacrificial support region 102p may include at least one of the following metals: lead, indium, silver, aluminum, copper and gold.

For example, the particles and/or the at least one layer may include or be formed from the sacrificial material, e.g. the polymer and/or the metal.

The laminating, molding and/or pressing may be suitable for a sacrificial support region 102p (e.g. its one or more layers) including or formed from the polymer (e.g. polymer particles and/or polymer foil). The sintering, pressing and/or molding may be suitable for a sacrificial support region 102p (e.g. its one or more layers) including or formed from the metal (e.g. metal particles).

Optionally the molding, the sintering, the aerosol-depositing and/or the powder depositing may result in a sacrificial support region 102p (e.g. its one or more layers) including a plurality of pores (e.g. between adjacent particles) and/or including a plurality of particles (e.g. being in contact with each other, e.g. like grains and/or deformed). For example, the particles, which have been melted or sintered (during the material is densified) may still be visible as their residuals (e.g. deformed and/or interconnected particles). This (e.g. deformed and/or interconnected particles) particles may also referred as to particle residuals.

A porosity (also referred to as void fraction or pore fraction), e.g. of the sacrificial support region 102p (e.g. of its at least one sacrificial layer), may refer to void space in a region, and may be understood as a fraction of the volume of voids (also referred as to pores, e.g. inclusions of gas) over the total volume or total area of the region (e.g. a layer or material). A porous layer (e.g. the at least one sacrificial layer), region (e.g. the sacrificial support region 102p) or material (in other words including pores) may, for example, have a porosity in the range from about 0.01 to about 0.9 (e.g. about 0.1 to about 0.9), or in other words, as a percentage in the range from about 1% to about 90% (e.g. about 10% to about 90%) or less than about 1% (e.g. more than about 0.01%, e.g. more than about 0.1%), e.g. in the range from about 0.01% to about 1%. The porosity may refer to a spatially averaged value, e.g. averaged over a region. According to various embodiments, the pore-density and the spatial pore-size may define the porosity. Alternatively or additionally, the pore-density and the porosity may define the spatial pore-size. Alternatively or additionally, the porosity and the spatial pore-size may define the pore-density. The more pores are present (e.g. included in a region, e.g. a layer), the higher the pore-density and/or the porosity may be.

For example, the density of the porous layer, region or material may be less than the respective bulk density (due to the voids).

According to various embodiments, the support stabilization region 802 may include or be formed from a metallic material, e.g. different from the support carrier 102c.

The sacrificial support region 102p being a part of the chuck 850 or the workpiece-support 850 may be configured as described before (see for example, FIG. 6A and FIG. 6A or FIG. 7A and FIG. 7B).

A thickness of the sacrificial support region 102p (extension parallel to the rotation axis 101a) may be more than about 10 micrometer (μm), e.g. more than about 100 μm, e.g. more than about 250 μm, e.g. more than about 500 μm, e.g. more than about 1 millimeter (mm), e.g. more than about 10 mm, e.g. more than about 20 mm.

Figure 9:
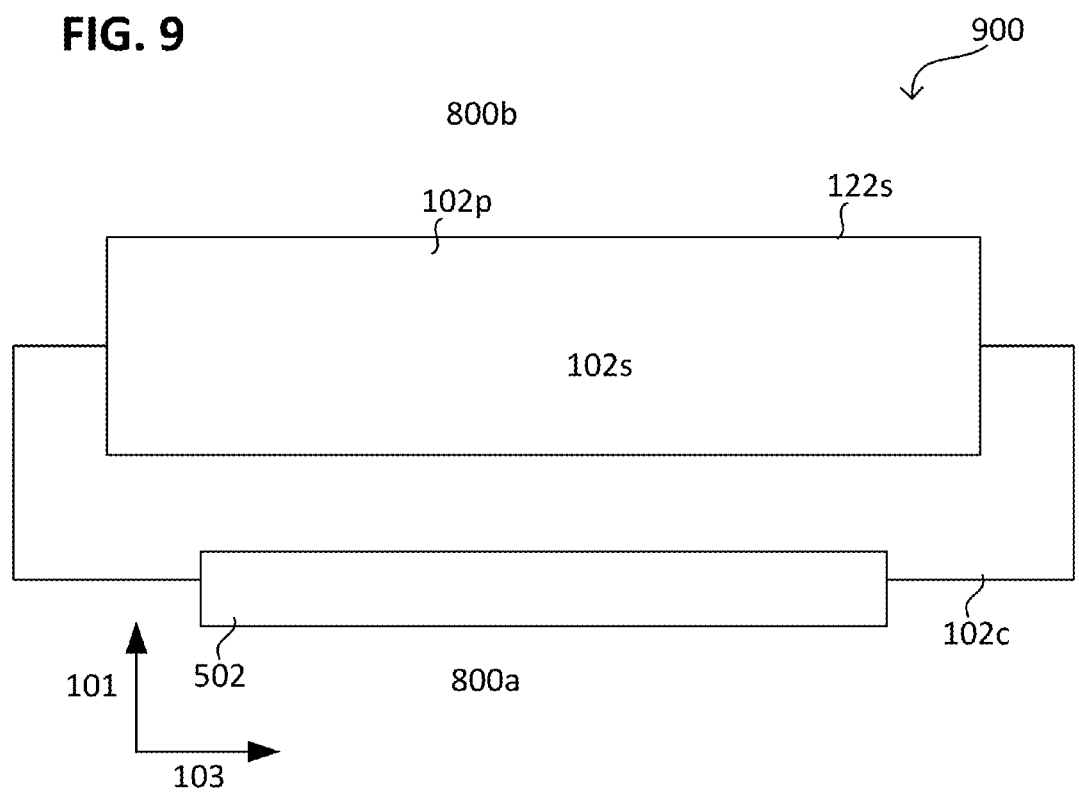

FIG. 9 illustrates a chuck 900 according to various embodiments in a schematic cross sectional view or top view (e.g. viewing along direction 101).

According to various embodiments, the chuck 900 may include a support carrier 102c a workpiece-support 102s replaceably mounted on the support carrier 102c. The mechanical hardness of the sacrificial support region 102p may be less than the mechanical hardness of the support carrier 102c, e.g. as described before. Optionally, the workpiece-support 102s may extend at least one partially into the support carrier 102c, as illustrated in FIG. 9. Alternatively, the workpiece-support 102s may be disposed over the support carrier 102c (see for example, FIG. 4). In both cases, at least the sacrificial support region 102p may protrude from the support carrier 102c. This may facilitate adjusting the workpiece-support 102s by a planarization of the planarization tool 104.

Figure 10A:
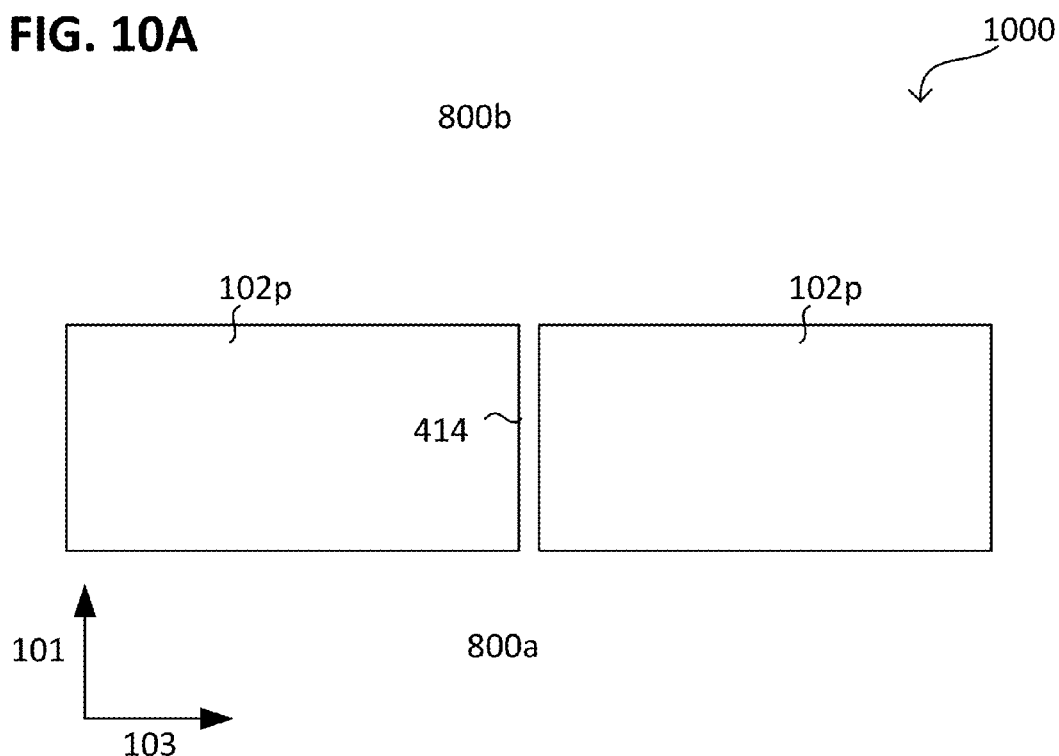
FIG. 10A show a replaceable workpiece-support in a schematic cross sectional view and FIG. 10B shows the replaceable workpiece-support in a corresponding top view according to various embodiments.
Figure 10B:
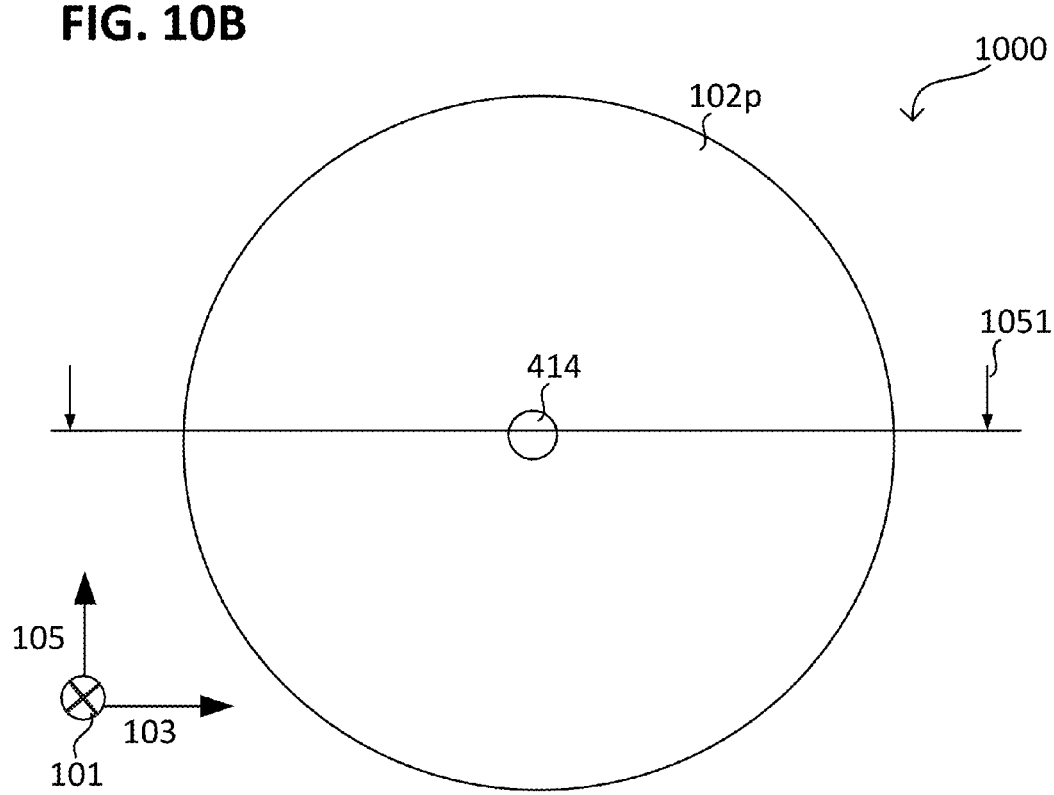

FIG. 10A illustrates a replaceable workpiece-support 1000 (e.g. for a chuck) according to various embodiments in a schematic cross sectional view (e.g. viewing along direction 101, e.g., along a cross section 1051), and FIG. 10B shows the replaceable workpiece-support 1000 in a schematic top view.

The replaceable workpiece-support 1000 may include a first side 800a configured to be replaceably mounted to a support carrier 102c of the chuck 102, e.g. configured similar to a support carrier 102c described before. The replaceable workpiece-support 1000 may further include a second side 800b opposite the first side 800a. The second side 800b may be configured to support one or more workpieces 106 and/or include one or more protrusions.

The replaceable workpiece-support 1000 may further include at least one through hole 414 (e.g. a plurality of through holes 414) extending from the first side 800a to the second side 800b. This may enable that one or more workpieces 106 received over the second side 800b may be adhered by suction when a vacuum is created in the at least one through hole 414.

A mechanical hardness of at least one portion 102p (sacrificial support region 102p) of the workpiece-support 1000 proximate (e.g. at least partially covering) to the second side 800b may be less than (e.g. about 75%, about 50%, about 25%, about 10%, about 5% or about 2% of) a mechanical hardness of at least one of a nickel-based alloy, e.g. a nickel-phosphorus alloy, and an iron-based alloy, e.g. steel. Alternatively or additionally, the sacrificial support region 102p may include or be formed from a polymer. This may enable to adjust the workpiece-support 1000 by planarizing via a planarizing tool 106.

FIG. 11 illustrates a method 1100 for planarizing one or more workpieces according to various embodiments in a schematic flow diagram.

According to various embodiments, the method may include in 1102: replacing (e.g. at least one of mounting and demounting) a workpiece-support of a chuck (e.g. from the support carrier).

The method may further include in 1104: planarizing the workpiece-support using a planarization tool. For example, the method may include in 1104: planarizing at least one portion of the workpiece-support using a planarization tool.

The method may further include in 1106: disposing one or more workpieces over the workpiece-support after the planarizing the at least one portion of the workpiece-support.

The method may further include in 1108: planarizing one or more workpieces using the planarization tool. For example, the method may include in 1108: planarizing at least one portion of the workpiece or each workpiece using the planarization tool.

The workpiece-support may be configured as described herein. The mechanical hardness of the at least one portion of the workpiece-support may be less than a support carrier of the chuck receiving the workpiece-support.

According to various embodiments, the mechanical hardness of the at least one portion of the workpiece-support may be within a range of about 20% to about 500% of the mechanical hardness of at least one portion of the workpiece or each workpiece (e.g. a sacrificial workpiece region), e.g. within a range of about 50% to about 200% of the mechanical hardness of the at least one portion of the workpiece or each workpiece. Alternatively or additionally, the mechanical hardness of the at least one portion of the workpiece-support may be less than (e.g. about 75%, about 50%, about 25%, about 10%, about 5% or about 2% of) a mechanical hardness of at least one of a nickel-based alloy (e.g. fabricated by electroless nickel plating), e.g. a nickel-phosphorus alloy, and an iron-based alloy, e.g. steel.

The at least one portion of the workpiece or each workpiece may be planarized using the planarization tool.

Optionally, the method may include planarizing the at least one portion of the workpiece-support using the planarization tool.

By way of example, the at least one portion (of at least one of: the workpiece or each workpiece and the workpiece-support) may include or be formed from a polymer.

According to various embodiments, the more than one workpiece 106 may include a plurality of workpieces 106, e.g., more than about 10 workpieces, e.g., more than about 100 workpieces, e.g., more than about 1000 workpieces. According to various embodiments, the plurality of workpieces 106 may be planarized sequentially (in other words, one after the other) using the workpiece planarization arrangement. According to various embodiments, planarization of the workpiece or workpieces 106 may be carried out between a first planarization of the workpiece-support and a second planarization of the workpiece-support. According to various embodiments, planarization of the workpiece-support may be carried out between planarization of a first workpiece (or first plurality of workpieces) 106 and planarization of a second workpiece (or second plurality of workpieces) 106.

Figure 12:
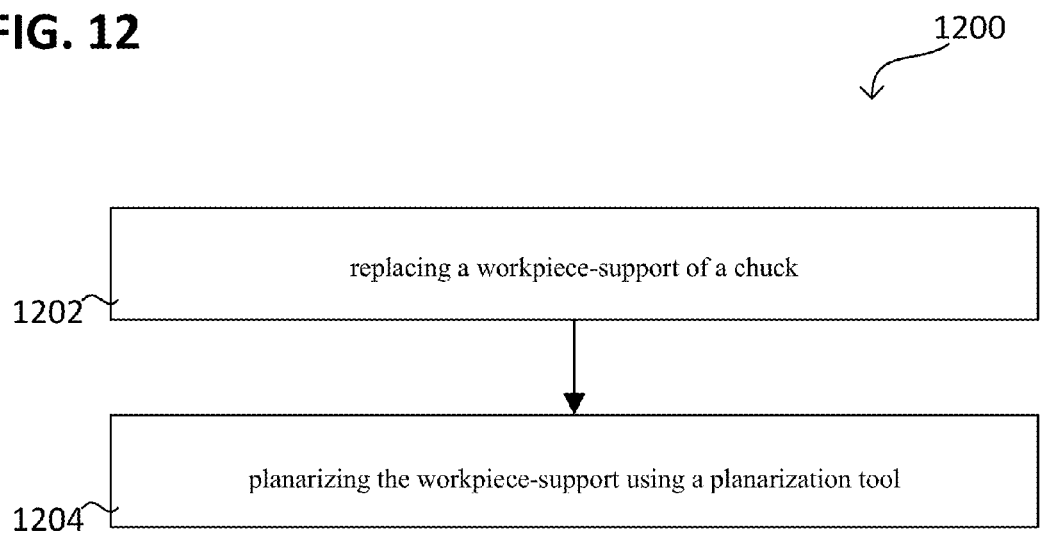

FIG. 12 illustrates a method 1200 for adjusting a workpiece planarization arrangement according to various embodiments in a schematic flow diagram. The workpiece planarization arrangement may include a chuck and a planarization tool, e.g. configured as described herein.

The chuck may include or be formed from a support carrier and a workpiece-support being replaceably mounted to the support carrier. The mechanical hardness of the workpiece-support may be less than (e.g. about 75%, about 50%, about 25%, about 10%, about 5% or about 2% of) the mechanical hardness of the support carrier.

According to various embodiments, the method may include in 1202: replacing (e.g. at least one of mounting and demounting) the workpiece-support of the chuck (e.g. on or respectively from the support carrier).

The method may further include in 1202: planarizing the workpiece-support by the planarization tool. For example, the method may include planarizing at least one portion of the workpiece-support using the planarization tool.

The method may optionally include: disposing one or more workpieces over the workpiece-support after the planarizing the workpiece-support.

The method may optionally include: planarizing one or more workpieces using the planarization tool. For example, the method may include planarizing at least one portion of the workpiece or each workpiece using the planarization tool, e.g., each of the more than one workpieces.

According to various embodiments, the mechanical hardness of the at least one portion of the workpiece-support may be within a range of about 20% to about 500% of the mechanical hardness of at least one portion of the workpiece or each workpiece (e.g. a sacrificial layer of the workpiece or each workpiece), e.g. within a range of about 50% to about 200% of the mechanical hardness of the at least one portion of the workpiece or each workpiece. Alternatively or additionally, the mechanical hardness of the at least one portion of the workpiece-support may be less than (e.g. about 75%, about 50%, about 25%, about 10%, about 5% or about 2% of) a mechanical hardness of at least one of a nickel-based alloy (e.g. fabricated by electroless nickel plating), e.g. a nickel-phosphorus alloy, and an iron-based alloy, e.g. steel.

The (e.g. at least one portion of) the one or more workpieces (e.g., the workpiece or each workpiece) may be planarized using the planarization tool.

Optionally, the method may include planarizing the (e.g. at least one portion of) the workpiece-support using the planarization tool.

By way of example, the at least one portion (of at least one of the workpiece or each workpiece and the workpiece-support) may include or be formed from a polymer.

Figure 13A:
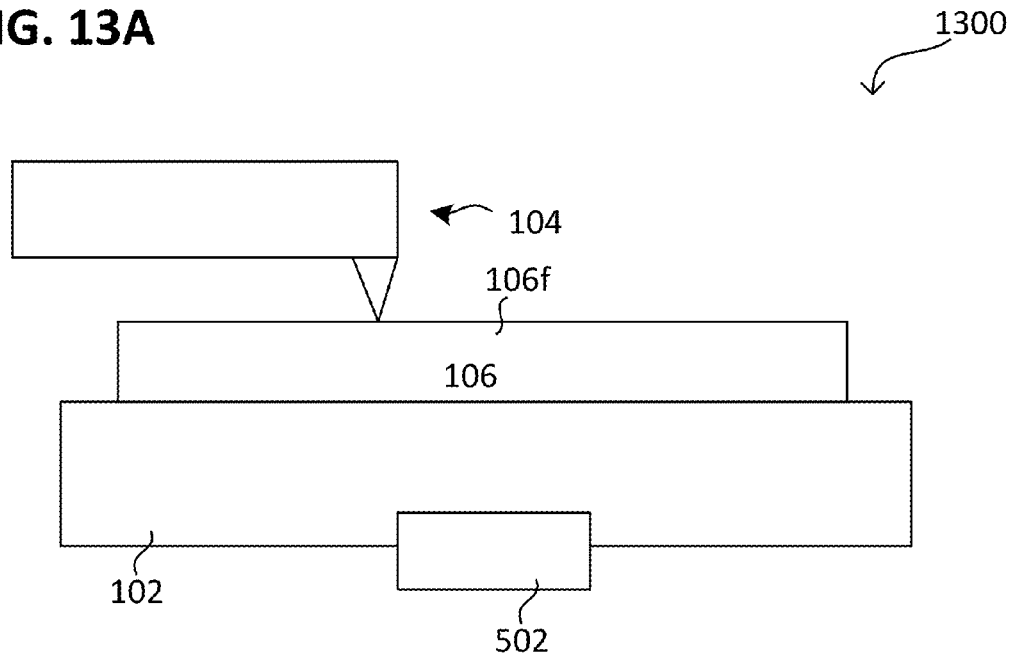
FIG. 13A and FIG. 13B respectively show a workpiece planarization arrangement in a schematic cross sectional view according to various embodiments.
Figure 13B:
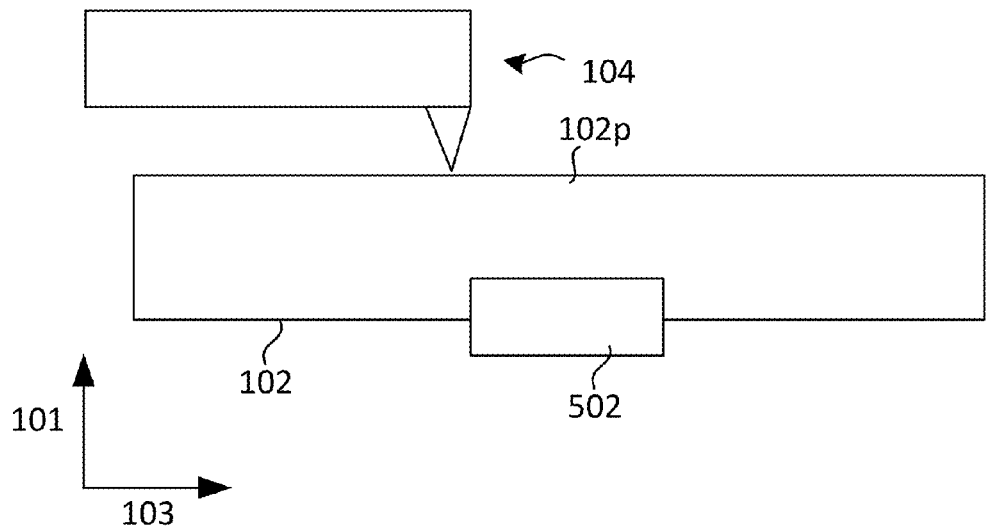

FIG. 13A illustrates a workpiece planarization arrangement 1300 according to various embodiments in a schematic cross sectional view or top view (e.g. viewing along direction 101) with one or more workpieces 106 and FIG. 13B the workpiece planarization arrangement 1300 without workpiece 106 in the same view.

According to various embodiments, the workpiece planarization arrangement 1300 may include a chuck 102 and a planarization tool 104. The planarization tool 104 may be configured to planarize the chuck 102 (without the one or more workpieces 106) and to planarize one or more workpieces 106 on the chuck 102. Illustratively planarizing the chuck 102 (also referred to as self-planarization) may adjust the chuck 102 for planarizing the one or more workpieces 106.

According to various embodiments a hardness of a portion 102p of the chuck 102 (planarized or to be planarized) may be configured such that the planarizing the portion 102p of the chuck 102 (planarized or to be planarized) and the planarizing a portion 106f to be planarized of the one or more workpieces 106 (in other words, the workpiece or each workpiece 106) use the planarization tool 104 in at least one of the same physical configuration and the same machining bit configuration (in other words in a first machining bit configuration for planarizing the one or more workpieces and a second machining bit configuration planarizing the at least one portion of the chuck, wherein the first machining bit configuration and the second machining bit configuration are the same).

In the same physical configuration may be understood as that the physical configuration of the planarization tool 104 may not be necessarily changed between planarizing the one or more workpieces 106 and planarizing the chuck 102. For example, the planarization tool 104 may be mounted in at least one of the same position and the same orientation relative to the chuck 102.

In the same machining bit configuration may be understood as using the same machining bit 104b, for example, in the same physical configuration. For example, the (e.g., one and the same) machining bit 104b may be mounted in at least one of the same position and the same orientation relative to the chuck 102. Alternatively or additionally, the machining bit 104b may be mounted in at least one of the same position and the same orientation in the bit socket 104h.

For example, planarizing the chuck 102 (e.g. its workpiece-support 102s) may use the same (e.g. at least one of mechanical and thermal) conditions, as planarizing the one or more workpieces 106 (in other words, the workpiece or each workpiece 106). For example, planarizing the chuck 102 (e.g. its workpiece-support 102s) and planarizing the one or more workpieces 106 may use the same of at least one of the following parameters: speed of rotation 101r of the planarization tool 104 (e.g. its machining bit 104b), speed of second displacement 103d, speed of revolving the machining bit 104b and contact pressure between chuck 102 and planarization tool 104 (e.g. its machining bit 104b). Alternatively, at least one of the above mentioned parameters may be different between planarizing the one or more workpieces 106 and the chuck 102. For example, planarizing the chuck 102 (e.g. its workpiece-support 102s) and planarizing the one or more workpieces 106 may differ in at least one of the following parameters (e.g., by less than about 90%, e.g., by less than about 75%, e.g., by less than about 50%, e.g., by less than about 25%): speed of rotation 101r of the planarization tool 104 (e.g. its machining bit 104b), speed of second displacement 103d (also referred to as displacement speed), speed of revolving the machining bit 104b and contact pressure between chuck 102 and planarization tool 104 (e.g. its machining bit 104b).

According to various embodiments, the speed of second displacement 103d for planarizing the chuck 102 (e.g. its workpiece-support 102s) and planarizing the one or more workpieces 106 may be more than about 0.1 mm/s, e.g., more than about 0.2 mm/s, e.g., more than about 0.3 mm/s, e.g., more than about 0.4 mm/s, e.g., more than about 0.5 mm/s, e.g., more than about 0.75 mm/s, e.g., more than or equal to about 1 mm/s (e.g., in the range from about 1 mm/s to about 2 mm/s), e.g., more than or equal to about 2 mm/s, e.g., more than or equal to about 5 mm/s.

According to various embodiments, the speed at least one of the rotation 101r of the planarization tool 104 and revolving the machining bit 104b for planarizing the chuck 102 (e.g. its workpiece-support 102s) and planarizing the one or more workpieces 106 may be more than about 500 rounds per minute (also referred to as revolutions per minute or rotations per minute), e.g. more than about 1000 rounds per minute, e.g. more than about or equal to 1500 rounds per minute, e.g. more than about 2000 rounds per minute, e.g. more than about or equal to 2200 rounds per minute.

According to various embodiments, the mechanical hardness of the portion 102p of the chuck 102 (planarized or to be planarized) may be less than (e.g. about 75%, about 50%, about 25%, about 10%, about 5% or about 2% of) at least one of: five times (500% of) the mechanical hardness of the portion 106f (planarized or to be planarized) of the one or more workpieces 106 (e.g. the sacrificial layer 106f) and a mechanical hardness of at least one of a nickel-based alloy, e.g. a nickel-phosphorus alloy, and an iron-based alloy, e.g. steel.

By way of example, the chuck 102 may include or be formed from a polymer.

According to various embodiments, the workpiece planarization arrangement 1300 may include a sensor configured for sensing a total thickness variation of the planarized workpiece 106. A self-planarization may be started if the total thickness variation fulfills a predetermined criterion (e.g. exceeds a predetermined value), e.g. automatically. Therefore, the workpiece planarization arrangement 1300 may include a controller configured for comparing the total thickness variation with the predetermined criterion and configured to start the self-planarization if the total thickness variation fulfills the predetermined criterion. Alternatively or additionally, the workpiece planarization arrangement 1300 may include a switch configured to start the self-planarization if the switch is pressed.

During the self-planarization, the workpiece planarization arrangement 1300 may be in a workpiece planarization configuration in which the planarization tool 104 is configured to planarize one or more workpieces 106 on the chuck 102. In other words, the at least one portion 102p of the chuck 102 may be planarized by the planarization tool in the workpiece planarization configuration.

In an alternative embodiment, alternatively or additionally to the rotatable machining bit 104*b*, the chuck 102 may be rotatable around a rotation axis.

In one or more embodiment, the chuck 102 may be made from a polymer.

Figure 14:
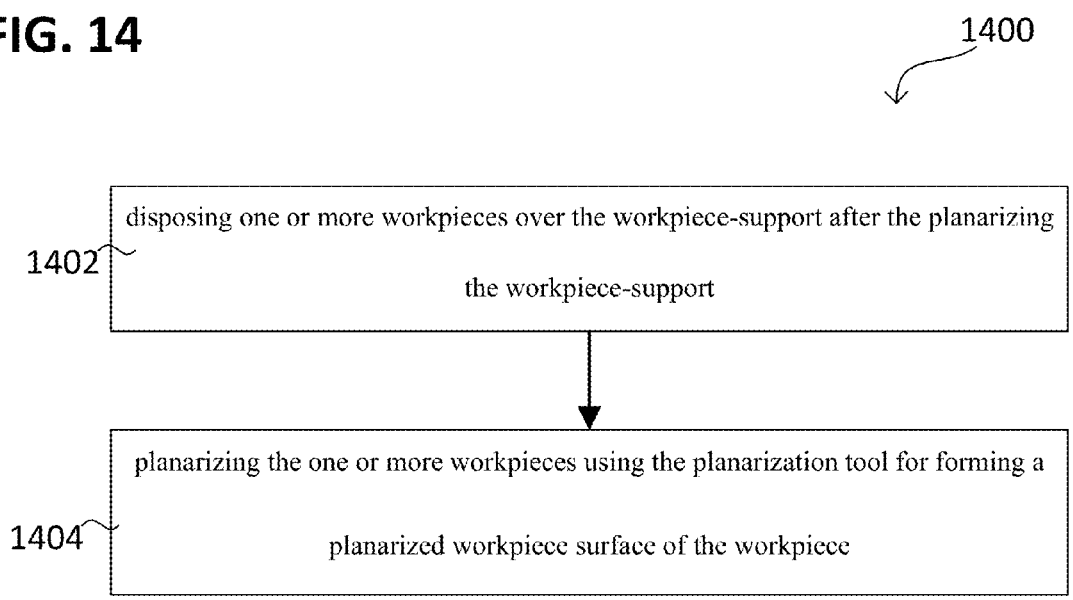
FIG. 14 to FIG. 16 respectively show a method in a schematic flow diagram according to various embodiments.

FIG. 14 illustrates a method 1400 for planarizing one or more workpieces according to various embodiments in a schematic flow diagram. The workpiece planarization arrangement may include a chuck and a planarization tool, e.g. configured as described herein.

According to various embodiments, the method may include in 1402: planarizing (at least one portion of) a workpiece-support using a planarization tool.

The method may further include in 1404: disposing one or more workpieces over the workpiece-support after the planarizing the workpiece-support.

The method may further include in 1406: planarizing (e.g. at least one portion of) the one or more workpieces using the planarization tool.

According to various embodiments, a hardness of the workpiece-support (e.g. the at least one portion thereof, e.g. planarized or to be planarized) may be configured such that the planarizing the workpiece-support (the at least one portion thereof) and the planarizing one or more workpieces (e.g. the at least one portion thereof, e.g. planarized or to be planarized) use the planarization tool in at least one of the same physical configuration (e.g. without modification or reconfiguration) and the same machining bit (e.g. in the same configuration, in other words, without modification or reconfiguration). This may enable to adjust the both planarization to each other.

Alternatively or additionally, a hardness of the workpiece-support (e.g. the at least one portion thereof, e.g. planarized or to be planarized) may be configured such that the planarizing the workpiece-support (e.g. the at least one portion thereof, e.g. planarized or to be planarized) and the planarizing the one or more workpieces (e.g. the at least one portion thereof) use at least one of the same physical configuration between workpiece-support and planarization tool (e.g. for adjusting the planarized support surface and the planarized workpiece surface to each other) and the same machining bit.

Figure 15:
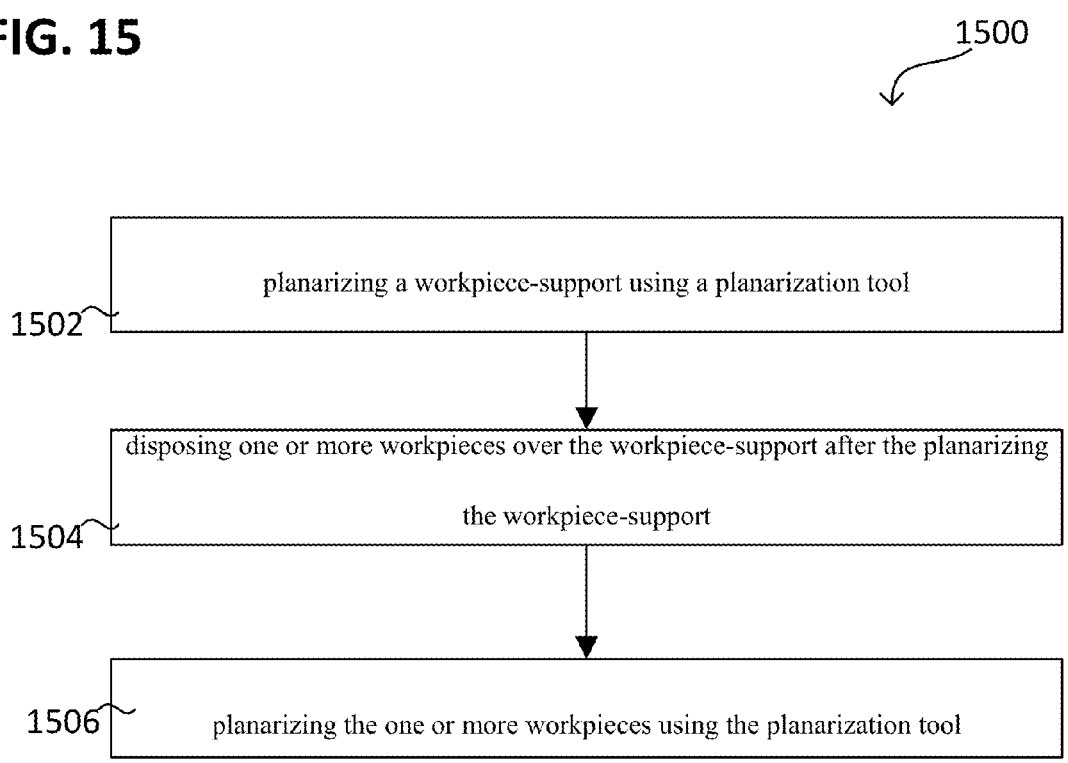

FIG. 15 illustrates a method 1500 for planarizing one or more workpieces according to various embodiments in a schematic flow diagram. The workpiece planarization arrangement may include a chuck and a planarization tool, e.g. configured as described herein.

The method may include in 1502: planarizing a workpiece-support using a planarization tool.

The method may further include in 1504: disposing one or more workpieces over the workpiece-support after the planarizing the workpiece-support.

The method may further include in 1506: planarizing one or more workpieces using the planarization tool for forming a planarized workpiece surface of the one or more workpieces.

According to various embodiments, a hardness of the workpiece-support (e.g. the at least one portion thereof, e.g. planarized or to be planarized) may be configured such that the planarizing the workpiece-support (e.g. the at least one portion thereof) and the planarizing the one or more workpieces (e.g. the at least one portion thereof, e.g. planarized or to be planarized) use the same physical configuration of at least one of the planarization tool and the machining bit (e.g., the same machining bit).

Alternatively or additionally, a hardness of the workpiece-support (e.g. the at least one portion thereof, e.g. planarized or to be planarized) may be configured such that the planarizing the workpiece-support (e.g. the at least one portion thereof) and the planarizing the one or more workpieces (e.g. the at least one portion thereof, e.g. planarized or to be planarized) use the same physical configuration at least one of between workpiece-support and planarization tool and the machining bit (e.g., for adjusting planarized support surface and the planarized workpiece surface to each other).

Figure 16:
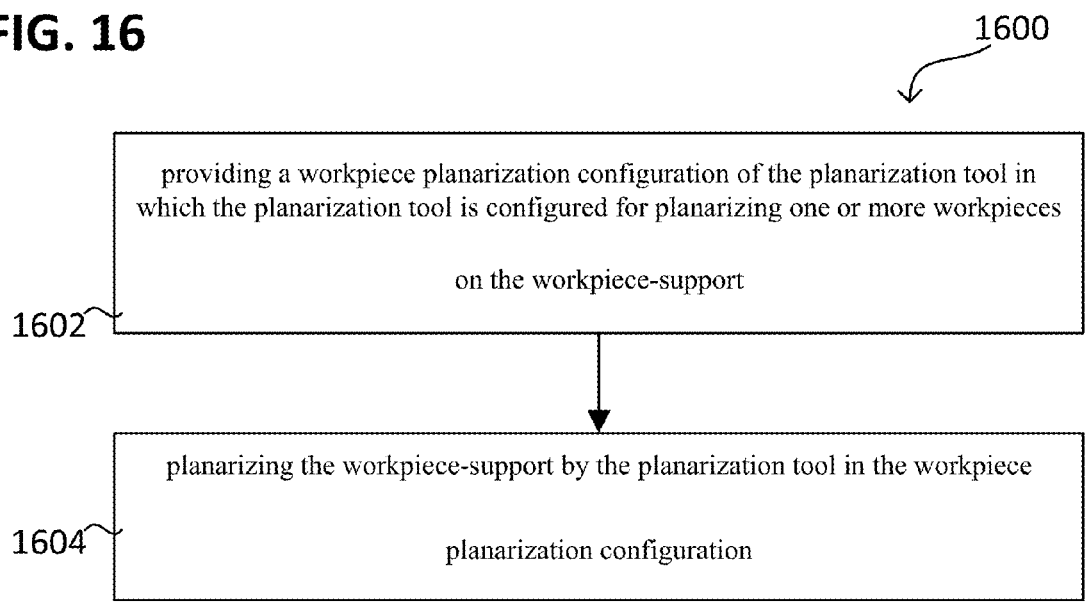

FIG. 16 illustrates a method 1600 for adjusting a workpiece planarization arrangement according to various embodiments in a schematic flow diagram. The workpiece planarization arrangement may include a chuck and a planarization tool, e.g. configured as described herein.

The chuck may include or be formed from a support carrier and a workpiece-support being replaceably mounted to the support carrier. A mechanical hardness of the workpiece-support (e.g. the at least one portion thereof, e.g. planarized or to be planarized) is less than (e.g. about 75%, about 50%, about 25%, about 10%, about 5% or about 2% of) a mechanical hardness of the support carrier.

The method may include in 1602: providing a workpiece planarization configuration of the planarization tool (e.g., its machining bit) in which the planarization tool is configured to planarize one or more workpieces on the workpiece-support.

The method may further include in 1604: planarizing the workpiece-support (e.g. the at least one portion thereof) by the planarization tool in the workpiece planarization configuration.

Figure 17A:
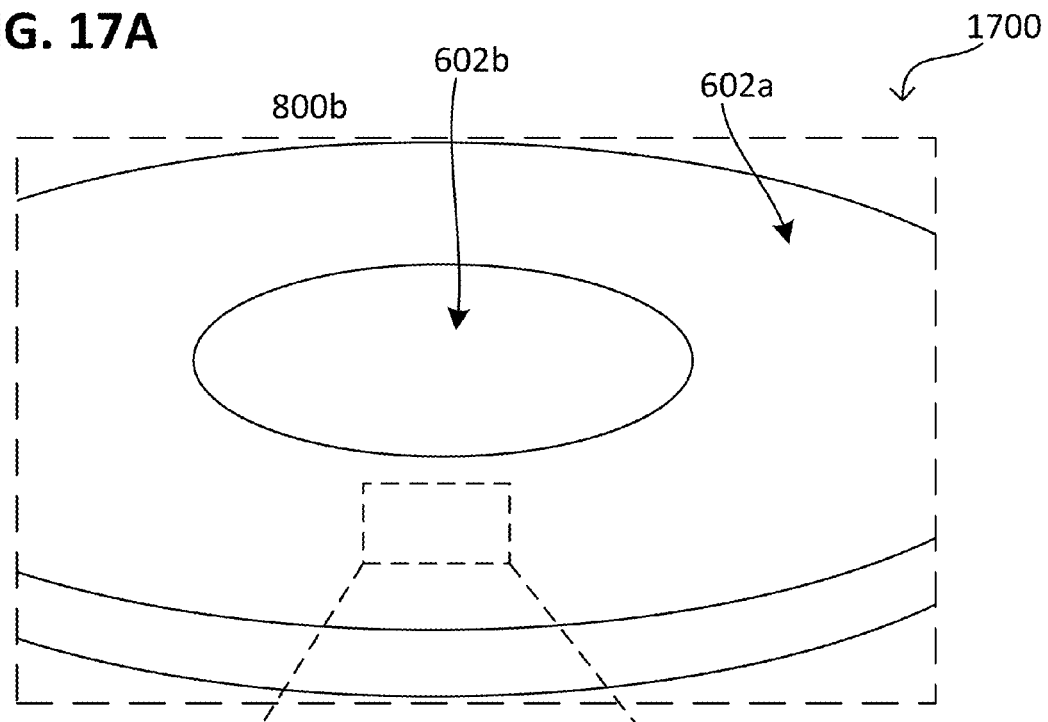
FIG. 17A and FIG. 17B respectively show a chuck or a workpiece-support in a schematic perspective view according to various embodiments.
Figure 17B:
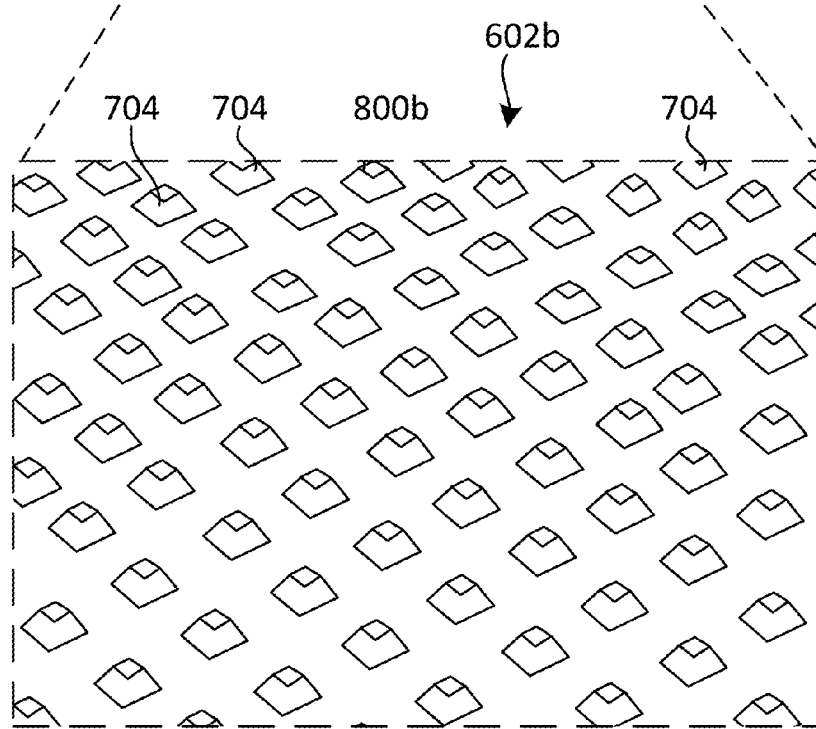

FIG. 17A illustrates a replaceable workpiece-support 1700 (e.g. for a chuck) or a non-replaceable workpiece-support 1700 of a chuck according to various embodiments in a perspective view and FIG. 17B the workpiece-support 1700 in a detailed view.

The workpiece-support 1700 may include a plurality of support protrusions 704 disposed in the recess of each adhesion region of the plurality of adhesion regions 602*a*, 602*b*.

According to various embodiments, compared to a conventional chuck, a polymer workpiece-support 1700 may be provided. The workpiece-support 1700 may be structured on the second side 800*b* such that at least two adhesion regions 602*a*, 602*b* (also referred to as vacuum zones) are provided. By way of example, the smaller adhesion regions 602*b* may have a diameter of about 8 inches and the larger adhesion regions 602*a* may have a diameter of about 12 inches.

The replaceable workpiece-support 1700 and the non-replaceable workpiece-support 1700 may enable to planarize the chuck without changing the configuration of the planarization tool 104 (at least one of thermal and mechanical). The replaceable workpiece-support 1700 may be a wearing part, e.g. configured to be produced at low costs and be exchanged (e.g. if depleted or irreversible contaminated).

According to various embodiments, a total thickness variation may be monitored (e.g. sensed by sensors). A self-planarization may be started if the total thickness variation fulfills a predetermined criterion (e.g. exceeds a predetermined value).

FIG. 18 illustrates a chuck 1800 having a non-replaceable workpiece-support 102*s* according to various embodiments in a schematically cross sectional view or side view. The non-replaceable workpiece-support 102*s* may be configured similar to the replaceable workpiece-support described herein.

According to various embodiments, the chuck 1800 (e.g. at least one portion 102*p* of the chuck 1800) may include or be formed from a sacrificial material. The sacrificial material may be configured to provide a mechanical hardness of the at least one portion 102p of the chuck 1800 configured as the following.

The mechanical hardness of the at least one portion 102p of the chuck 1800 (planarized or to be planarized), e.g. the complete chuck 1800, may be within a range of about 20% to about 500% of the mechanical hardness of the at least one portion of the one or more workpieces (planarized or to be planarized), e.g. within a range of about 50% to about 200% of the mechanical hardness of the at least one portion of the one or more workpieces.

Alternatively or additionally, the mechanical hardness of the at least one portion 102p of the chuck 1800 (planarized or to be planarized), e.g. the complete chuck 1800, may be less than (e.g. about 75%, about 50%, about 25%, about 10%, about 5% or about 2% of) at least one of a mechanical hardness of at least one of a nickel-based alloy, e.g. e.g. a nickel-phosphorus alloy, and an iron-based alloy, e.g. steel (in other words, of the nickel-based alloy and/or the iron-based alloy).

Figure 19:
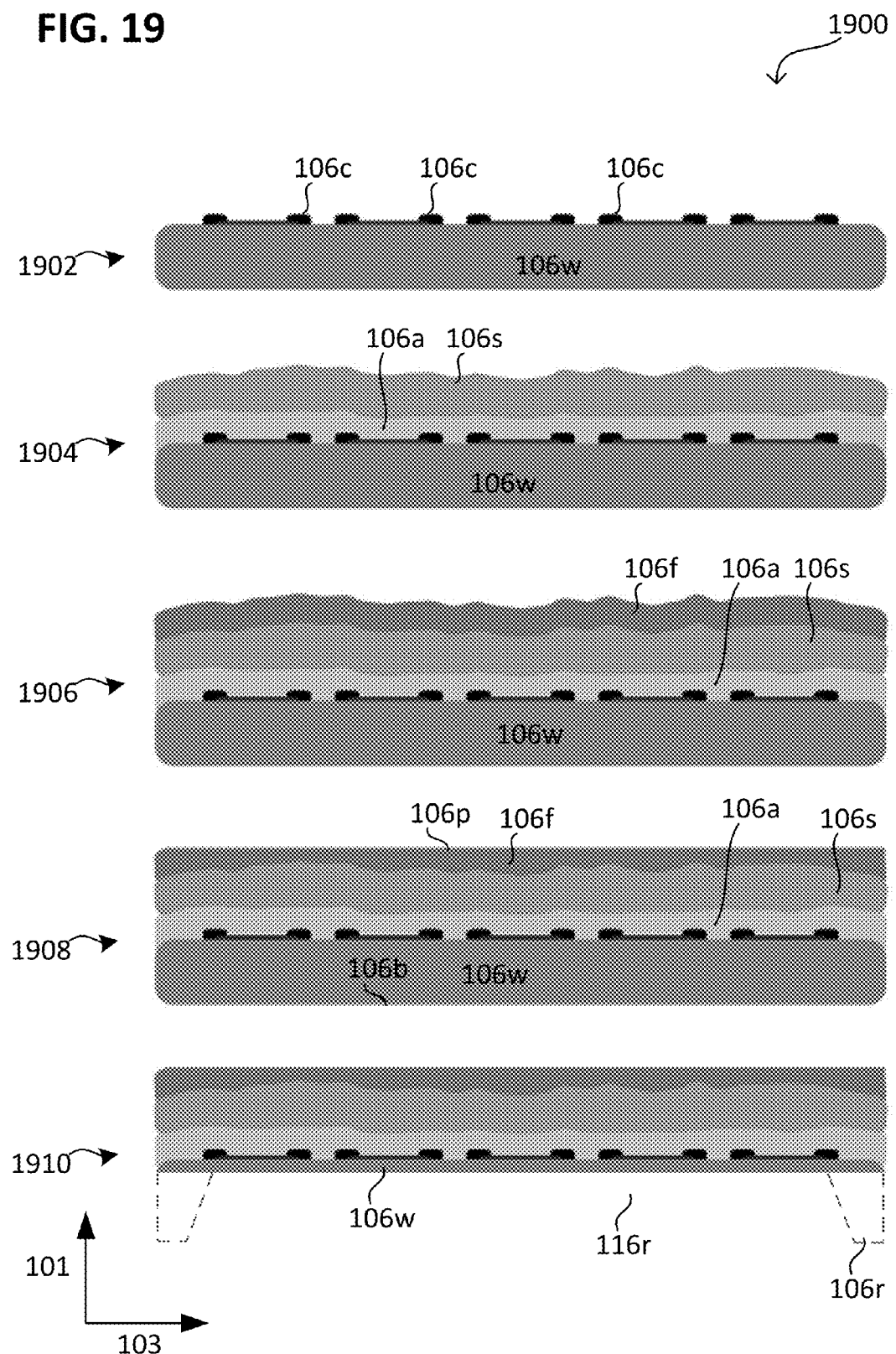
FIG. 19 to FIG. 20 respectively show a method in a schematic cross sectional view or side view according to various embodiments.

FIG. 19 illustrates a method 1900 for thinning a wafer according to various embodiments in a schematic cross sectional view or side view.

According to various embodiments, the method may include in 1902: providing a wafer 106w including a plurality of integrated circuits 106c. The wafer 106w may include or be formed from a semiconductor material, e.g. including or formed from silicon. Each integrated circuit of the plurality of integrated circuits 106c may be electrically contacted be at least two (e.g. two or three) contact pads.

The method may further include in 1904: Coupling the wafer 106w and a stabilization layer 106s, e.g. a glass carrier. Coupling the wafer 106w may include adhering the wafer 106w to the stabilization layer 106s using an adhesive layer 106a.

The method may further include in 1906: Disposing a sacrificial layer 106f (e.g. a self-adhesive tape) over the stabilization layer 106s. The sacrificial layer 106f may include or be formed from a sacrificial material (e.g. a polymer). The sacrificial material may be configured such that the sacrificial layer 106f has a first mechanical hardness. The first mechanical hardness may be less than (e.g. about 75%, about 50%, about 25%, about 10%, about 5% or about 2% of) a mechanical hardness of at least one of a nickel-based alloy (e.g. fabricated by electroless nickel plating), e.g. a nickel-phosphorus alloy, and an iron-based alloy, e.g. steel.

The method may further include in 1908: Planarizing the sacrificial layer 106f, e.g. by subtractive manufacturing (e.g. including at least one of cutting and machining). By planarizing the sacrificial layer 106f, a planarized surface 106p may be formed. The planarized surface 106p may be plane-parallel to a rear-surface 106b of the wafer opposite the sacrificial layer 106f.

According to various embodiments, planarization package 106f, 106s, 106a, 106w (including at least one of the sacrificial layer 106f, the stabilizing layer 106s, the adhesion layer 106a and the wafer 106w) may be one or more workpieces 106.

The method may further include in 1910: Thinning the wafer 106w. Thinning the wafer 106w may include removing material of the wafer 106w (from the rear-surface 106b), e.g. by subtractive manufacturing (e.g. including grinding). For example, thinning the wafer 106w may include or be formed from forming a recess into the wafer. Optionally, the thinning the wafer 106w may include forming at least one of a recess 116r and a protruding rim 106r (sometimes also referred to as taiko ring).

After thinning the wafer 106w, a thickness variation of the wafer 106w between two integrated circuit of the plurality of integrated circuits 106c (e.g. disposed maximal distant from each other, e.g. diametric) may be less than about 1 µm, e.g. less than about 0.5 µm, less than about 0.2 µm.

In various embodiments, the thinning the wafer 106w may include thinning at least one portion of the wafer 106w (in other words, thinning the wafer 106w partially or completely).

Figure 20:
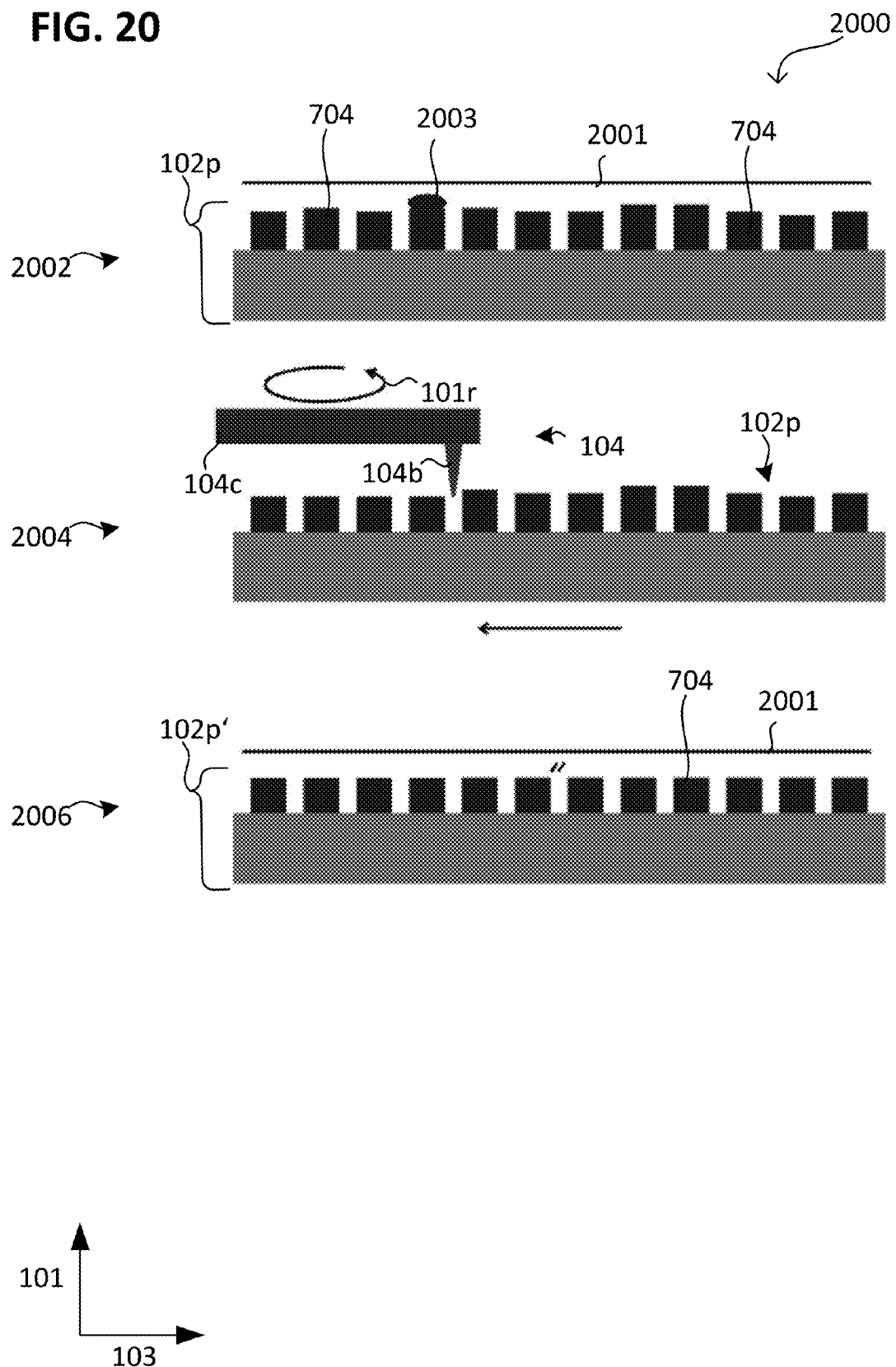

FIG. 20 illustrates a method 2000 for planarizing a chuck (e.g. its workpiece-support 102s) according to various embodiments in a schematic cross sectional view or side view.

According to various embodiments, the method may include in 2002: provide at least one portion 102p of a chuck 102 (e.g. of its workpiece-support 102s) to be planarized. The at least one portion 102p to be planarized may deviate from a predefined plane 2001, e.g. by at least about 0.1 µm, e.g. by at least about 0.2 µm, e.g. by at least about 0.5 µm, e.g. by at least about 1 µm, e.g. by at least about 2 µm, e.g. by at least about 3 µm, e.g. by at least about 4 µm, e.g. by at least about 5 µm, e.g. by at least about 6 µm, e.g. by at least about 7 µm, e.g. by at least about 8 µm, e.g. by at least about 9 µm, e.g. by at least about 10 µm. For example, the at least one portion 102p may be contaminated by a particle 2003. Alternatively or additionally, the at least one portion 102p may include or be formed from an uneven surface (e.g. provided by the support protrusions 704).

The plane 2001 may be predefined by the planarizing tool 104. In one or more embodiments, the predefined plane 2001 may deviate from a mathematical planar plane (e.g., due to physical tolerances). The predefined plane 2001 may be plane-parallel (or at least substantially plane-parallel) to or may be the planarizing plane defined by the planarization tool 104. For example, the predefined plane 2001 may be perpendicular to the rotation axis 101a (see FIG. 2). Alternatively or additionally, the predefined plane 2001 may be parallel (or at least substantially parallel) to at least one of the second displacement 103d (see FIG. 2). In various embodiments, the predefined plane 2001 may be parallel (or at least substantially parallel) to direction 103 and direction 105 (see FIG. 2).

The method may further include in 2004: Planarizing the at least one portion 102p, e.g. by a planarization tool 104. Planarizing the at least one portion 102p may include a subtractive manufacturing of the at least one portion 102p, e.g. using a machining bit 104b. The machining bit 104b may be move over the at least one portion 102p, e.g. by a rotation 101r of the bit carrier 104c.

The method may further include in 2006: Forming at least one planarized portion 102p' by the planarizing 2004 the at least one portion 102p. The at least one planarized portion 102p' may be substantially plane-parallel to the predefined plane 2001, e.g., the at least one planarized portion 102p' may deviate from the predefined plane 2001 by less than the at least one portion 102p (before the planarizing 2004), e.g. by less than or equal to about 2 µm. e.g. by less than about 1 µm, e.g. less than about 0.5 µm, less than about 0.2 µm. The deviation may be understood as measured over a lateral extension of the predefined plane 2001, e.g. over more or equal to about 100 mm, e.g. over more or equal to about 200 mm, e.g. over more or equal to about 300 mm.

By way of example, the deviation of the at least one planarized portion 102p' from the predefined plane 2001 may be less than about 2 μm (e.g. over more or equal to about 300 mm).

After thinning the wafer 106w, the sacrificial layer 106f may be removed and optional at least one of the stabilization layer 106s and the adhesive layer 106a may be removed, if present. The integrated circuits 106c may be processed further (e.g. with the third layer 106a on top), e.g. singulated.

Figure 21A:
FIG. 21A and FIG. 21B respectively show a workpiece-support in a schematic perspective view according to various embodiments.
Figure 21B:
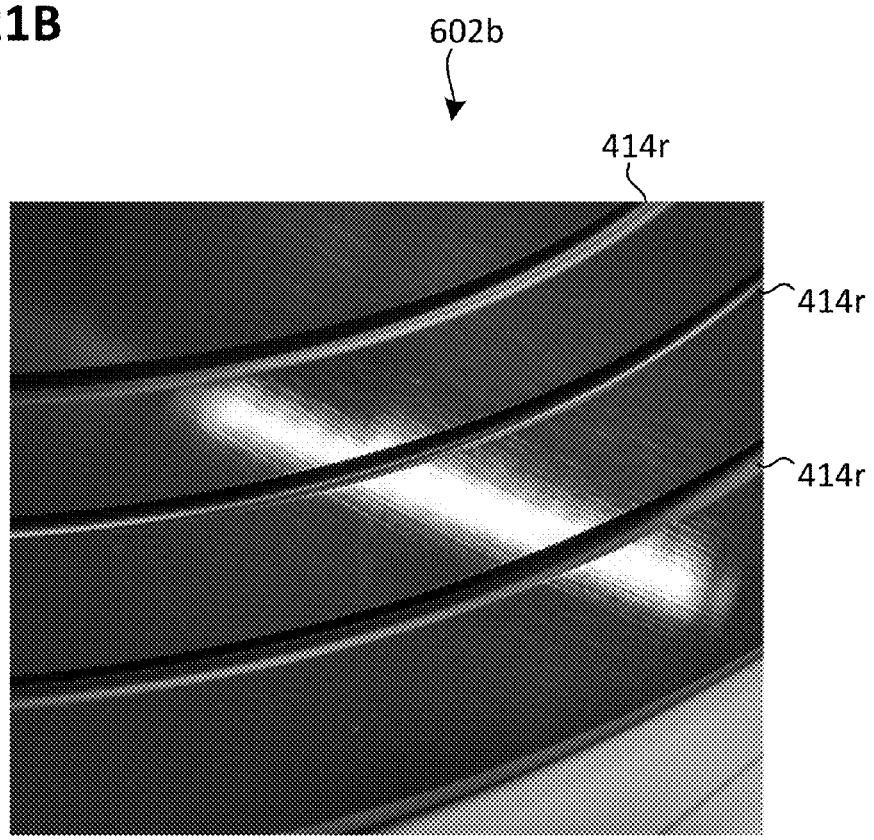

FIG. 21A illustrates a workpiece-support 2100 according to various embodiments in a perspective view and FIG. 21B the workpiece-support 2100 in a detailed view.

The workpiece-support 2100 may include or be formed from a synthetic polymer, e.g. at least one of a thermoplastic and an elastomer.

The workpiece-support 2100 may include or be formed from more than two adhesion regions 602a, 602b, 602c. Each adhesion region of the more than two adhesion regions 602a, 602b, 602c may include a circular recess 414r (e.g. in form of a groove).

Figure 22A:
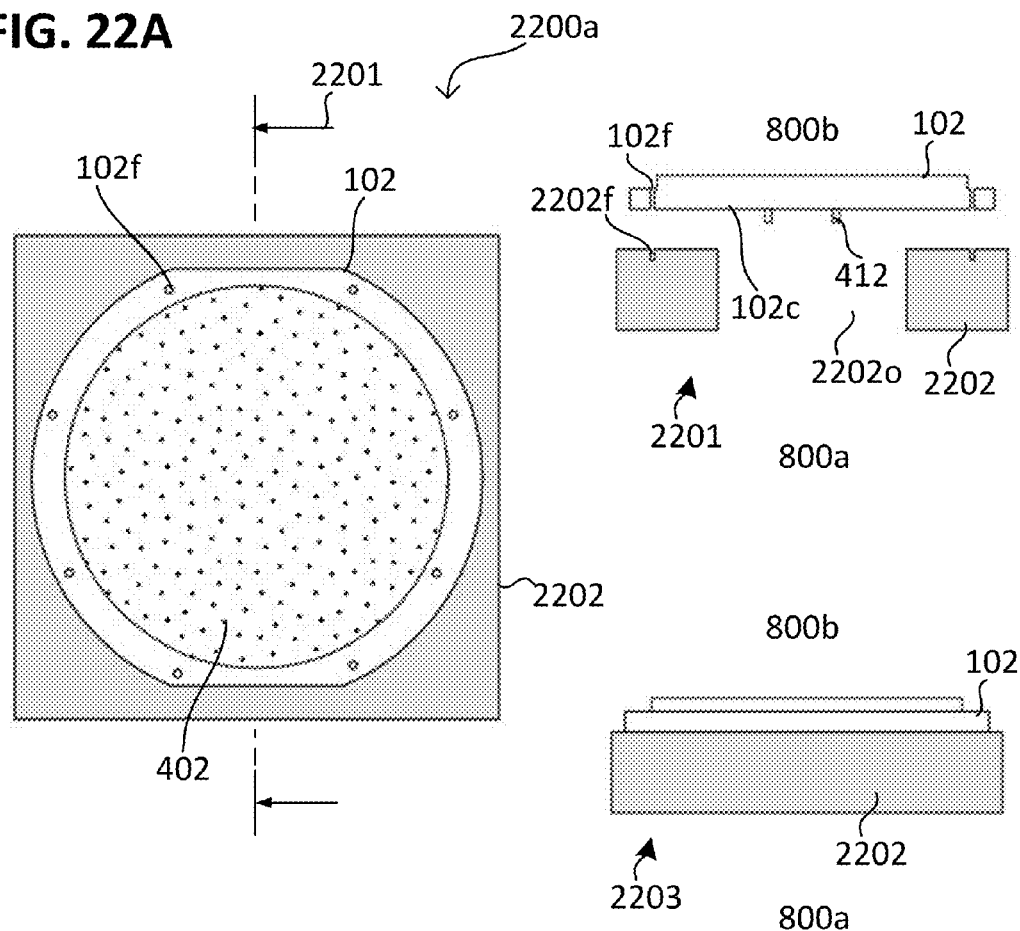
FIG. 22A and FIG. 22B respectively show a workpiece planarization arrangement in various schematic views according to various embodiments.
Figure 22B:
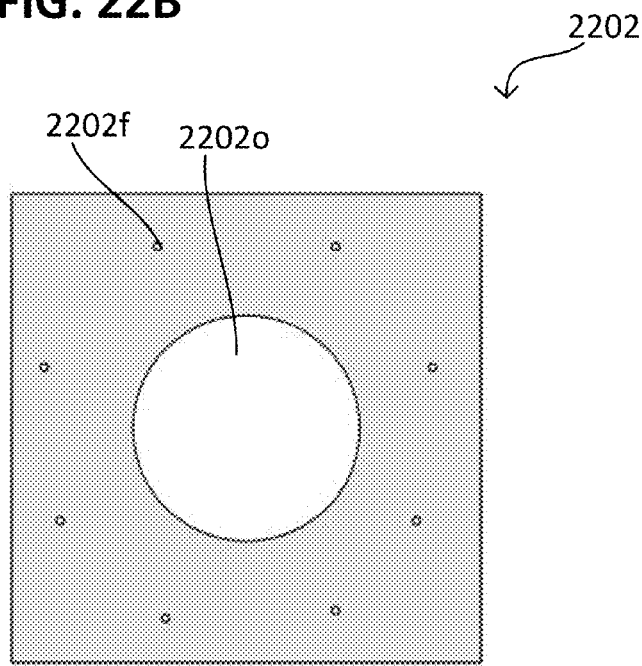

FIG. 22A illustrates a planarization arrangement 2200 according to various embodiments in a top view (e.g., onto the second side 800b) and a corresponding cross sectional view 2101 and side view 2203, wherein FIG. 22B illustrates chuck socket 2202 in the top view without chuck 102.

The planarization arrangement 2200 may include a chuck socket 2202. The chuck socket 2202 may include an opening 2202o. The chuck 102 (e.g., its support carrier 102c) may include one or more vacuum ports 412 (e.g., in a supply terminal). The one or more vacuum ports 412 may be coupled to the at least one vacuum line 402 of the chuck 102. The chuck 102 (e.g., its support carrier 102c) may include a first mounting structure 102f configured to mount the chuck 102 at the chuck socket 2202, e.g., at a corresponding second mounting structure 2202f of the chuck socket 2202. For example, the chuck 102 may be mounted at the chuck socket 2202 by screws.

The opening 2202o of the chuck socket 2202 may expose at least one portion of the first side 800a of the chuck 102 (e.g., its support carrier 102c), e.g., at least the supply terminal 502. For example, the opening 2202o of the chuck socket 2202 may expose the one or more vacuum ports 412 of the chuck 102. The opening 2202o of the chuck socket 2202 may extend through the chuck socket 2202, e.g., from a first side 800a of the chuck socket 2202 to a second side 800b of the chuck socket 2202 opposite the first side 800a.

Figure 23A:
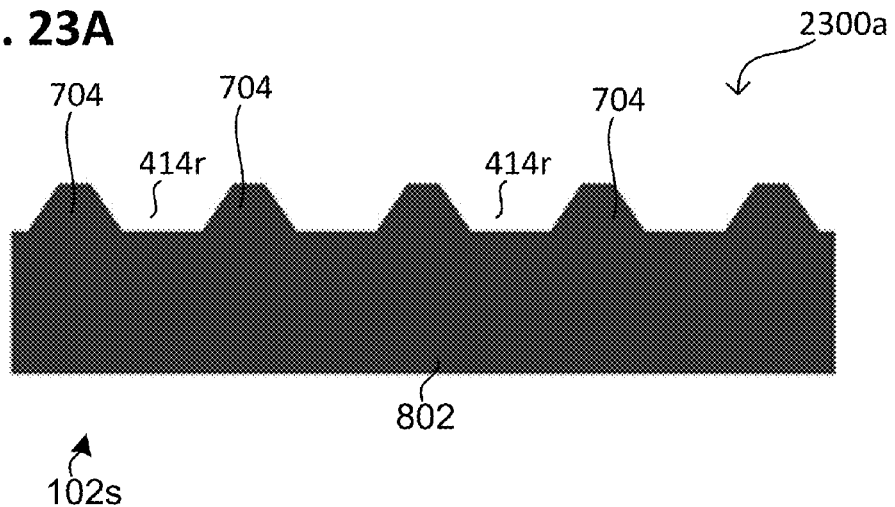
FIG. 23A to FIG. 23C respectively show a workpiece-support in a method according to various embodiments in a schematic cross sectional view or side view.
Figure 23B:
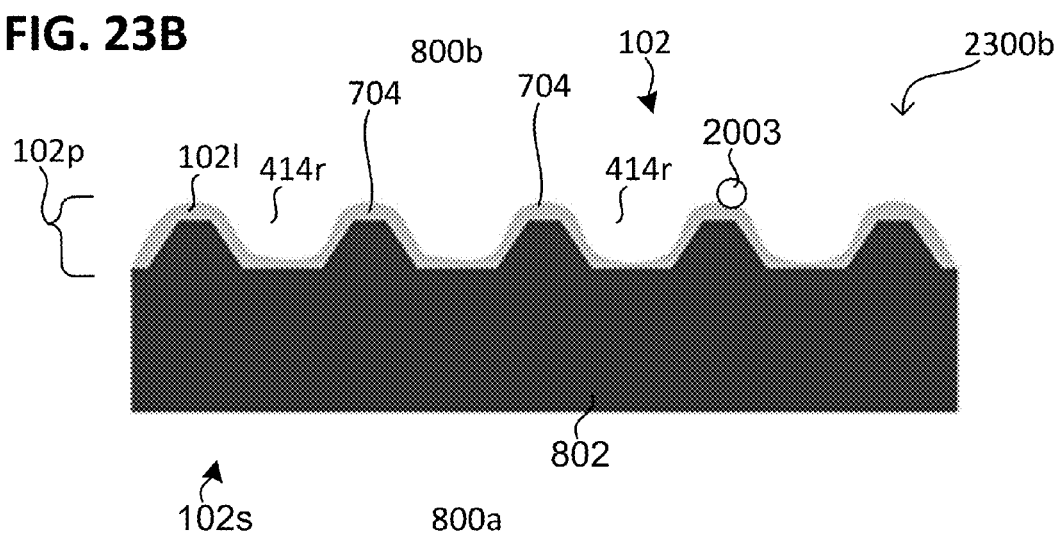
Figure 23C:
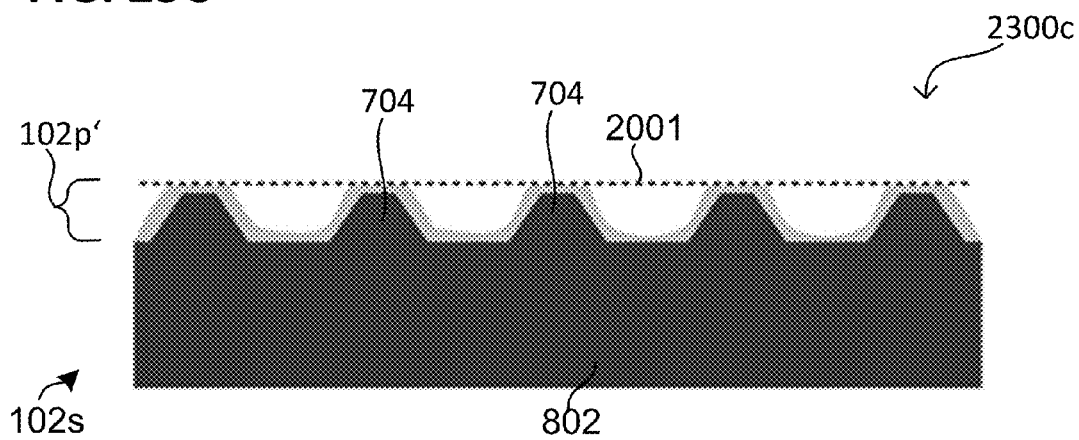

FIG. 23A to FIG. 23C illustrate a workpiece-support 102s in a method for planarizing the workpiece-support 102s according to various embodiments in a schematic cross sectional view or side view.

Method 2300a to 2300b may be applied to the workpiece-support 102s (e.g. its support stabilization region 802) without the support carrier 102c (e.g. being absent), e.g. on the workpiece-support 102s being unmounted (e.g. detached) from the support carrier 102c (e.g. if the workpiece-support 102s is configured for being replaceably mounted to the support carrier 102c). Alternatively, the method 2300a to 2300b may be applied to the whole chuck 102 (e.g. if the workpiece-support 102s is not configured for being replaceably mounted to the support carrier 102c or if the workpiece-support 102 keeps mounted to the support carrier 102c).

According to various embodiments, the method may include in 2300b: providing at least one portion 102p to be planarized of the workpiece-support 102s. For example, the workpiece-support 102s may be provided unmounted from the support carrier 102c or mounted to the support carrier 102c, e.g. as part of the chuck 102 to be planarized. The at least one portion 102p to be planarized may, for example, deviate from a predefined plane 2001, e.g. by at least about 0.1 μm, e.g. by at least about 0.2 μm, e.g. by at least about 0.5 μm, e.g. by at least about 1 μm, e.g. by at least about 2 μm, e.g. by at least about 3 μm, e.g. by at least about 4 μm, e.g. by at least about 5 μm, e.g. by at least about 6 μm, e.g. by at least about 7 μm, e.g. by at least about 8 μm, e.g. by at least about 9 μm, e.g. by at least about 10 μm. For example, the at least one portion 102p may be contaminated, e.g. by a particle 2003. Alternatively or additionally, the at least one portion 102p may include or be formed from an uneven surface (e.g. provided by the support protrusions 704).

The plane 2001 may be predefined by the planarizing tool 104, as described before. In one or more embodiments, the predefined plane 2001 may deviate from a mathematical planar plane (e.g., due to physical tolerances). The predefined plane 2001 may be plane-parallel (or at least substantially plane-parallel) to or may be the planarizing plane defined by the planarization tool 104. For example, the predefined plane 2001 may be perpendicular to the rotation axis 101a (see FIG. 2). Alternatively or additionally, the predefined plane 2001 may be parallel (or at least substantially parallel) to at least one of the second displacement 103d (see FIG. 2). In various embodiments, the predefined plane 2001 may be parallel (or at least substantially parallel) to direction 103 and direction 105 (see FIG. 2).

The method may further include in 2300c: Planarizing the at least one portion 102p, e.g. by a planarization tool 104. Planarizing the at least one portion 102p may include a subtractive manufacturing of the at least one portion 102p, e.g. using a machining bit 104b. The machining bit 104b may be move over the at least one portion 102p, e.g. by a rotation 101r of the bit carrier 104c.

The method may further include in 2300c: Forming at least one planarized portion 102p' by the planarizing the at least one portion 102p. The at least one planarized portion 102p' may be substantially plane-parallel to the predefined plane 2001, e.g., the at least one planarized portion 102p' may deviate from the predefined plane 2001 by less than the at least one portion 102p (before the planarizing 2004), e.g. by less than or equal to about 2 μm. e.g. by less than about 1 μm, e.g. less than about 0.5 μm, less than about 0.2 μm. The deviation may be understood as measured over a lateral extension of the predefined plane 2001, e.g. over more or equal to about 100 mm, e.g. over more or equal to about 200 mm, e.g. over more or equal to about 300 mm.

By way of example, the deviation of the at least one planarized portion 102p' from the predefined plane 2001 may be less than about 2 μm (e.g. over more or equal to about 300 mm).

The method may optionally include in 2300a, e.g. before 2300b, providing a workpiece-support 102s (e.g. its support stabilization region 802), e.g. as part of the chuck 102 or unmounted from the support carrier 102c. The workpiece-support 102s, e.g. its support stabilization region 802, may optionally include one or more support protrusions 704 and/or one or more recesses 414r.

According to various embodiments, planarizing the at least one portion 102p may not penetrate through the at least one portion 102p, e.g. may not expose the support stabilization region 802 and/or the one or more support protrusions 704.

The method may optionally include in 2300b forming and/or reinforcing the sacrificial support region 102p, e.g. by adding material (also referred as to sacrificial material) to the sacrificial support region 102p and/or to the workpiece-support 102s, e.g. its support stabilization region 802. For example, reinforcing the sacrificial support region 102p may be applied after planarizing the at least one portion 102p at least one time or if a thickness of the sacrificial support region 102p (extension parallel to the rotation axis 101a, for example, measured at the one or more support protrusions 704) may be less than about 100 µm, e.g. less than about 10 µm, e.g. less than about 1 µm.

In general, the sacrificial material may be dry deposited (e.g. as solid sacrificial material without another viscous material) or wet deposited (e.g. as viscous sacrificial material or together with a viscous, e.g. liquid, material). Depositing the sacrificial material may, for example, include a physical (e.g. vapor, liquid or solid) deposition, dip-coating, sol-gel coating, spin coating, evaporation and/or is free of plating. For example, the sacrificial material may be deposited (e.g. coated) in form of particles on the support stabilization region 802 and/or to form the at least one sacrificial layer 102l, e.g. one or more sacrificial layers 102l. Additionally or alternatively to the particle deposition, the sacrificial material may be deposited in form of a viscous material which is solidified after deposition and/or may be deposited in form of a solid foil.

For example, the sacrificial support region 102p may be reinforced or formed by exposing the workpiece-support 102s, e.g. its support stabilization region 802, to an aerosol (also referred as to aerosol-depositing or aerosol-deposition). For example, the aerosol may be emitted (e.g. sprayed, e.g. spray-coated) towards or on the workpiece-support 102s, e.g. its support stabilization region 802. The aerosol may include or be formed from a colloid of (e.g. solid and/or viscous, e.g. liquid) particles (e.g. having a diameter less than one micrometer) in air or another gas. For example, the particles include or be formed from viscous (e.g. liquid) droplets or a solid powder. For example, exposing the workpiece-support 102s, e.g. its support stabilization region 802, to the aerosol may include aerosol-spraying, atomizing (e.g. by a nozzle), nebulizing, electro-spraying and/or vibration-aerosol-generation.

In general, the particles may be dry deposited (e.g. as solid particles, e.g. as powder, without another viscous material) or wet deposited (e.g. as viscous particles or together with a viscous, e.g. liquid, material). For example, the particles may be aerosol-deposited (e.g. coated) on the support stabilization region 802 and/or form at least one sacrificial layer 102l, e.g. one or more sacrificial layers 102l, of the sacrificial support region 102p and/or on the support stabilization region 802. Additionally or alternatively, the particles may be deposited otherwise, e.g. from a suspension (e.g. gel or paste) and/or using dipping, spreading or spinning, or the like.

Optionally, the particles and/or the at least one sacrificial layer 102l may be adhered to the support stabilization region 802 e.g. by an adhesion material (e.g. a viscous, e.g. liquid, adhesion material), e.g. deposited from the aerosol (e.g. in case of a wet aerosol-deposition) or as part of a respective adhesion layer (e.g. including pre-deposited adhesion material) formed before the exposing to the aerosol (e.g. in case of a dry aerosol-deposition). The adhesion material may be deposited in solid (e.g. in form of particles) or viscous (e.g. liquid) form.

Optionally, the particles and/or the at least one sacrificial layer may be heated, e.g. during or after exposing to the aerosol. Heating the particles (e.g. a powder deposited and/or dry deposited) and/or the at least one sacrificial layer 102l may, for example, include at least partially melting the particles and/or the at least one sacrificial layer 102l, e.g. in case of including a polymer or a metal melting at low temperature, e.g. like lead and indium. Additionally or alternatively, a viscous material (e.g. the adhesion material and/or viscous particles) may be solidified by or after heating. For example, the adhesion material may form (by heating) a matrix (e.g. a polymer matrix) in which the particles are embedded and/or may form a porous layer including the particles.

Additionally or alternatively to melting, the particles (e.g. a powder deposited and/or dry deposited) and/or the at least one sacrificial layer 102l may be sintered (by heating), e.g. in case of including a metal melting at high temperature, e.g. like silver, aluminum, copper and gold. After sintering and/or melting (in case of particles also referred as to densifying), pores may remain in the at least one sacrificial layer 102l indicating the fabrication process (e.g. the heating and/or densifying). For example, a porosity of the at least one sacrificial layer 102l may be greater than a porosity (if present) of the support stabilization region 802.

Additionally or alternatively to the aerosol-depositing, the particles and/or the at least one sacrificial layer 102l may be molded at least partially. Additionally or alternatively to the aerosol-depositing, the at least one sacrificial layer 102l may be formed from at least one foil, e.g. by laminating the at least one foil to the workpiece-support 102s (e.g. its support stabilization region 802). Additionally or alternatively to the aerosol-depositing, the at least one sacrificial layer 102l may be formed by pressing the foil (e.g. including or formed from a polymer) and/or the particles on the workpiece-support 102s (e.g. its support stabilization region 802) and optionally sintering or melting the particles.

The workpiece-support 102s (e.g. its support stabilization region 802) may, for example, include or be formed from a material having a low thermal expansion coefficient, e.g. invar, super-invar, a ceramic and/or glass (e.g. a glass-ceramic, also referred as to ceran). For example, the thermal expansion coefficient of the workpiece-support 102s (e.g. its support stabilization region 802) may be less than about $20 \cdot 10^{-6}$ K$^{-1}$, e.g. less than about $10 \cdot 10^{-6}$ K$^{-1}$, e.g. less than about $5 \cdot 10^{-6}$ K$^{-1}$, e.g. less than about $2 \cdot 10^{-6}$ K$^{-1}$.

According to various embodiments, the particles and/or the at least one sacrificial layer 102l may include or be formed from a polymer (e.g., organic or inorganic), e.g. at least one of synthetic rubber, a resin (e.g. epoxy, phenol formaldehyde resin or Bakelite), neoprene, nylon, polyvinyl chloride (PVC or vinyl), polystyrene, polyethylene (e.g. polyethylene terephthalate, also referred to as PET), polypropylene, polyacrylonitrile, PVB, silicone, or the like. Alternatively or additionally, the particles and/or the at least one sacrificial layer 102l may include or be formed from a metallic material, e.g. having a Mohs Hardness of less than about 4, e.g. of less than about 3, e.g. of less than about 2.5, e.g. of less than about 2, e.g. of less than about 1.5, e.g. of less than about 1. For example, the metallic material of the particles and/or the at least one sacrificial layer 102l may include at least one of the following metals: lead, indium, silver, aluminum, copper and gold.

According to various embodiments, the particles and/or the at least one sacrificial layer 102l may be disposed (e.g. coated) on the (e.g. all) protrusions 704 and/or in the (e.g. all) recesses 414r of the workpiece-support 102s, e.g. forming a closed coating. For example, the particles and/or the at least one sacrificial layer 102l may cover more than about 50% of the second side 800*b* and/or of the support stabilization region 802, e.g. more than about 75%, e.g. more than about 90%.

The method may optionally include in 2300*a*, e.g. as part of the providing the workpiece-support 102*s*, removing the at least one planarized portion 102*p*' or cleaning the support stabilization region 802, e.g. prior to 2300*b*. For example, the method may optionally include in 2300*a* removing the at least one sacrificial layer 102*l* (e.g. after planarizing). The removing or cleaning may include etching (e.g. wet etching) and/or heating the workpiece-support 102*s*. Heating the workpiece-support 102*s* may include, for example, ashing or vaporizing the at least one sacrificial layer 102*l* (also referred as sacrificial coating 102*l* ).

Further, various embodiments will be described in the following.

According to various embodiments, a workpiece planarization arrangement, may include: a chuck including: a support carrier (e.g., including a supply terminal for workpiece adhesion supply); and a workpiece-support replaceably mounted on the support carrier; and a planarization tool configured to planarize the at least one portion of the workpiece-support and to planarize one or more workpieces on the at least one portion of the workpiece-support, e.g. on the chuck (illustratively, for adjusting the chuck by self-planarization).

According to various embodiments, a mechanical hardness of the at least one portion of the workpiece-support may be less than a mechanical hardness of the support carrier.

According to various embodiments, a workpiece planarization arrangement, may include: a chuck including: a support carrier (e.g., including a supply terminal for workpiece adhesion supply); and a workpiece-support replaceably mounted on the support carrier; wherein a mechanical hardness of the at least one portion of the workpiece-support is less than a mechanical hardness of the support carrier; and a planarization tool configured to planarize the at least one portion of the workpiece-support and to planarize one or more workpieces on the at least one portion of the workpiece-support, e.g. on the chuck (illustratively, for adjusting the chuck by self-planarization).

According to various embodiments, a workpiece planarization arrangement may include: a chuck; and a planarization tool configured to planarize the chuck and to planarize one or more workpieces on the chuck (illustratively, for adjusting the chuck by self-planarization); wherein a mechanical hardness of at least one portion of the chuck to be planarized is less than at least one of: five times a mechanical hardness of at least one portion to be planarized of the one or more workpieces; and a mechanical hardness at least one of a nickel-based alloy and an iron-based alloy.

According to various embodiments, the planarization tool may be configured to planarize one or more workpieces when they are disposed on the chuck (illustratively, placed on the chuck).

According to various embodiments, a chuck may include: a support carrier (e.g., including a supply terminal for workpiece adhesion supply); and a workpiece-support replaceably mounted on the support carrier; wherein a mechanical hardness of the at least one portion of the workpiece-support is less than a mechanical hardness of the support carrier.

According to various embodiments, a chuck may include: a first side configured to be mounted to a chuck holder (e.g., to a chuck socket); a support carrier (e.g., including a supply terminal for workpiece adhesion supply) proximate to the first side;
a second side opposite the first side, wherein the second side is configured to support (e.g. face) one or more workpieces; and a workpiece-support proximate to the second side (e.g. distant from the support carrier) and replaceably mounted on the support carrier.

According to various embodiments, a mechanical hardness of the at least one portion of the workpiece-support may be less than a mechanical hardness of the support carrier.

According to various embodiments, a replaceable workpiece-support (e.g. for a chuck) may include: a first side configured to be replaceably mounted to a support carrier (e.g., including a supply terminal for workpiece adhesion supply) of the chuck; a second side opposite the first side, wherein the second side is configured to support (e.g. face) one or more workpieces; and at least one through hole extending from the first side to the second side such that one or more workpieces received over the second side is adhered by suction when a vacuum is created in the at least one through hole; and
wherein a mechanical hardness of at least one portion the workpiece-support proximate to the second side (e.g. distant from the support carrier) is less than a mechanical hardness of at least one of a nickel-based alloy and an iron-based alloy (illustratively, for adjusting the chuck by planarizing the sacrificial support region).

According to various embodiments, a replaceable workpiece-support (e.g. for a chuck) may include: a first side configured to be replaceably mounted to a support carrier (e.g., including a supply terminal for workpiece adhesion supply) of the chuck; a second side opposite the first side, wherein the second side is configured to support (e.g. face) one or more workpieces; and at least one through hole extending from the first side to the second side such that one or more workpieces received over the second side is adhered by suction when a vacuum is created in the at least one through hole; and wherein at least one portion the workpiece-support proximate to the second side (e.g. distant from the support carrier) includes a polymer.

According to various embodiments, the mechanical hardness may be in accordance with the same measurement method.

According to various embodiments, the planarization tool may include a bit carrier rotatable about a rotation axis; wherein the workpiece planarization arrangement is configured to move at least one of the bit carrier and the chuck along a direction perpendicular to the rotation axis.

According to various embodiments, the planarization tool may include: a rotatable bit carrier; and a machining bit mounted on the bit carrier; wherein the rotatable bit carrier and the chuck are configured for a two-axis displacement to each other.

According to various embodiments, a mechanical hardness of the machining bit may be greater than the mechanical hardness of at least one of the support carrier and the workpiece-support.

According to various embodiments, the machining bit may include or be formed from carbon.

According to various embodiments, the machining bit may include or be formed from at least one of a carbide and a nitride.

According to various embodiments, a mechanical hardness of the machining bit is more than (in other words, greater than) a mechanical hardness of at least one of the chuck and the one or more workpieces. Illustratively, the machining bit may include or be formed from a material, which is sufficiently hard to planarize the one or more workpieces and the chuck.

According to various embodiments, the machining bit may include or be formed from carbon in at least one of a carbide (e.g., a metal carbide like tungsten carbide), a diamond configuration and a diamond-like carbon configuration.

According to various embodiments, the machining bit may include or be formed from a ceramic.

According to various embodiments, the planarization tool may be configured to planarize at least one of the workpiece-support and the one or more workpieces by subtractive manufacturing (including at least one of cutting and machining).

According to various embodiments, the support carrier may include at least one vacuum line for connecting to a vacuum creating system; wherein the workpiece-support may include at least one through hole connected to the at least one vacuum line (such that one or more workpieces on the workpiece-support is adhered by suction when a vacuum is created via the at least one vacuum line).

According to various embodiments, the workpiece-support may include a recess connected to the at least one through hole.

According to various embodiments, the support carrier may include a plurality of vacuum lines; wherein the workpiece-support may include a plurality of adhesion regions separated from each other, wherein each adhesion region of the plurality of adhesion regions may include at least one through hole; wherein the at least one through hole of each adhesion region of the plurality of adhesion regions is connected to at least one vacuum line of the plurality of vacuum lines (such that adhering one or more workpieces is controllable by selectively providing vacuum to the adhesion region via the at least one vacuum line).

According to various embodiments, the at least one adhesion region of the plurality of adhesion regions may include a recess connected to the at least one through hole of the adhesion region of the plurality of adhesion regions.

According to various embodiments, the at least one portion may be distant from the support carrier; wherein the workpiece-support may include at least one further portion (e.g. including or formed from a stabilization region) proximate to the support carrier (and the respective second side); and wherein a mechanical hardness of the at least one further portion is greater than the mechanical hardness of the at least one portion.

According to various embodiments, a support surface of the at least one portion may be configured to provide physical contact to one or more workpieces on the chuck.

According to various embodiments, the mechanical hardness may include or be formed from a spatially averaged mechanical hardness.

According to various embodiments, the workpiece-support may include a support stabilization region for stabilizing the sacrificial support region, wherein the stabilization region is disposed on the second side.

According to various embodiments, the support stabilization region may be disposed between the sacrificial support region and the support carrier.

According to various embodiments, the at least one portion may include or be formed from at least one of a foil (e.g. a tape), a layer (e.g. a coating) and a plate.

According to various embodiments, the at least one portion may include particles or be formed from particles and/or an aerosol.

According to various embodiments, the support carrier may include a recess for receiving the workpiece-support.

According to various embodiments, the mechanical hardness of the at least one portion of the workpiece-may be is less than a mechanical hardness of at least one of a nickel-based alloy and an iron-based alloy.

According to various embodiments, the at least one portion of the workpiece-support is proximate to a second side of the workpiece-support configured to support one or more workpieces and/or includes one or more protrusions.

According to various embodiments, the mechanical hardness of the at least one portion of the workpiece-support is less than a mechanical hardness of an electroless nickel plating.

According to various embodiments, the electroless nickel plating may refer to a plating process using a reducing agent, for example hydrated sodium hypophosphite which reacts with the metal ions (nickel) to deposit the electroless nickel plating. The electroless nickel plating may include a phosphorus concentration in the range from about 2 atomic percent (low phosphorus) to about 14 atomic percent, e.g. in the range from about 5 atomic percent to about 11 atomic percent.

According to various embodiments, the mechanical hardness of the workpiece-support may be less than a mechanical hardness of at least one of a nickel-phosphorus alloy and an iron-based alloy.

According to various embodiments, the at least one portion of the workpiece-support may include or be formed from a polymer.

According to various embodiments, the workpiece-support may include or be formed from a polymer.

According to various embodiments, the chuck may include or be formed from a polymer.

According to various embodiments, the support carrier may include or be formed from a metallic material (having the mechanical hardness of the support carrier).

According to various embodiments, the workpiece-support may be a plate (e.g. a disc).

According to various embodiments, the at least one portion of the workpiece-support may protrude from the support carrier.

According to various embodiments, the at least one portion of the workpiece-support may be configured to be subtractively manufactured to planarize the workpiece-support.

According to various embodiments, a method for planarizing one or more workpieces may include: at least one of mounting and demounting a workpiece-support of a chuck (e.g. replacing, in other words, demounting a first workpiece-support mounting and mounting a second workpiece-support); planarizing the workpiece-support using a planarization tool; disposing one or more workpieces over the workpiece-support after the planarizing the workpiece-support; and planarizing the one or more workpieces using the planarization tool.

According to various embodiments, a method for adjusting a workpiece planarization arrangement including a chuck and a planarization tool, wherein the chuck includes: a support carrier (e.g., including a supply terminal for workpiece adhesion supply); a workpiece-support being replaceably mounted to the support carrier; the method may include: at least one of mounting and demounting (e.g. replacing) the workpiece-support of a chuck; and planarizing the workpiece-support by the planarization tool.

According to various embodiments, a mechanical hardness of the workpiece-support is less than a mechanical hardness of the support carrier.

According to various embodiments, a method for adjusting a workpiece planarization arrangement including a chuck and a planarization tool, wherein the chuck includes: a support carrier (e.g., including a supply terminal for workpiece adhesion supply); a workpiece-support being replaceably mounted to the support carrier; the method may include: at least one of mounting and demounting (e.g. replacing) the workpiece-support of a chuck; and planarizing the workpiece-support by the planarization tool.

According to various embodiments, a mechanical hardness of the workpiece-support is less than a mechanical hardness of the support carrier.

According to various embodiments, a method for adjusting a workpiece planarization arrangement including a chuck and a planarization tool, wherein the chuck includes: a support carrier (e.g., including a supply terminal for workpiece adhesion supply); a workpiece-support being replaceably mounted to the support carrier; wherein a mechanical hardness of the workpiece-support is less than a mechanical hardness of the support carrier, the method may include: at least one of mounting and demounting (e.g. replacing) the workpiece-support of a chuck; and planarizing the workpiece-support by the planarization tool.

According to various embodiments, a method for planarizing one or more workpieces may include: planarizing at least one portion of a workpiece-support using a planarization tool; disposing one or more workpieces over the workpiece-support after the planarizing the workpiece-support; and planarizing at least one portion of the workpiece using the planarization tool; wherein a hardness of the at least one portion of the workpiece-support is configured such that the planarizing the workpiece-support and the planarizing the at least one portion of the one or more workpieces (in other words, of the workpiece or each workpiece) use at least one of the planarization tool in the same physical configuration (e.g. without modification or reconfiguration) and the same machining bit configuration (e.g. without modification or reconfiguration).

According to various embodiments, a method for planarizing one or more workpieces may include: planarizing at least one portion of a workpiece-support using a planarization tool for forming a planarized support surface of the workpiece-support; disposing one or more workpieces over the planarized surface of the workpiece-support; and planarizing at least one portion of the one or more workpieces using the planarization tool for forming a planarized workpiece surface of the one or more workpieces; wherein a hardness of the at least one portion of the workpiece-support is configured such that the planarizing the workpiece-support and the planarizing the one or more workpieces use at least one of the same physical configuration of the planarization tool and the same machining bit configuration (e.g. without modification or reconfiguration).

According to various embodiments, a method for adjusting a workpiece planarization arrangement including a chuck and a planarization tool, wherein the chuck includes a support carrier (e.g., including a supply terminal for workpiece adhesion supply) and a workpiece-support being replaceably mounted to the support carrier (wherein a mechanical hardness of the workpiece-support is optionally less than a mechanical hardness of the support carrier) may include: providing a workpiece planarization configuration of the planarization tool (e.g., its machining bit) in which the planarization tool is configured to planarize one or more workpieces on the workpiece-support; and planarizing the workpiece-support by the planarization tool in the workpiece planarization configuration.

According to various embodiments, the mechanical hardness of the at least one portion of the workpiece-support may be within a range of about 20% to about 500% of the mechanical hardness of the at least one portion of the one or more workpieces, e.g. within a range of about 50% to about 200% of the mechanical hardness of the at least one portion of the one or more workpieces.

According to various embodiments, a relative deviation of the mechanical hardness of the at least one portion of the workpiece-support and the mechanical hardness of the at least one portion of the one or more workpieces may be less than about 100% (e.g. less than about 75%, e.g. less than about 50%, e.g. less than about 25%, e.g. less than about 10%, e.g. less than about 5%, e.g. less than about 2%). The relative deviation of two numerical values may be defined by their (positive, in other words, natural) difference from each other divided by their arithmetic mean. The arithmetic mean (also referred to as mean or average) may be defined as being equal to the sum of the numerical values divided by two.

According to various embodiments, the support carrier of the chuck is optional. In this case, the chuck may be configured similar to the workpiece-support.

According to various embodiments, the mechanical hardness of the at least one portion of the chuck (planarized or to be planarized) may be within a range of about 20% to about 500% of the mechanical hardness of the at least one portion of the one or more workpieces (planarized or to be planarized), e.g. within a range of about 50% to about 200% of the mechanical hardness of the at least one portion of the one or more workpieces.

According to various embodiments, the mechanical hardness of the at least one portion of the chuck (planarized or to be planarized) may be within a range of about 20% to about 500% of the mechanical hardness of the at least one portion of the one or more workpieces (planarized or to be planarized), e.g. within a range of about 50% to about 200% of the mechanical hardness of the at least one portion of the one or more workpieces.

According to various embodiments, replaceably mounted may be understood mounting configured for a nondestructive disassembly.

According to various embodiments, a workpiece planarization arrangement may include: a chuck including at least one portion configured to support one or more workpieces and/or including one or more protrusions; and a planarization tool configured to planarize the at least one portion of the chuck and to planarize one or more workpieces on the at least one portion of the chuck; wherein a mechanical hardness of the at least one portion of the chuck is configured such that planarizing the one or more workpieces and planarizing the at least one portion of the chuck use (in other words, may be carried out by) the planarization tool in the same machining bit configuration, e.g., the machining bit in the same physical configuration.

According to various embodiments, the planarization tool may be configured to planarize the one or more workpieces if they are disposed on the chuck (illustratively, placed on the chuck).

According to various embodiments, planarization tool may include: a bit carrier rotatable about a rotation axis; wherein the planarization tool and the chuck are configured for a displacement to each other parallel to a direction perpendicular the rotation axis.

According to various embodiments, a mechanical hardness of the machining bit is more than (in other words, greater than) a mechanical hardness of at least one of the chuck and the one or more workpieces. Illustratively, the machining bit may include or be formed from a material, which is sufficient hard to planarize the one or more workpieces and the chuck.

According to various embodiments, the machining bit may include or be formed from carbon in at least one of a carbide (e.g., a metal carbide like tungsten carbide), a diamond configuration and a diamond-like carbon configuration.

According to various embodiments, the machining bit may include or be formed from a ceramic.

According to various embodiments, the chuck may include at least one vacuum line for connecting to a vacuum creating system; wherein the at least one portion of the chuck may include at least one through hole connected to the at least one vacuum line.

According to various embodiments, the chuck may include a plurality of vacuum lines; wherein the at least one portion of the chuck may include a plurality of adhesion regions separated from each other, wherein each adhesion region of the plurality of adhesion regions may include at least one through hole; wherein the at least one through hole of each adhesion region of the plurality of adhesion regions is connected to at least one vacuum line of the plurality of vacuum lines.

According to various embodiments, the at least one portion of the chuck may be proximate to a side of the chuck (e.g. configured to support one or more workpieces, e.g. respectively face the one or more workpieces, and/or including one or more protrusions); wherein the chuck may include at least one further portion distant from the side; and wherein a mechanical hardness of the at least one further portion of the chuck may be greater than a mechanical hardness of the at least one portion of the chuck.

According to various embodiments, the at least one further portion may include or be formed from a metallic material.

According to various embodiments, the at least one portion of the chuck may protrude from the at least one further portion.

According to various embodiments, the at least one portion may include or be formed from at least one of a foil, a layer (e.g. a coating) and a plate.

According to various embodiments, the at least one portion may include particles or be formed from particles and/or an aerosol.

According to various embodiments, the mechanical hardness of the at least one portion of the chuck is less than a mechanical hardness of at least one of a nickel-based alloy and an iron-based alloy.

According to various embodiments, the at least one portion of the chuck may include or be formed from a polymer.

According to various embodiments, the planarizing the one or more workpieces and the planarizing the at least one portion of the chuck differ in a speed (e.g., by more than about 10%, 20%, or 30% and/or by less than about 90%, 75% or 50%) of at least one of: a rotation of the planarization tool, a displacement between the chuck and the planarization tool, a revolution of a machining bit of the planarization tool.

According to various embodiments, a chuck may include: a first side configured to be mounted to a chuck holder (e.g., to a chuck socket); a second side opposite the first side, wherein the second side is configured to support (e.g. face) one or more workpieces; at least one vacuum line for connecting to a vacuum creating system; and at least one portion proximate to the second side (e.g. distant from the support carrier) including at least one through hole connected to the at least one vacuum line such that one or more workpieces received over the second side is adhered by suction when a vacuum is created in the at least one vacuum line; wherein a mechanical hardness of the at least one portion proximate to the second side (e.g. distant from the support carrier) is configured such that planarizing the one or more workpieces and planarizing the at least one portion use at least one of a planarization tool and a machining bit in the same physical configuration.

According to various embodiments, the chuck may include at least one vacuum line for connecting to a vacuum creating system; wherein the at least one portion of the chuck may include at least one through hole connected to the at least one vacuum line.

According to various embodiments, at least two vacuum lines may be decoupled from each other.

According to various embodiments, the at least one portion may be distant from the first side; wherein the chuck may include at least one further portion proximate to the first side; and wherein a mechanical hardness of the at least one further portion is greater than the mechanical hardness of the at least one portion.

According to various embodiments, the at least one further portion may include or be formed from a metallic material.

According to various embodiments, the at least one portion may include or be formed from at least one of a foil, a layer (e.g. a coating) and a plate.

According to various embodiments, the at least one portion may include particles or be formed from particles and/or an aerosol.

According to various embodiments, the mechanical hardness of the at least one portion of the chuck may be less than a mechanical hardness of at least one of a nickel-based alloy and an iron-based alloy.

According to various embodiments, the at least one portion of the chuck may include or be formed from a polymer.

According to various embodiments, the planarizing the one or more workpieces and the planarizing the at least one portion of the chuck may differ in a speed of at least one of: a rotation of the planarization tool, a displacement between the chuck and the planarization tool, a revolution of a machining bit of the planarization tool.

According to various embodiments, a method for planarizing one or more workpieces may include: planarizing at least one portion of a chuck using a planarization tool; disposing one or more workpieces over the at least one portion of the chuck after the planarizing the at least one portion of the chuck; and planarizing the one or more workpieces using the planarization tool; wherein a mechanical hardness of the at least one portion of the chuck is configured such that the planarizing the one or more workpieces and the planarizing the at least one portion of the chuck use the planarization tool in the same machining bit configuration, e.g., the machining bit in the same physical configuration.

According to various embodiments, a method for planarizing one or more workpieces, the method including: planarizing at least one portion of a chuck using a planarization tool for forming a planarized support surface of the chuck; disposing one or more workpieces over the planarized surface of the chuck; and planarizing the one or more workpieces using the planarization tool for forming a planarized workpiece surface of the one or more workpieces; wherein a mechanical hardness of the at least one portion of the chuck is configured such that the planarizing the one or more workpieces and the planarizing the at least one portion of the chuck use the planarization tool in the same machining bit configuration, e.g., the machining bit in the same physical configuration.

According to various embodiments, a method for adjusting a workpiece planarization arrangement including a chuck and a planarization tool, wherein a mechanical hardness of the at least one portion of the chuck is configured such that the planarizing the one or more workpieces and the planarizing the at least one portion of the chuck use the planarization tool in the same configuration, may include: providing a machining bit configuration (e.g., in a workpiece planarization configuration) of the planarization tool in which the planarization tool is configured to planarize one or more workpieces on the workpiece-support; and planarizing the at least one portion of the chuck by the planarization tool in the machining bit configuration (e.g., in the workpiece planarization configuration).

According to various embodiments, the workpiece planarization arrangement may include a socket (also referred to as chuck socket) for mounting the chuck. The chuck socket may optionally include a vacuum creating system (e.g., including at least one pump, e.g., at least one vacuum pump) for creating a vacuum in the chuck. In various embodiments, the chuck may be mounted at the chuck socket or at least configured to be mounted at the chuck socket. For example, the chuck socket may include or be formed from a stand on which the chuck is mounted. In one or more embodiments, the chuck may protrude from the chuck socket (e.g., at least one of laterally and vertically). In one or more embodiments, the chuck may include a planar surface (e.g., including openings for the at least one through hole). In one or more embodiments, the chuck and the chuck socket may be coupled to each other air-tight (in other words, vacuum tight, e.g., by a sealing). Alternatively or additionally, the workpiece-support and the support carrier may be coupled to each other air-tight (in other words, vacuum tight, e.g., by a sealing). In one or more embodiments, at least one of the chuck and the chuck socket may be metallic. In one or more embodiments, at least one of the chuck and the workpiece-support may be non-metallic. In one or more embodiments, the workpiece-support may protrude from the support carrier (e.g., laterally). In one or more embodiments, at least one of the support carrier, the chuck and the workpiece-support may be formed plate-like. For example, at least one of the support carrier, the chuck and the workpiece-support may include or be formed from a plate. The chuck socket may include or be formed from a table. The workpiece-support may include or be formed from an inlay.

According to various embodiments, the workpiece planarization arrangement may further include a chuck holder, wherein the support carrier may be configured to be mounted to the chuck holder.

According to various embodiments, the chuck holder may include or be formed from a chuck socket.

According to various embodiments, the chuck, e.g., its support carrier, may include a supply terminal for workpiece adhesion supply. The supply terminal may include or be formed from at least one of one or more electric connectors and one or more vacuum connectors. The supply terminal may remain connected to a supply device during replacing the workpiece-support. This may enable fast and economic replacement of the workpiece-support, e.g., if the workpiece-support is thinned down to a certain degree or thickness (in other words, consumed).

In one or more embodiments, the chuck and the workpiece may be planarized in the same machining bit configuration. Using the same machining bit configuration may provide a reproducible transfer of the planarization plane from the chuck to the workpiece. Other parameters (e.g., speed of second displacement, speed of revolving the machining bit and/or contact pressure between chuck and planarization tool) may differ between planarizing the chuck and planarizing the workpiece. In one or more other embodiments, at least one of: the speed of second displacement, speed of revolving the machining bit and contact pressure between chuck and planarization tool may be the same for planarizing the chuck and planarizing the workpiece. The machining bit configuration may be defined by the used machining bit and its spatial configuration, e.g., at least one of position and orientation. For example, the machining bit may be maintained between planarizing the chuck and planarizing the workpiece. Alternatively or additionally, the spatial configuration of the machining bit may be maintained between planarizing the chuck and planarizing the workpiece. In other words, the same machining bit configuration may be understood as using the machining bit in the same physical configuration for both, planarizing the chuck and planarizing the workpiece.

According to various embodiments, the planarization tool may include or be formed from a machining bit configured to revolve about a rotation axis; wherein the planarization tool and the chuck are configured to be displaceable relative to each other in a direction perpendicular to the rotation axis (in other words displaceable along axes parallel to each other, wherein the parallel axes are aligned perpendicular to the rotation axis).

According to various embodiments, a method for planarizing one or more workpieces may include: planarizing at least one portion of a chuck using a planarization tool; disposing one or more workpieces over the at least one portion of the chuck after the planarizing the at least one portion of the chuck; and planarizing the one or more workpieces using the planarization tool; and coating or forming the at least one portion of the chuck using an aerosol (e.g. by exposing to the aerosol).

According to various embodiments, a method for planarizing a workpiece-support may include: planarizing at least one portion of the workpiece-support using a planarization tool; and coating or forming the at least one portion of the workpiece-support (e.g. including one or more protrusions of the workpiece-support) using an aerosol (e.g. by exposing to the aerosol).

According to various embodiments, a workpiece planarization arrangement, may include: a chuck including at least one portion configured to support one or more workpieces; and a planarization tool configured to planarize the at least one portion of the chuck and to planarize one or more workpieces on the at least one portion of the chuck; wherein the at least one portion of the chuck includes at least one of particles (e.g. particle residuals), pores and/or a polymer.

According to various embodiments, the planarization tool may include: a machining bit configured to revolve about a rotation axis; wherein the planarization tool and the chuck are configured displaceable (in other words for a displacement) to each other parallel to a direction perpendicular to the rotation axis (in other words displaceable along axes parallel to each other, wherein the parallel axes are aligned perpendicular to the rotation axis).

According to various embodiments, a mechanical hardness of the machining bit may be more than a mechanical hardness of at least one of the chuck and the one or more workpieces.

According to various embodiments, the chuck may include at least one vacuum line for connecting to a vacuum creating system; wherein the at least one portion of the chuck includes at least one through hole connected to the at least one vacuum line.

According to various embodiments, a mechanical hardness of the at least one portion of the chuck is configured such that planarizing the one or more workpieces and planarizing the at least one portion of the chuck use the planarization tool in the same machining bit configuration.

According to various embodiments, the chuck may include a plurality of vacuum lines; wherein the at least one portion of the chuck may include a plurality of adhesion regions separated from each other, wherein each adhesion region of the plurality of adhesion regions includes at least one through hole; wherein the at least one through hole of each adhesion region of the plurality of adhesion regions is connected to at least one vacuum line of the plurality of vacuum lines.

According to various embodiments, the at least one portion of the chuck is proximate to a side of the chuck configured to support one or more workpieces; wherein the chuck may include at least one further portion distant from the side; and wherein a mechanical hardness of the at least one further portion of the chuck may be greater than a mechanical hardness of the at least one portion of the chuck.

According to various embodiments, the at least one further portion may include or be formed from a metallic material and/or a ceramic material (e.g. having a greater hardness than the at least one portion).

According to various embodiments, the at least one portion of the chuck may have a higher porosity than the at least one further portion of the chuck.

According to various embodiments, the at least one portion of the chuck may have a higher particle-density than the at least one further portion of the chuck.

According to various embodiments, the at least one portion of the chuck may have a smaller melting temperature or glass transition temperature than the at least one further portion of the chuck.

According to various embodiments, the at least one portion of the chuck may have more protrusions than the at least one further portion of the chuck.

According to various embodiments, the at least one portion of the chuck may a greater thermal expansion than the at least one further portion of the chuck.

According to various embodiments, the at least one portion of the chuck may have a smaller mechanical hardness than the at least one further portion of the chuck.

According to various embodiments, a thermal expansion coefficient of the at least one further portion may be less than about $1·10^{-5}$/K, e.g. less than about $5·10^{-6}$/K, e.g. less than about $2·10^{-6}$/K, e.g. less than about $1·10^{-6}$/K, e.g. less than about $5·10^{-7}$/K, e.g. less than about $2·10^{-7}$/K.

According to various embodiments, the particles may be embedded in the polymer or form a matrix in which the pores (void-spaces) are embedded.

According to various embodiments, the at least one portion may include or be formed from at least one of: at least one foil including or formed from the polymer, at least one (e.g. porous) layer including the pores and/or the particles; and a composite material including the polymer and the particles embedded in the polymer.

According to various embodiments, the at least one portion may include one or more protrusions and at least one layer (e.g. a foil or a porous layer), wherein the at least one layer includes at least one of the polymer, the pores and the particles, wherein the at least one layer (e.g. at least partially, in other words partially or completely) covers the one or more protrusions, e.g. at least a top portion of each protrusion of the one or more protrusions.

According to various embodiments, the polymer may include or be formed from a thermoplastic polymer or a duroplastic polymer (e.g. resin).

According to various embodiments, the thermoplastic polymer may include or be formed from Acrylic, Acrylonitrile butadiene styrene, Nylon, Polylactic acid, Polybenzimidazole, Polycarbonate, Polyether sulfone, Polyetherether ketone, Polyetherimide, Polyethylene, Polyphenylene oxide, Polyphenylene sulfide, Polypropylene, Polystyrene, Polyvinyl chloride and/or Teflon.

According to various embodiments, a workpiece planarization arrangement may include or be formed from: a chuck including at least one portion configured to support one or more workpieces; and a planarization tool configured to planarize the at least one portion of the chuck and to planarize one or more workpieces on the at least one portion of the chuck; wherein the at least one portion of the chuck includes or is formed from at least one of: particles (e.g. particle residuals), pores and/or a polymer; wherein a mechanical hardness of the at least one portion of the chuck is configured such that planarizing the one or more workpieces and planarizing the at least one portion of the chuck use the planarization tool in the same machining bit configuration.

According to various embodiments, a chuck may include: a first side configured to be mounted to a chuck holder; a second side opposite the first side, wherein the second side is configured to support one or more workpieces; at least one vacuum line for connecting to a vacuum creating system; and at least one portion proximate to the second side including at least one through hole connected to the at least one vacuum line such that one or more workpieces received over the second side is adhered by suction when a vacuum is created via (e.g. through and/or in) the at least one vacuum line; wherein the at least one portion proximate to the second side includes at least one of particles (e.g. particle residuals), pores and/or a polymer.

According to various embodiments, the at least one portion is distant from the first side; wherein the chuck may include at least one further portion proximate to the first side; and wherein a mechanical hardness of the at least one further portion is greater than the mechanical hardness of the at least one portion.

According to various embodiments, the at least one further portion may include or be formed from a metallic material and/or a ceramic material (e.g. having a greater hardness than the at least one portion).

According to various embodiments, a thermal expansion coefficient of the at least one further portion is less than $1·10^{-5}$/K, e.g. less than about $5·10^{-6}$/K, e.g. less than about $2·10^{-6}$/K, e.g. less than about $1·10^{-6}$/K, e.g. less than about $5·10^{-7}$/K, e.g. less than about $2·10^{-7}$/K.

According to various embodiments, the particles may include or be formed from the polymer or a metal (e.g. having less hardness than a further portion of the workpiece support).

According to various embodiments, the at least one portion may include or be formed from at least one of: at least one foil including or formed from the polymer, at least one (e.g. porous) layer including the pores and/or the particles, and a composite material including the polymer and the particles embedded in the polymer.

According to various embodiments, the at least one portion may include one or more protrusions and at least one layer (e.g. a foil or a porous layer), wherein the at least one layer may include at least one of the polymer, the pores and the particles, wherein the at least one layer (e.g. at least partially, in other words partially or completely) covers the one or more protrusions, e.g. at least a top portion of each protrusion of the one or more protrusions.

According to various embodiments, a method for providing a planarizable workpiece support may include: providing a chuck, including a first side configured to be mounted to a chuck holder; a second side opposite the first side, and at least one vacuum line for connecting to a vacuum creating system, wherein the second side is configured to support one or more workpieces; and forming or reinforcing at least one portion proximate to the second side, the at least one portion including at least one through hole connected to the at least one vacuum line such that one or more workpieces received over the second side are adhered by suction when a vacuum is created via (e.g. through and/or in) the at least one vacuum line; wherein forming or reinforcing may include exposing the second side to an aerosol (e.g. solution free) or at least one of molding, pressing or laminating a (e.g. metal free) material on the second side (e.g. by dry deposition and/or solution free).

According to various embodiments, the method may further include: planarizing at least one portion of a chuck using a planarization tool; disposing one or more workpieces over the at least one portion of the chuck after the planarizing the at least one portion of the chuck; and planarizing the one or more workpieces using the planarization tool.

Various embodiments may be configured similar or as at least one of the following examples.

EXAMPLE 1

A workpiece planarization arrangement, including:
a chuck including at least one portion configured to support one or more workpieces; and
a planarization tool configured to planarize the at least one portion of the chuck and to planarize one or more workpieces on the at least one portion of the chuck;
wherein a mechanical hardness of the at least one portion of the chuck is configured such that planarizing the one or more workpieces and planarizing the at least one portion of the chuck use the planarization tool in the same machining bit configuration.

EXAMPLE 2

The workpiece planarization arrangement of example 1, the planarization tool including:
a machining bit configured to revolve about a rotation axis;
wherein the planarization tool and the chuck are configured displaceable (in other words for a displacement) to each other parallel to a direction perpendicular to the rotation axis.

EXAMPLE 3

The workpiece planarization arrangement of example 1, wherein a mechanical hardness of the machining bit is more than a mechanical hardness of at least one of the chuck and the one or more workpieces.

EXAMPLE 4

The workpiece planarization arrangement of example 1, wherein the chuck includes at least one vacuum line for connecting to a vacuum creating system; and
wherein the at least one portion of the chuck includes at least one through hole connected to the at least one vacuum line.

EXAMPLE 5

The workpiece planarization arrangement of example 1, wherein the chuck includes a plurality of vacuum lines;
wherein the at least one portion of the chuck includes a plurality of adhesion regions separated from each other, wherein each adhesion region of the plurality of adhesion regions includes at least one through hole;
wherein the at least one through hole of each adhesion region of the plurality of adhesion regions is connected to at least one vacuum line of the plurality of vacuum lines.

EXAMPLE 6

The workpiece planarization arrangement of example 1, wherein the at least one portion of the chuck is proximate to a side of the chuck configured to support one or more workpieces;
wherein the chuck includes at least one further portion distant from the side; and wherein a mechanical hardness of the at least one further portion of the chuck is greater than a mechanical hardness of the at least one portion of the chuck.

EXAMPLE 7

The workpiece planarization arrangement of example 6, wherein the at least one further portion includes a metallic material.

EXAMPLE 8

The workpiece planarization arrangement of example 6, wherein the at least one portion of the chuck protrudes from the at least one further portion.

EXAMPLE 9

The workpiece planarization arrangement of example 6, wherein the at least one portion of the chuck is replaceably mounted to the at least one further portion.

EXAMPLE 10

The workpiece planarization arrangement of example 1, wherein the at least one portion includes at least one of a foil, a layer and a plate.

EXAMPLE 11

The workpiece planarization arrangement of example 1, wherein a mechanical hardness of the at least one portion of the chuck is less than a mechanical hardness of at least one of a nickel-based alloy and an iron-based alloy.

EXAMPLE 12

The workpiece planarization arrangement of example 1, wherein the at least one portion of the chuck includes a polymer.

EXAMPLE 13

The workpiece planarization arrangement of example 1, wherein the planarizing the one or more workpieces and the planarizing the at least one portion of the chuck differ in a speed of at least one of: a rotation of the planarization tool, a displacement between the chuck and the planarization tool, a revolution of a machining bit of the planarization tool.

EXAMPLE 14

A chuck, including:
a first side configured to be mounted to a chuck holder;
a second side opposite the first side, wherein the second side is configured to support one or more workpieces;
at least one vacuum line for connecting to a vacuum creating system; and
at least one portion proximate to the second side including at least one through hole connected to the at least one vacuum line such that one or more workpieces received over the second side is adhered by suction when a vacuum is created via the at least one vacuum line;
wherein a mechanical hardness of the at least one portion proximate to the second side is configured such that planarizing the one or more workpieces and planarizing the at least one portion use a planarization tool in the same machining bit configuration.

EXAMPLE 15

The chuck of example 14,
wherein the at least one portion is distant from the first side;
wherein the chuck includes at least one further portion proximate to the first side; and
wherein a mechanical hardness of the at least one further portion is greater than the mechanical hardness of the at least one portion.

EXAMPLE 16

The chuck of example 15,
wherein the at least one further portion includes a metallic material.

EXAMPLE 17

The chuck of example 14,
wherein the at least one portion includes at least one of a foil, a layer and a plate.

EXAMPLE 18

The chuck of example 14,
wherein the mechanical hardness of the at least one portion of the chuck is less than a mechanical hardness of at least one of a nickel-based alloy and an iron-based alloy.

EXAMPLE 19

The chuck of example 14,
wherein the at least one portion of the chuck includes a polymer.

EXAMPLE 20

A method for planarizing one or more workpieces, the method including:
planarizing at least one portion of a chuck using a planarization tool;
disposing one or more workpieces over the at least one portion of the chuck after the planarizing the at least one portion of the chuck; and
planarizing the one or more workpieces using the planarization tool;
wherein a mechanical hardness of the at least one portion of the chuck is configured such that the planarizing the one or more workpieces and the planarizing the at least one portion of the chuck use the planarization tool in the same machining bit configuration.

In one or more embodiments, the mechanical hardness of the at least one portion (of the chuck) may be configured such that planarizing the one or more workpieces and planarizing the at least one portion of the chuck use the planarization tool in the same machining bit configuration. Additionally or alternatively, the at least one portion may include or be formed from an at least one layer (also referred as to at least one sacrificial layer). The at least one sacrificial layer may, for example, be formed by exposing to an aerosol, molding a material (e.g. a polymer, e.g. a thermoplastic) disposed on the chuck (e.g. its support stabilization region), laminating and/or pressing a material (e.g. a foil) on the chuck (e.g. its support stabilization region) or the like. The readily fabricated at least one sacrificial layer may include at least one of the following: particles, a polymer and/or pores, e.g. more of at least one of particles and/or pores than the support stabilization region and/or the further at least one portion.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A semiconductor workpiece planarization arrangement, comprising:
a chuck comprising at least one portion configured to support one or more semiconductor workpieces; and
a planarization tool configured to planarize the at least one portion of the chuck and to planarize one or more semiconductor workpieces on the at least one portion of the chuck;

wherein the at least one portion of the chuck comprises at least one of granular particles, pores and/or a polymer.

2. The semiconductor workpiece planarization arrangement of claim 1, the planarization tool comprising:
a machining bit configured to revolve about a rotation axis;
wherein the planarization tool and the chuck are configured displaceable to each other parallel to a direction perpendicular to the rotation axis.

3. The semiconductor workpiece planarization arrangement of claim 1,
wherein a mechanical hardness of the at least one portion of the chuck is configured such that planarizing the one or more semiconductor workpieces and planarizing the at least one portion of the chuck use the planarization tool in the same machining bit configuration.

4. The semiconductor workpiece planarization arrangement of claim 1,
wherein the chuck comprises at least one vacuum line for connecting to a vacuum creating system; and
wherein the at least one portion of the chuck comprises at least one through hole connected to the at least one vacuum line.

5. The semiconductor workpiece planarization arrangement of claim 1,
wherein the chuck comprises a plurality of vacuum lines;
wherein the at least one portion of the chuck comprises a plurality of adhesion regions separated from each other, wherein each adhesion region of the plurality of adhesion regions comprises at least one through hole;
wherein the at least one through hole of each adhesion region of the plurality of adhesion regions is connected to at least one vacuum line of the plurality of vacuum lines.

6. The semiconductor workpiece planarization arrangement of claim 1,
wherein the at least one portion of the chuck is proximate to a side of the chuck configured to support one or more semiconductor workpieces;
wherein the chuck comprises at least one further portion distant from the side; and
wherein a mechanical hardness of the at least one further portion of the chuck is greater than a mechanical hardness of the at least one portion of the chuck.

7. The semiconductor workpiece planarization arrangement of claim 6,
wherein the at least one further portion comprises a metallic material and/or a ceramic material.

8. The semiconductor workpiece planarization arrangement of claim 6,
wherein a thermal expansion coefficient of the at least one further portion is less than $1 \cdot 10^{-5}$/K.

9. The semiconductor workpiece planarization arrangement of claim 1,
wherein the granular particles include the polymer or a metal.

10. The semiconductor workpiece planarization arrangement of claim 1,
wherein the at least one portion comprises at least one of
at least one foil comprising the polymer,
at least one layer comprising the pores and/or the particles; and
a composite material comprising the polymer and the particles embedded in the polymer.

11. The semiconductor workpiece planarization arrangement of claim 1,
wherein the at least one portion comprises one or more protrusions and at least one layer, wherein the at least one layer comprises at least one of the polymer, the pores and the particles,
wherein the at least one layer covers the one or more protrusions.

12. A semiconductor workpiece planarization arrangement, comprising:
a chuck comprising at least one portion configured to support one or more semiconductor workpieces; and
a planarization tool configured to planarize the at least one portion of the chuck and to planarize one or more semiconductor workpieces on the at least one portion of the chuck;
wherein the at least one portion of the chuck comprises at least one of granular particles, pores and/or a polymer;
wherein a mechanical hardness of the at least one portion of the chuck is configured such that planarizing the one or more semiconductor workpieces and planarizing the at least one portion of the chuck use the planarization tool in the same machining bit configuration.

13. A chuck, comprising:
a first side configured to be mounted to a chuck holder;
a second side opposite the first side, wherein the second side is configured to support one or more semiconductor workpieces;
at least one vacuum line for connecting to a vacuum creating system; and
at least one portion proximate to the second side comprising at least one through hole connected to the at least one vacuum line such that one or more semiconductor workpieces received over the second side is adhered by suction when a vacuum is created via the at least one vacuum line;
wherein the at least one portion proximate to the second side comprises at least one of granular particles, pores and/or a polymer.

14. The chuck of claim 13,
wherein the at least one portion is distant from the first side;
wherein the chuck comprises at least one further portion proximate to the first side; and
wherein a mechanical hardness of the at least one further portion is greater than the mechanical hardness of the at least one portion.

15. The chuck of claim 14,
wherein the at least one further portion comprises a metallic material and/or a ceramic material.

16. The chuck of claim 14,
wherein a thermal expansion coefficient of the at least one further portion is less than $1 \cdot 10^{-5}$/K.

17. The chuck of claim 13,
wherein the at least one portion comprises at least one of
at least one foil comprising the polymer,
at least one layer comprising the pores and/or the particles, and
a composite material comprising the polymer and the particles embedded in the polymer.

18. The chuck of claim 13, wherein the at least one portion comprises one or more protrusions and at least one layer, wherein the at least one layer comprises at least one of the polymer, the pores and the particles,
wherein the at least one layer covers the one or more protrusions.

19. A method for providing a planarizable workpiece support, the method comprising:

providing a chuck, comprising a first side configured to be mounted to a chuck holder; a second side opposite the first side, and at least one vacuum line for connecting to a vacuum creating system, wherein the second side is configured to support one or more workpieces; and forming or reinforcing at least one portion proximate to the second side, the at least one portion comprising at least one through hole connected to the at least one vacuum line such that one or more semiconductor workpieces received over the second side are adhered by suction when a vacuum is created via the at least one vacuum line;

wherein forming or reinforcing comprises exposing the second side to an aerosol or at least one of molding, pressing or laminating a material on the second side.

20. The method of claim 19, further comprising:

planarizing the at least one portion of a chuck using a planarization tool;

disposing one or more semiconductor workpieces over the at least one portion of the chuck after the planarizing the at least one portion of the chuck; and planarizing the one or more semiconductor workpieces using the planarization tool.

\* \* \* \* \*